(12) United States Patent
Kim et al.

(10) Patent No.: US 9,276,227 B2
(45) Date of Patent: Mar. 1, 2016

(54) ORGANIC LIGHT-EMITTING DEVICE AND FLAT PANEL DISPLAY INCLUDING THE SAME

(71) Applicants: SAMSUNG DISPLAY CO., LTD., Yongin, Gyeonggi-do (KR); SUNGKYUNKWAN UNIVERSITY FOUNDATION FOR CORPORATE COLLABORATION, Suwon, Gyeonggi-do (KR)

(72) Inventors: Se-Hun Kim, Yongin (KR); Sam-Il Kho, Yongin (KR); Mi-Kyung Kim, Yongin (KR); Kwan-Hee Lee, Yongin (KR); Seung-Soo Yoon, Suwon (KR)

(73) Assignees: Samsung Display Co., Ltd., Samsung-ro, Giheung-Gu, Yongin-si, Gyeonggi-Do (KR); SUNGKYUNKWAN UNIVERSITY FOUNDATION FOR CORPORATE COLLABORATION, Jangan-Gu, Suwon, Gyeonggi-Do (KR)

( * ) Notice: Subject to any disclaimer, the term of this patent is extended or adjusted under 35 U.S.C. 154(b) by 237 days.

(21) Appl. No.: 13/969,237

(22) Filed: Aug. 16, 2013

(65) Prior Publication Data

US 2014/0175395 A1 Jun. 26, 2014

(30) Foreign Application Priority Data

Dec. 20, 2012 (KR) .................. 10-2012-0149752

(51) Int. Cl.
*H01L 51/50* (2006.01)
*H01L 51/00* (2006.01)

(52) U.S. Cl.
CPC .............. *H01L 51/50* (2013.01); *H01L 51/006* (2013.01); *H01L 51/0052* (2013.01); *H01L 51/0058* (2013.01); *H01L 51/0072* (2013.01); *H01L 51/0085* (2013.01); *H01L 51/0087* (2013.01); *H01L 51/5012* (2013.01)

(58) Field of Classification Search
None
See application file for complete search history.

(56) References Cited

U.S. PATENT DOCUMENTS

| | | | |
|---|---|---|---|
| 5,635,308 | A | 6/1997 | Inoue et al. |
| 7,651,786 | B2 | 1/2010 | Matsuura et al. |
| 7,732,063 | B2 | 6/2010 | Matsuura et al. |
| 2005/0064233 | A1 | 3/2005 | Matsuura et al. |
| 2008/0160347 | A1 | 7/2008 | Wang et al. |
| 2008/0160348 | A1* | 7/2008 | Smith ................... C07C 211/61 428/704 |
| 2011/0114934 | A1 | 5/2011 | Kim et al. |
| 2011/0121268 | A1 | 5/2011 | Nagao et al. |
| 2012/0056165 | A1 | 3/2012 | Kawamura et al. |

FOREIGN PATENT DOCUMENTS

| | | |
|---|---|---|
| JP | 7-138561 A | 5/1995 |
| JP | 8-12600 A | 1/1996 |
| JP | 8-239655 A | 9/1996 |
| KR | 10-2005-0019907 A | 3/2005 |
| KR | 10-2008-0031808 A | 4/2008 |
| KR | 10-2010-0006979 A | 1/2010 |
| KR | 10-1018547 B1 | 2/2011 |
| KR | 10-2011-0040874 A | 4/2011 |
| KR | 10-1031463 B1 | 4/2011 |
| KR | 10-2011-0094271 A | 8/2011 |

OTHER PUBLICATIONS

C.W.Tang and S.A.Vanslyke, Organic electroluminescent diodes, Applied Physics Letters, vol. 51, No. 12, Sep. 21, 1987, published by the American Institute of Physics, http://apl.aip.org/about/about_the_journal.

* cited by examiner

*Primary Examiner* — Gregory Clark
(74) *Attorney, Agent, or Firm* — Robert E. Bushnell, Esq.

(57) ABSTRACT

An organic light-emitting device includes: a first electrode; a second electrode; and an organic layer interposed between the first electrode and the second electrode, wherein the organic layer includes a compound of Formula 1 and a compound of Formula 2; and a flat panel display device including the organic light-emitting device. Substituents in Formulae 1 and 2 are the same as described in the specification
Formula 1
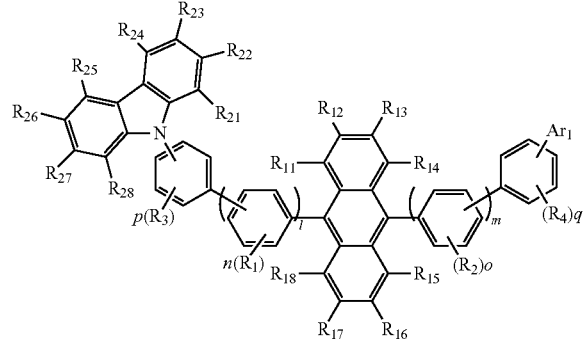
-continued
Formula 2
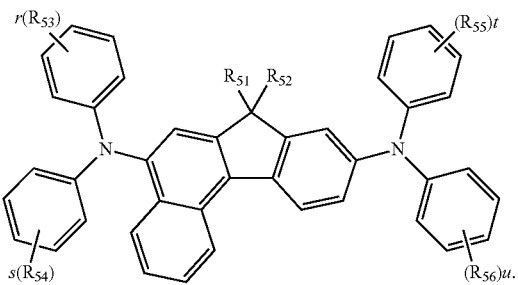
20 Claims, 1 Drawing Sheet

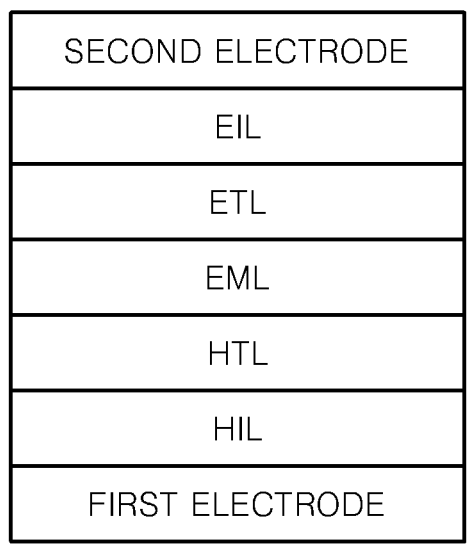

ORGANIC LIGHT-EMITTING DEVICE AND FLAT PANEL DISPLAY INCLUDING THE SAME

CLAIM OF PRIORITY

This application makes reference to, incorporates the same herein, and claims all benefits accruing under 35 U.S.C. §119 from an application for ORGANIC LIGHT-EMITTING DEVICE AND FLAT PANEL DISPLAY INCLUDING THE SAME, earlier filed in the Korean Intellectual Property Office on Dec. 20, 2012 and there duly assigned Serial No. 10-2012-0149752.

BACKGROUND OF THE INVENTION

1. Field of the Invention

One or more embodiments of the present invention relate to an organic light-emitting device and a flat panel display device including the organic light-emitting device.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

An organic blue light-emitting device using a conventional existing anthracene derivative needs further improvements in terms of color purity, efficiency, and lifetime.

SUMMARY OF THE INVENTION

One or more embodiments of the present invention include an organic light-emitting device (OLED) with high color purity, high efficiency, and long lifetime characteristics.

One or more embodiments of the present invention also include a flat panel display device including the organic light-emitting device (OLED).

Additional aspects will be set forth in part in the description which follows and, in part, will be apparent from the description, or may be learned by practice of the presented embodiments.

According to one or more embodiments of the present invention, an organic light-emitting device may include: a first electrode; a second electrode; and an organic layer interposed between the first electrode and the second electrode, wherein the organic layer includes a compound represented by Formula 1 and a compound represented by Formula 2 below:

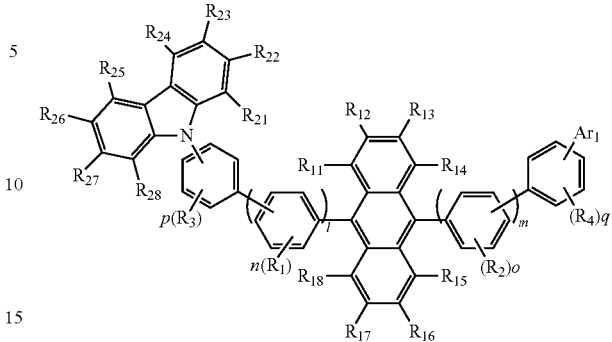

Formula 1 wherein, in Formula 1, $Ar_1$ may be a substituted or unsubstituted $C_3$-$C_{60}$ heteroaryl group; $R_1$ to $R_4$, $R_{11}$ to $R_{18}$, and $R_{21}$ to $R_{28}$ may be each independently hydrogen, deuterium, a halogen atom, a cyano group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ trialkylsilyl group, a substituted or unsubstituted $C_1$-$C_{60}$ dialkylarylsilyl group, a substituted or unsubstituted $C_1$-$C_{60}$ triarylsilyl group, or a substituted or unsubstituted $C_3$-$C_{60}$ heteroaryl group; l and m may be each independently an integer from 0 to 2; and n, o, p, and q may be each independently an integer from 0 to 4, and

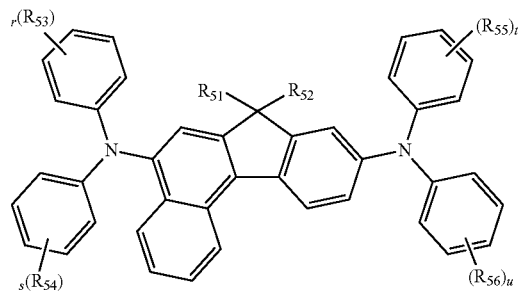

Formula 2 wherein, in Formula 2, $R_{51}$ and $R_{52}$ may be each independently hydrogen, deuterium, a substituted or unsubstituted $C_1$-$C_{60}$ alkyl group, or a substituted or unsubstituted $C_6$-$C_{12}$ aryl group; $R_{53}$ to $R_{56}$ may be each independently hydrogen, deuterium, a halogen atom, a cyano group, a nitro group, a hydroxyl group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_3$-$C_{60}$ cycloalkenyl group, a substituted or unsubstituted $C_1$-$C_{60}$ trialkylsilyl group, a substituted or unsubstituted $C_1$-$C_{60}$ dialkylarylsilyl group, a substituted or unsubstituted $C_1$-$C_{60}$ triarylsilyl group, a substituted or unsubstituted $C_6$-$C_{60}$ aryl group, or a substituted or unsubstituted $C_3$-$C_{60}$ heteroaryl group; and r, s, t, and u may be each independently an integer from 0 to 5.

According to one or more embodiments of the present invention, a flat panel display device may include the above-described organic light-emitting device, wherein the first electrode of the organic light-emitting device may be electrically connected to a source electrode or a drain electrode of a thin-film transistor.

BRIEF DESCRIPTION OF THE DRAWING

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 1 schematically illustrates a structure of an organic light-emitting device according to an embodiment of the present invention.

DETAILED DESCRIPTION OF THE INVENTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Expressions such as "at least one of," when preceding a list of elements, modify the entire list of elements and do not modify the individual elements of the list.

According to an embodiment of the present invention, an organic light-emitting device may include: a first electrode; a second electrode; and an organic layer interposed between the first electrode and the second electrode, wherein the organic layer may includes a compound represented by Formula 1 and a compound represented by Formula 2 below.

Formula 1

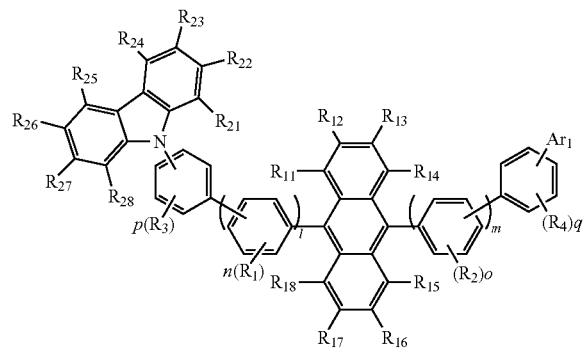

wherein, in Formula 1, $Ar_1$ may be a substituted or unsubstituted $C_3$-$C_{60}$ heteroaryl group; $R_1$ to $R_4$, $R_{11}$ to $R_{18}$, and $R_{21}$ to $R_{28}$ may be each independently hydrogen, deuterium, a halogen atom, a cyano group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ trialkylsilyl group, a substituted or unsubstituted $C_1$-$C_{60}$ dialkylarylsilyl group, a substituted or unsubstituted $C_1$-$C_{60}$ triarylsilyl group, or a substituted or unsubstituted $C_3$-$C_{60}$ heteroaryl group; l and m may be each independently an integer from 0 to 2; and n, o, p, and q may be each independently an integer from 0 to 4, and Formula 2

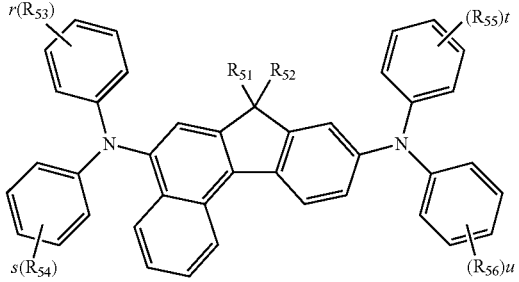

wherein, in Formula 2, $R_{51}$ and $R_{52}$ may be each independently hydrogen, deuterium, a substituted or unsubstituted $C_1$-$C_{60}$ alkyl group, or a substituted or unsubstituted $C_6$-$C_{12}$ aryl group; $R_{53}$ to $R_{56}$ may be each independently hydrogen, deuterium, a halogen atom, a cyano group, a nitro group, a hydroxyl group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_3$-$C_{60}$ cycloalkenyl group, a substituted or unsubstituted $C_1$-$C_{60}$ trialkylsilyl group, a substituted or unsubstituted $C_1$-$C_{60}$ dialkylarylsilyl group, a substituted or unsubstituted $C_1$-$C_{60}$ triarylsilyl group, a substituted or unsubstituted $C_6$-$C_{60}$ aryl group, or a substituted or unsubstituted $C_3$-$C_{60}$ heteroaryl group; and r, s, t, and u may be each independently an integer from 0 to 5.

The organic light-emitting device including the compound of Formula 1 and the compound of Formula 2 may have improved color purity, improved efficiency, and improved lifetime characteristics due to high stability high efficiency characteristics of the compounds of Formulae 1 and 2.

Substituents in the compounds of Formulae 1 and 2 will now be described in detail.

In some embodiments, adjacent substituents of $R_{21}$ to $R_{28}$ in Formula 1 may be selectively linked together to form a ring.

In some other embodiments, adjacent substituents of $R_{51}$ and $R_{52}$ in Formula 2 above may be selectively linked together to form a ring.

In some other embodiments, adjacent substituents of $R_{53}$ to $R_{56}$ in Formula 12 may be selectively linked together to form a ring.

In some embodiments, $Ar_1$ in Formula 1 may be one of the groups represented by Formulae 2a to 2k below:

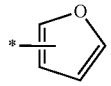

2a

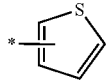

2b

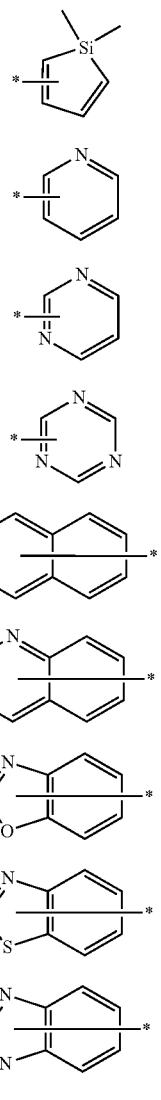

In Formulae 2a to 2k, * indicates a binding site.

Hereinafter, substituents described with reference to the formulae will now be described in detail. In this regard, the numbers of carbons in substituents are presented only for illustrative purposes and do not limit the characteristics of the substituents. The substituents not defined herein are construed as the same meanings understood by one of ordinary skill in the art.

The unsubstituted $C_1$-$C_{60}$ alkyl group used herein may be linear or branched. Examples of the alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonanyl group, and a dodecyl group. At least one hydrogen atom of the alkyl group may be substituted with deuterium, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, a $C_4$-$C_{16}$ heteroaryl group, or an organosilyl group.

The unsubstituted $C_2$-$C_{60}$ alkenyl group may indicate an unsaturated alkyl groups having at least one carbon-carbon double bond in the center or at a terminal of the alkyl group. Examples of the alkenyl group may be an ethenyl group, a propenyl group, a butenyl group, and the like. At least one hydrogen atom in the unsubstituted alkenyl group may be substituted with a substituent described above in conjunction with the alkyl group.

The unsubstituted $C_2$-$C_{60}$ alkynyl group may indicate an alkyl group having at least one carbon-carbon triple bond in the center or at a terminal of the alkyl group. Non-limiting examples of the unsubstituted $C_2$-$C_{20}$ alkynyl group may be acetylene, propylene, phenylacetylene, naphthylacetylene, isopropylacetylene, t-butylacetylene, and diphenylacetylene. At least one hydrogen atom in the alkynyl group may be substituted with a substituent described above in conjunction with the alkyl group.

The unsubstituted $C_3$-$C_{60}$ cycloalkyl group may indicate a $C_3$-$C_{60}$ cyclic alkyl group wherein at least one hydrogen atom in the cycloalkyl group may be substituted with a substituent described above in conduction with the $C_1$-$C_{60}$ alkyl group.

The unsubstituted $C_1$-$C_{60}$ alkoxy group may indicate a group having a structure of —OA wherein A is an unsubstituted $C_1$-$C_{60}$ alkyl group as described above. Non-limiting examples of the unsubstituted $C_1$-$C_{60}$ alkoxy group may be a methoxy group, an ethoxy group, a propoxy group, an isopropyloxy group, a butoxy group, and a pentoxy group. At least one hydrogen atom of the alkoxy group may be substituted with a substituent such as those described above in conjunction with the alkyl group.

The unsubstituted $C_6$-$C_{60}$ aryl group may indicate a carbocyclic aromatic system containing at least one ring. At least two rings may be fused to each other or linked to each other by a single bond. The term 'aryl' refers to an aromatic system, such as phenyl, naphthyl, or anthracenyl. At least one hydrogen atom in the aryl group may be substituted with a substituent described above in conjunction with the unsubstituted $C_1$-$C_{60}$ alkyl group.

Non-limiting examples of the substituted or unsubstituted $C_6$-$C_{60}$ aryl group may be a phenyl group, a $C_1$-$C_{10}$ alkylphenyl group (for example, ethylphenyl group), a halophenyl group (for example, o-, m-, and p-fluorophenyl group, dichlorophenyl group), a cyanophenyl group, dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, a o-, m-, and p-toryl group, an o-, m-, and p-cumenyl group, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, fluoronaphthyl group), a $C_1$-$C_{10}$ alkylnaphthyl group (for example, methylnaphthyl group), a $C_1$-$C_{10}$ alkoxynaphthyl group (for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted $C_3$-$C_{60}$ heteroaryl group used herein may include one, two or three hetero atoms selected from N, O, P and S. At least two rings may be fused to each other or linked to each other by a single bond.

Non-limiting examples of the unsubstituted $C_3$-$C_{60}$ heteroaryl group may be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indol group, a quinolyl group, an isoquinolyl group, and a dibenzothiophene group. In addition, at least one hydrogen atom in the heteroaryl group may be substituted with a substituent described above in conjunction with the unsubstituted $C_1$-$C_{60}$ alkyl group.

The unsubstituted $C_5$-$C_{60}$ aryloxy group may be a group represented by —OA1, wherein A1 may be a $C_5$-$C_{60}$ aryl group. An example of the aryloxy group may be a phenoxy group. At least one hydrogen atom in the aryloxy group may be substituted with a substituent described above in conjunction with the unsubstituted $C_1$-$C_{60}$ alkyl group.

The unsubstituted $C_5$-$C_{60}$ arylthio group may be a group represented by —SA1, wherein A1 may be a $C_5$-$C_{60}$ aryl group. Non-limiting examples of the arylthio group may be a benzenethio group and a naphthylthio group. At least one hydrogen atom in the arylthio group may be substituted with a substituent described above in conjunction with the unsubstituted $C_1$-$C_{60}$ alkyl group.

The unsubstituted $C_6$-$C_{60}$ condensed polycyclic group used herein may refer to a substituent including at least two rings wherein at least one aromatic ring and/or at least one non-aromatic ring may be fused to each other, or refers to a substitutent having an unsaturated group in a ring that may not form a conjugate structure. The unsubstituted $C_6$-$C_{60}$ condensed polycyclic group may be distinct from an aryl group or a heteroaryl group in terms of being non-aromatic.

The term "trialkylsilyl group" refers to that three alkyl groups are bound to SI, "dialkylarylsilyl group" refers to that two alkyl groups and one aryl group are bound to Si, and "triarylsilyl group" refers to that three aryl groups are bound to SI.

Non-limiting examples of the compound represented by Formula 1 may be Compounds 1 to 46 represented by the following formulae.

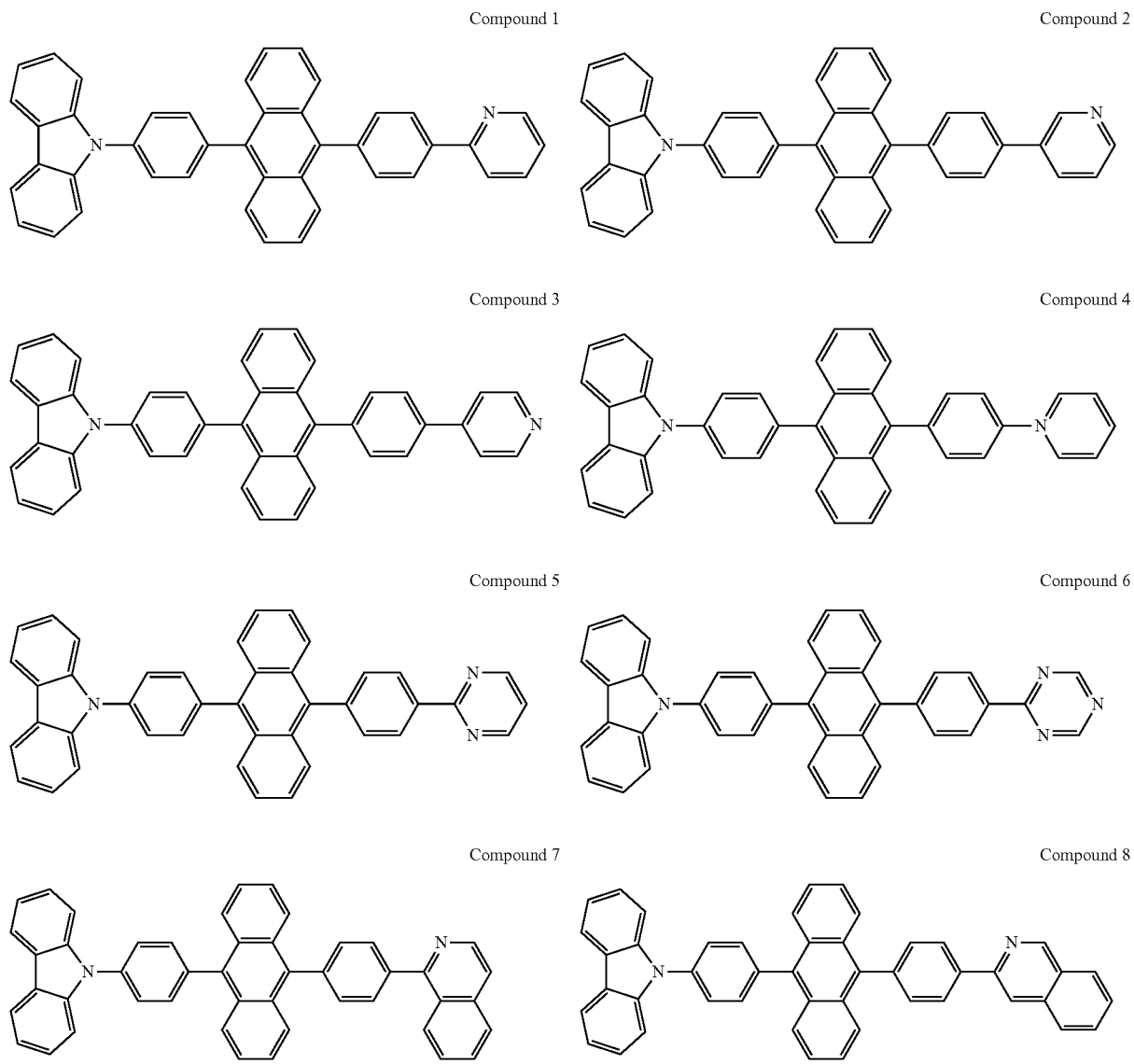

-continued
Compound 9
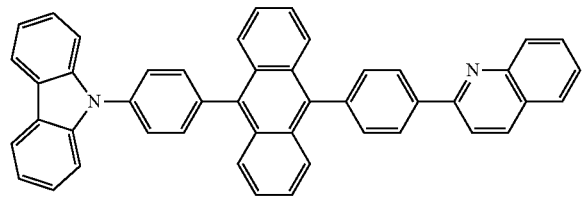
Compound 10
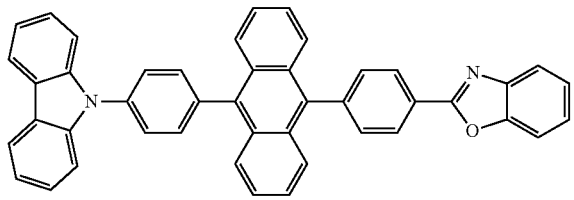
Compound 11
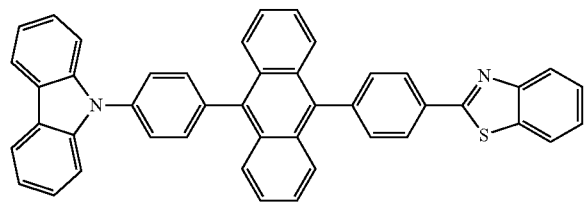
Compound 12
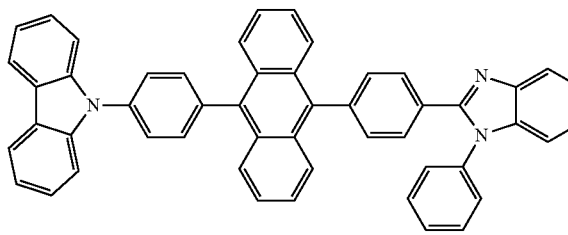
Compound 13
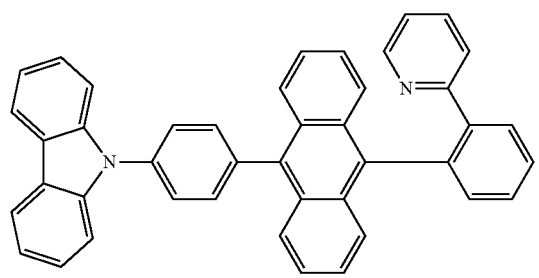
Compound 14
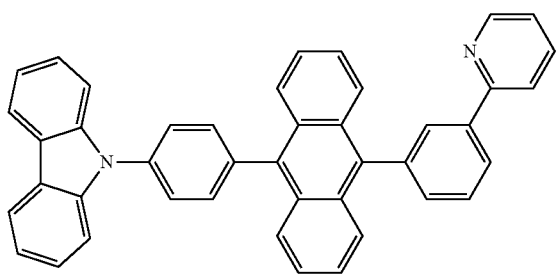
Compound 15
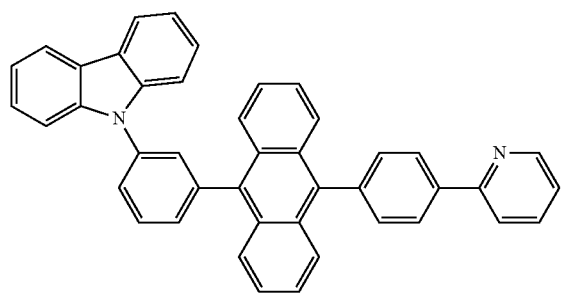
Compound 16
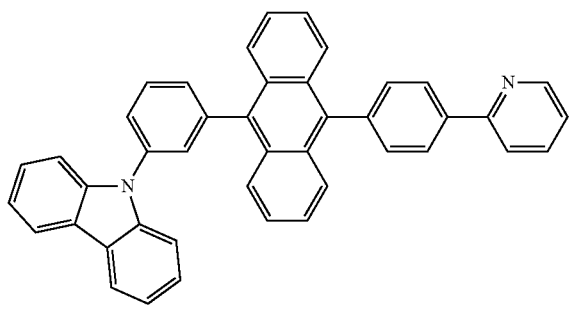
Compound 17
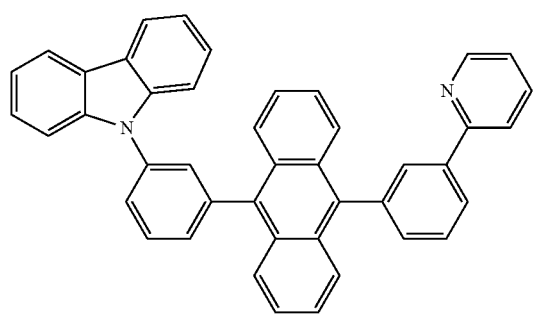
Compound 18
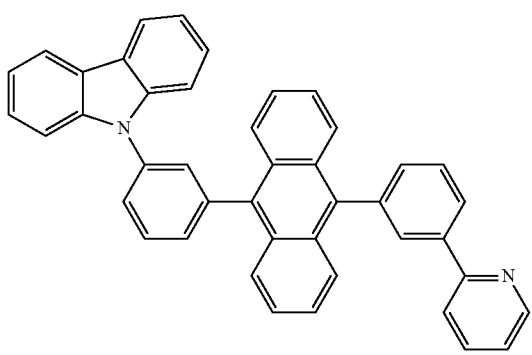

-continued
Compound 19
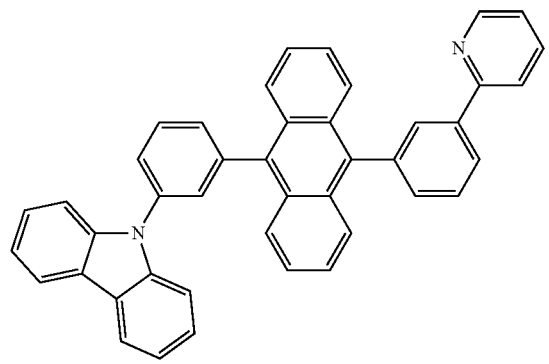
Compound 20
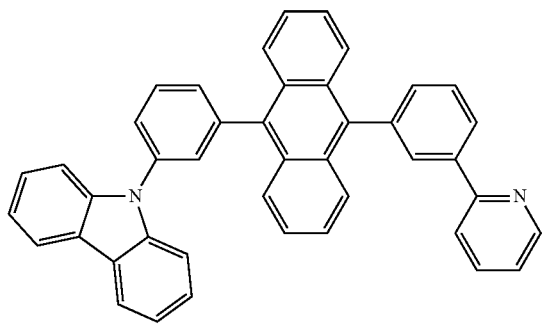
Compound 21
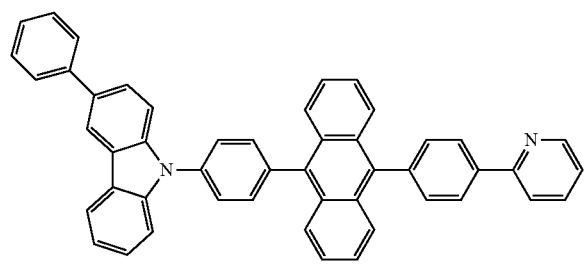
Compound 22
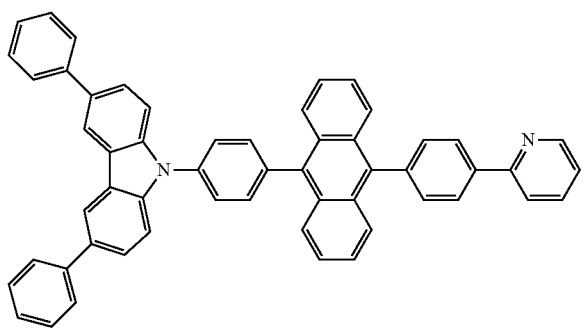
Compound 23
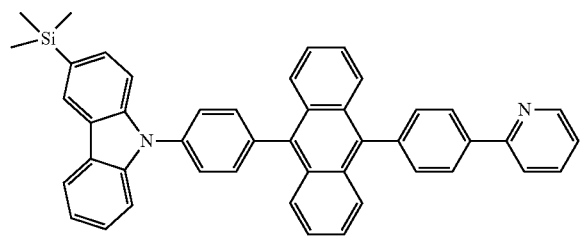
Compound 24
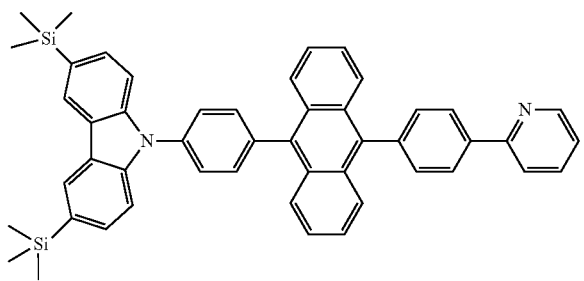
Compound 25
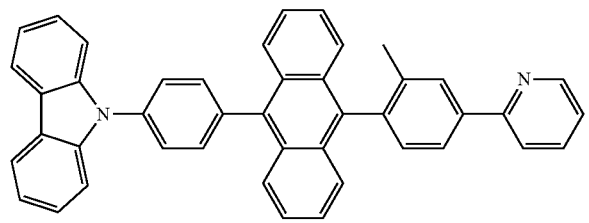
Compound 26
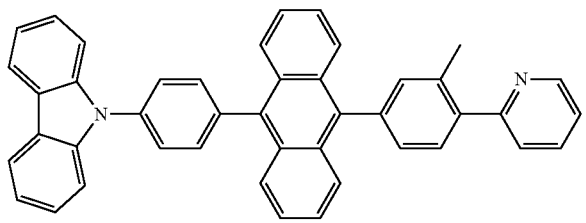
Compound 27
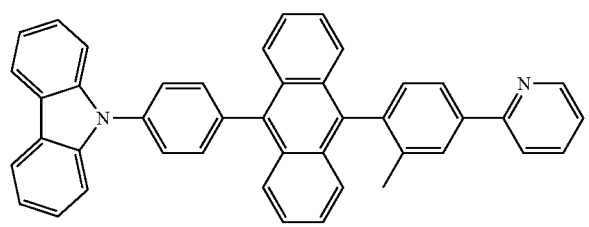
Compound 28
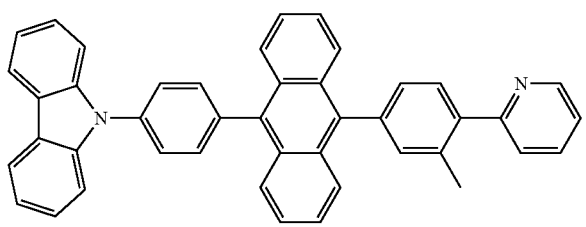

-continued
Compound 29
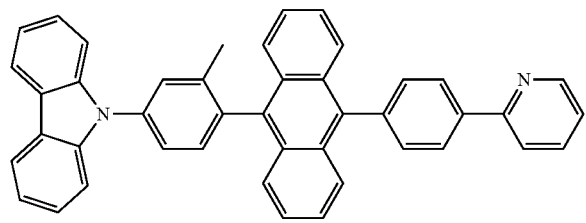
Compound 30
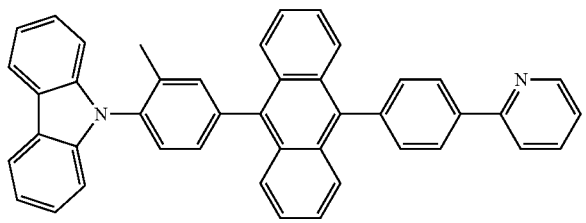
Compound 31
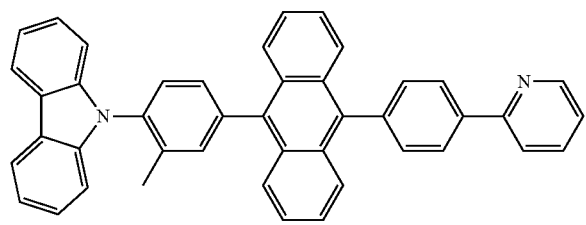
Compound 32
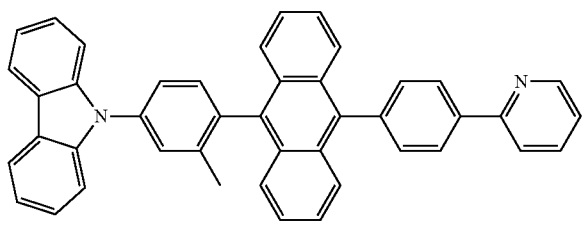
Compound 33
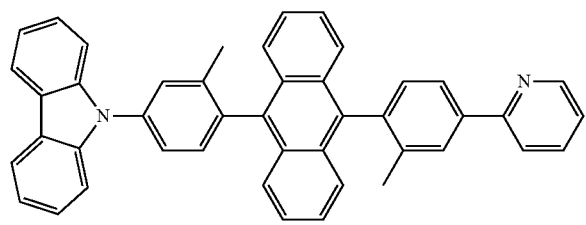
Compound 34
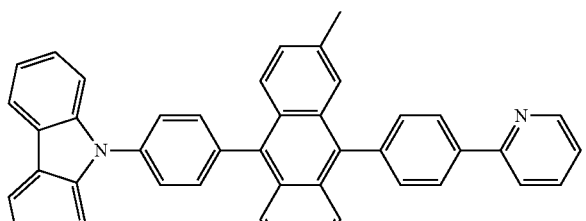
Compound 35
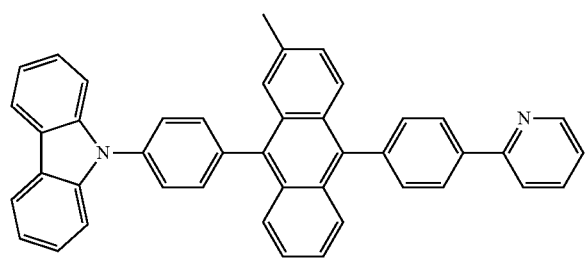
Compound 36
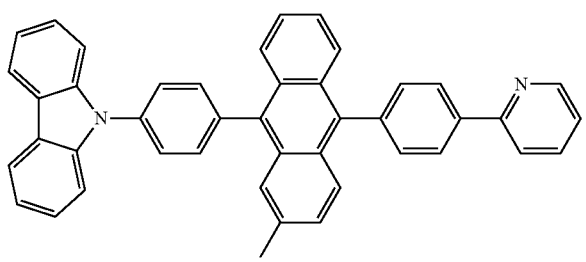
Compound 37
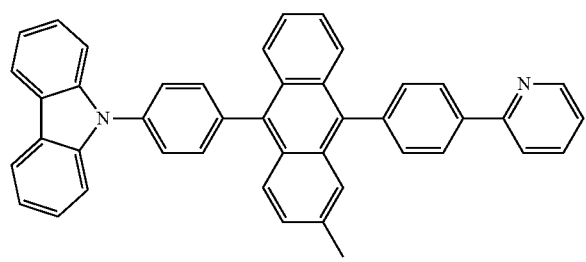
Compound 38
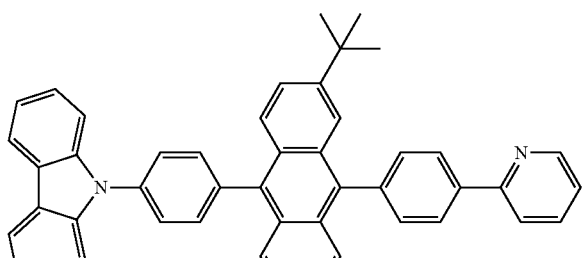

-continued
Compound 39
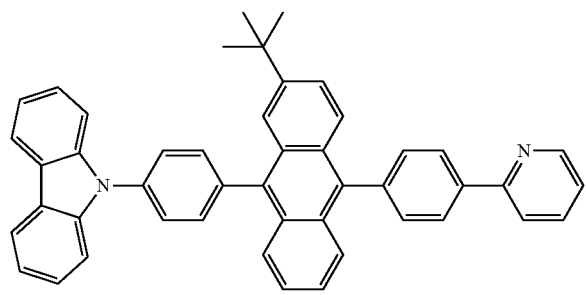
Compound 40
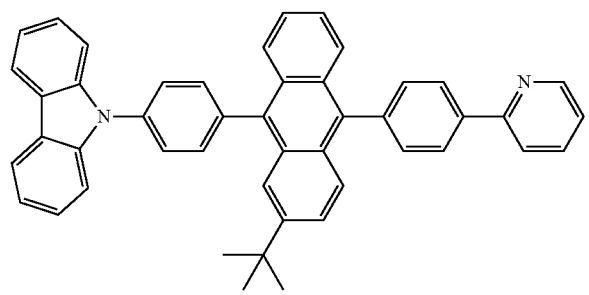
Compound 41
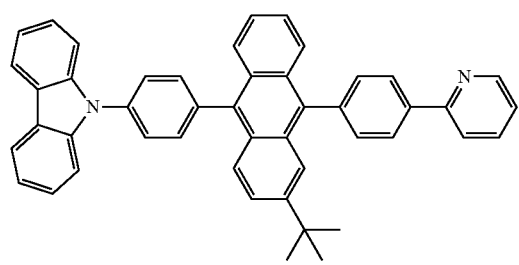
Compound 42
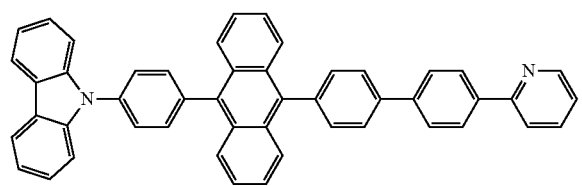
Compound 43
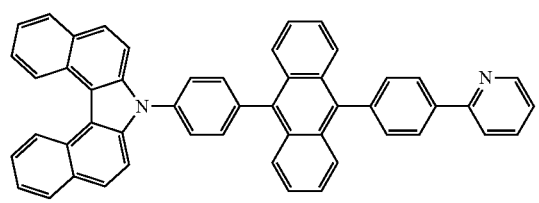
Compound 44
Compound 45
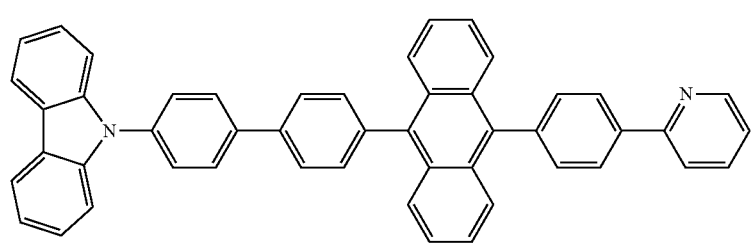
Compound 46
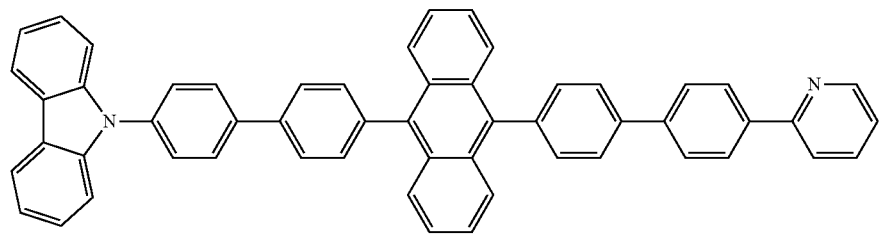

Non-limiting examples of the compound represented by Formula 2 may be Compounds 47 to 114 below.
Compound 47
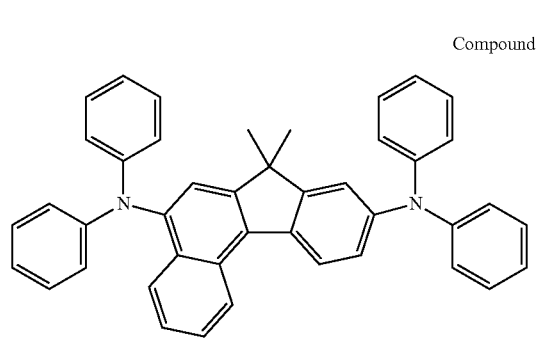
Compound 48
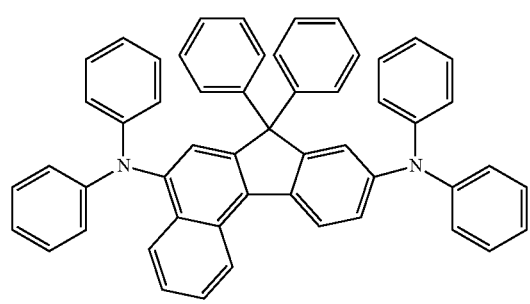
Compound 49
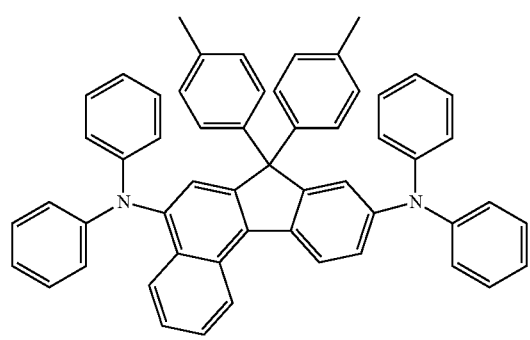
Compound 50
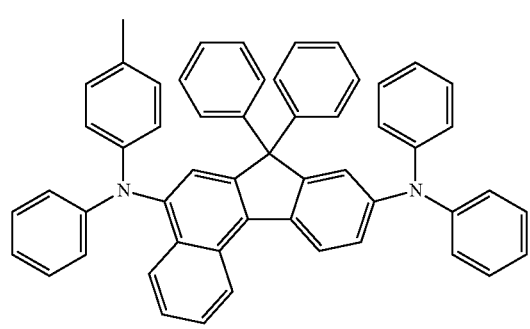
-continued
Compound 51
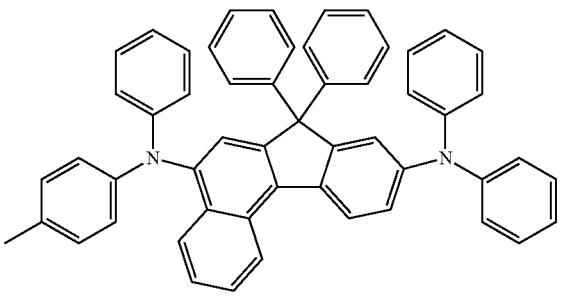
Compound 52
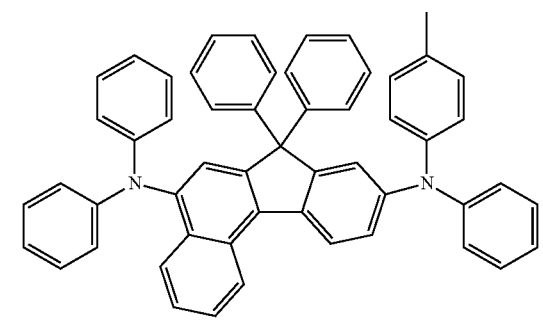
Compound 53
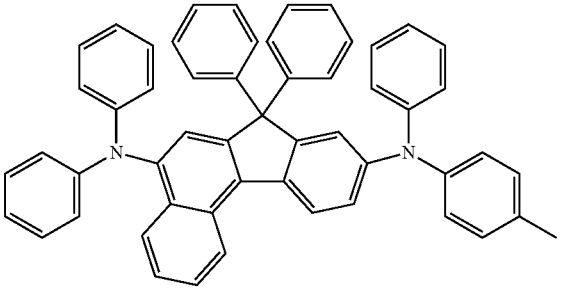
Compound 54
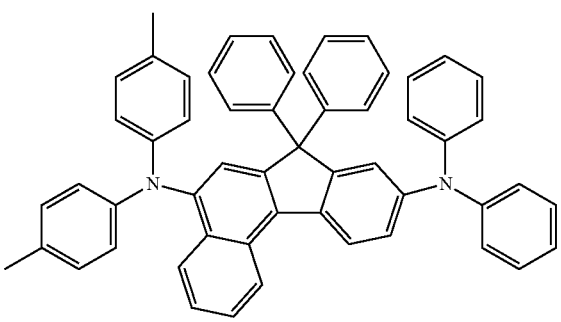
Compound 55
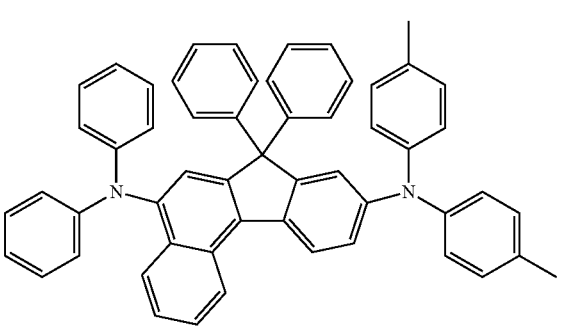

Compound 56
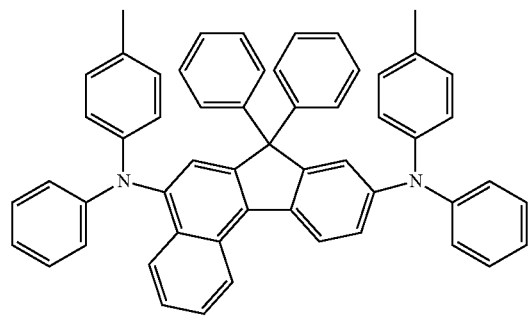
Compound 57
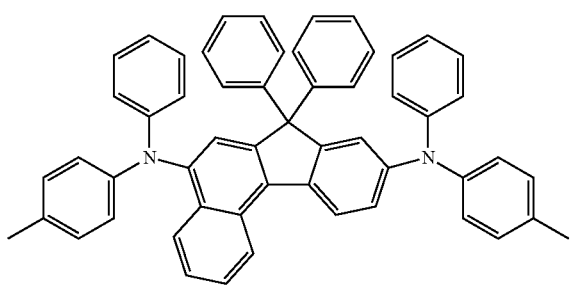
Compound 58
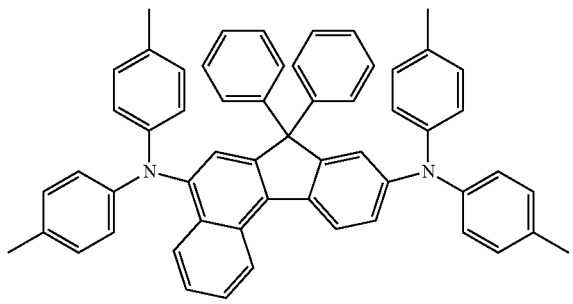
Compound 59
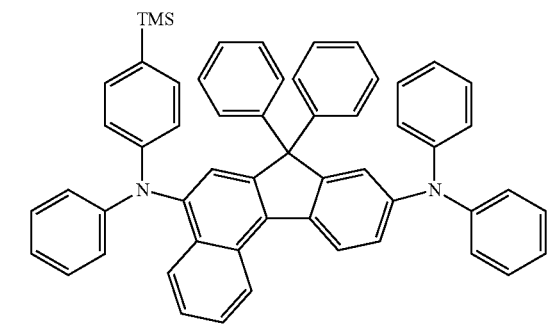
Compound 60
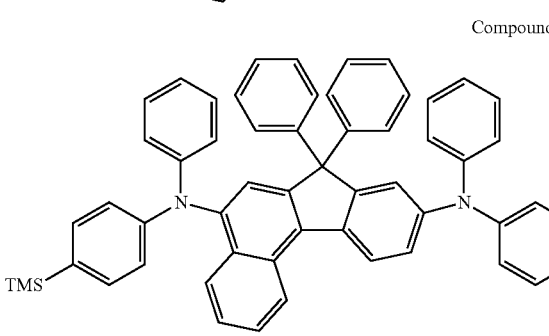
Compound 61
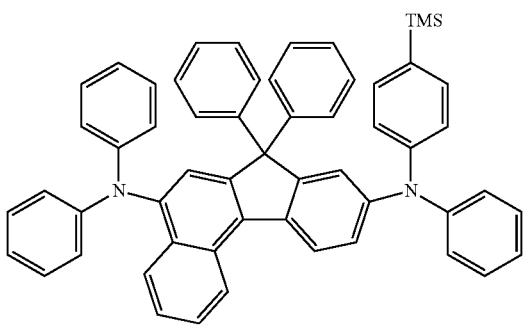
Compound 62
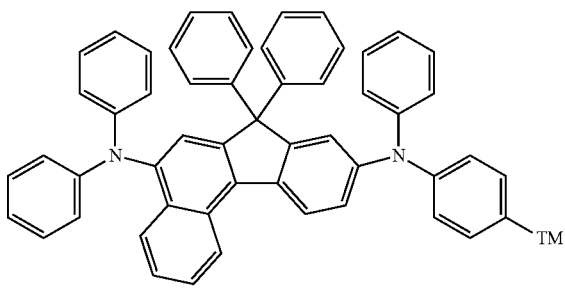
Compound 63
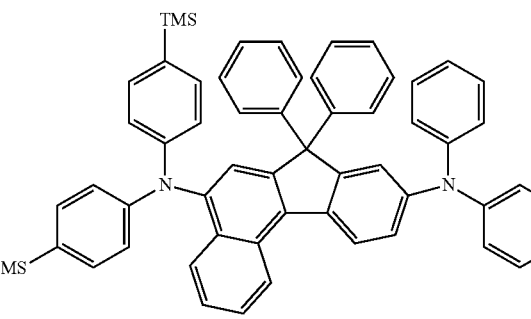
Compound 64
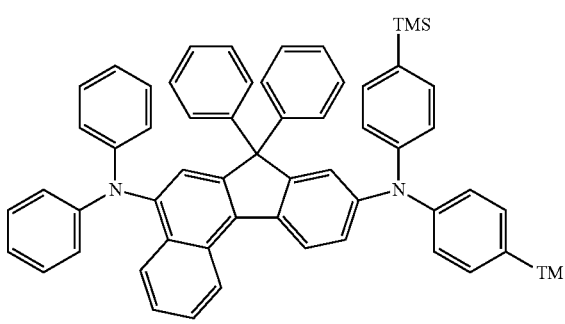

-continued
Compound 65
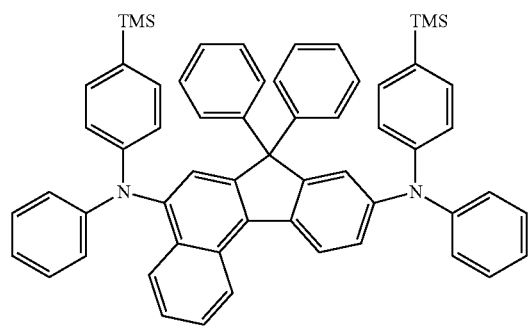
Compound 66
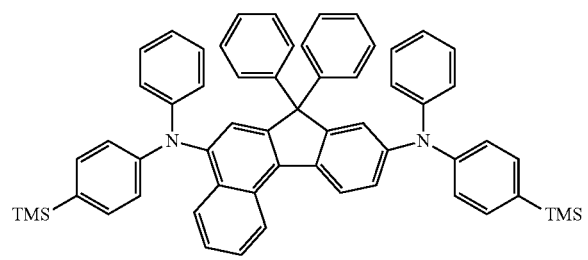
Compound 67
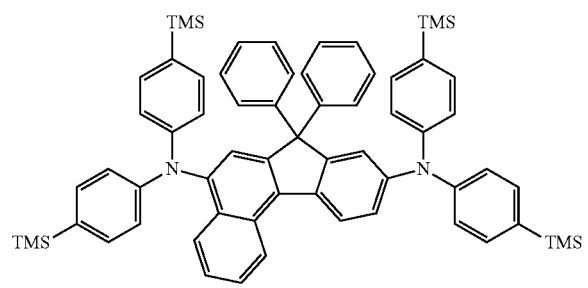
Compound 68
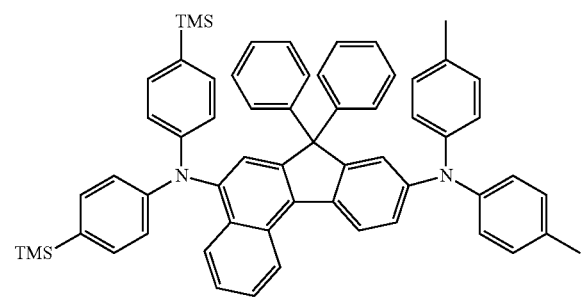
Compound 69
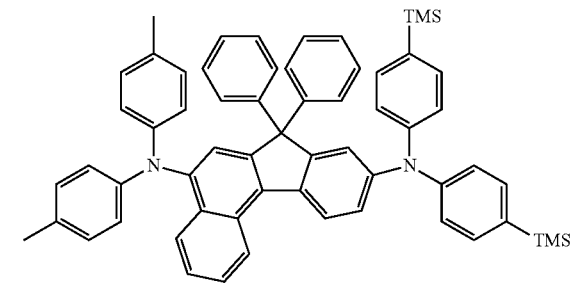
Compound 70
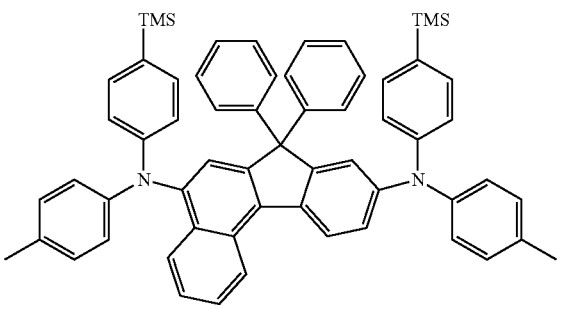
Compound 71
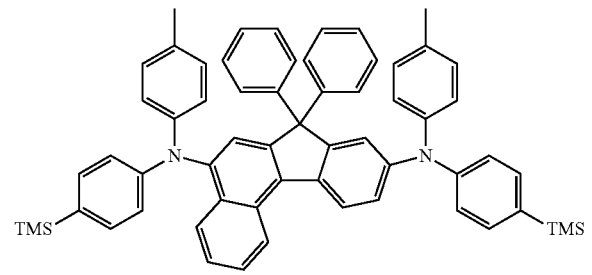
Compound 72
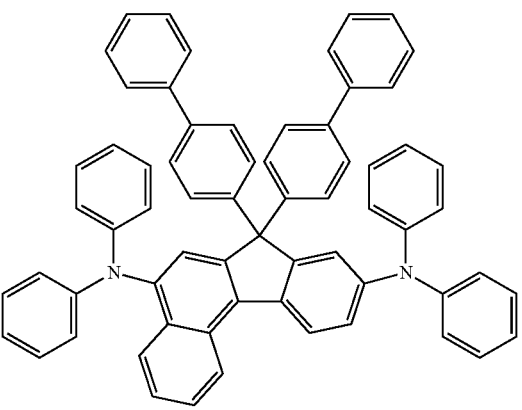
Compound 73
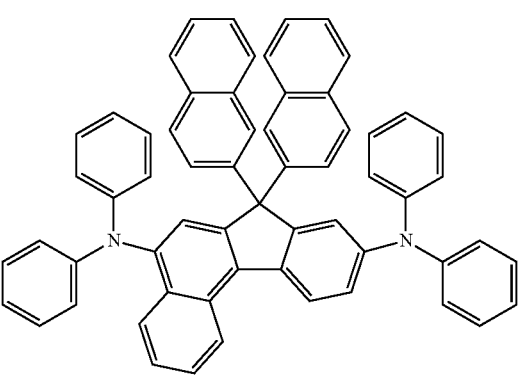

Compound 74
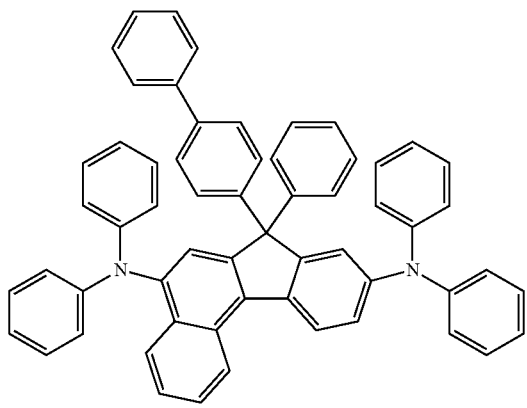
Compound 75
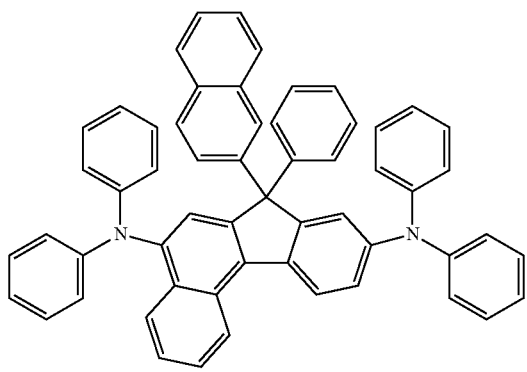
Compound 76
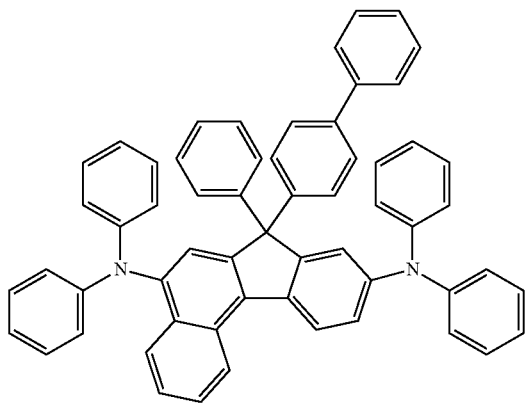
Compound 77
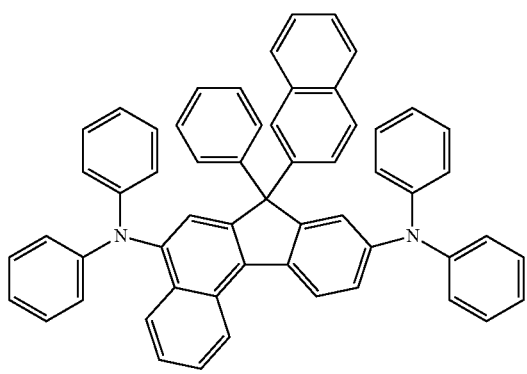
Compound 78
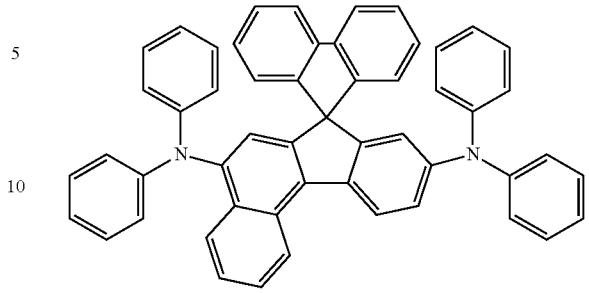
Compound 79
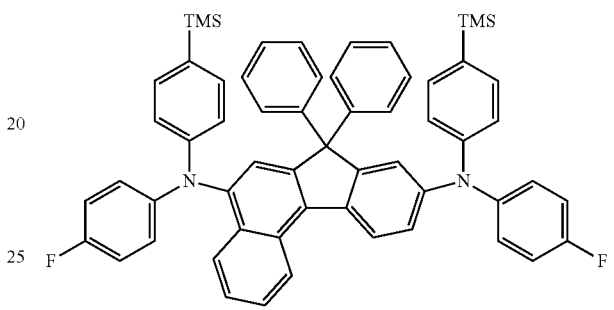
Compound 80
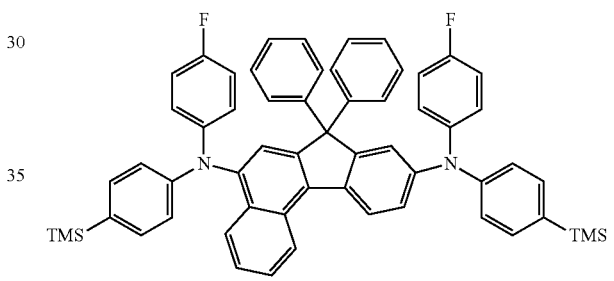
Compound 81
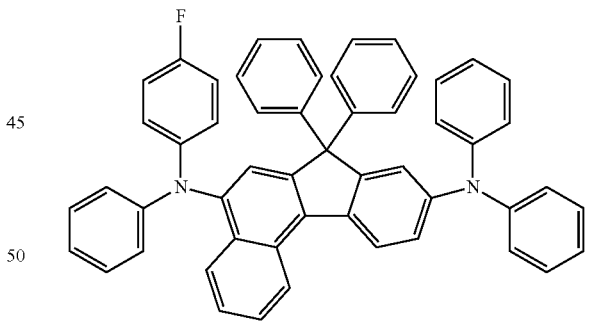
Compound 82
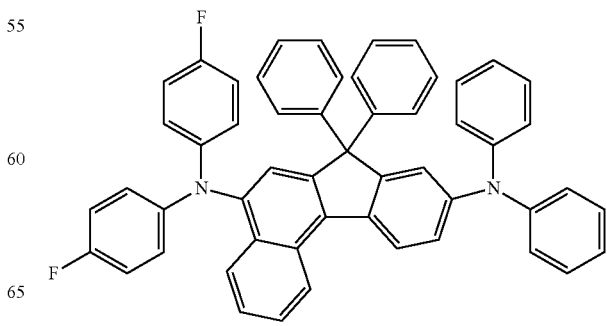

Compound 83
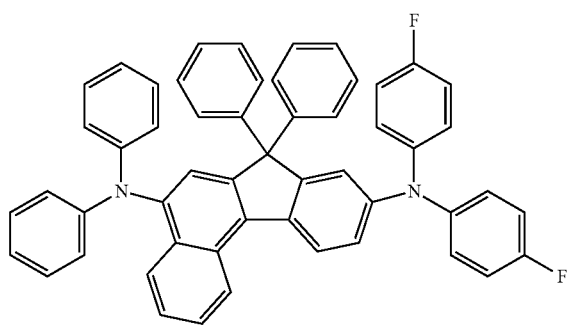
Compound 87
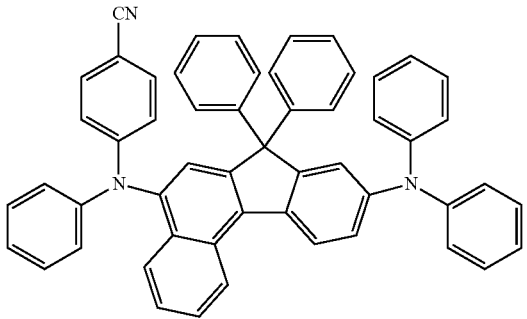
Compound 84
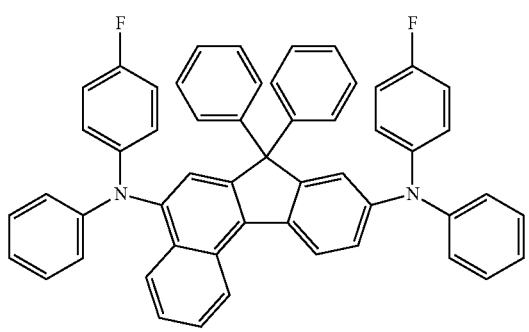
Compound 88
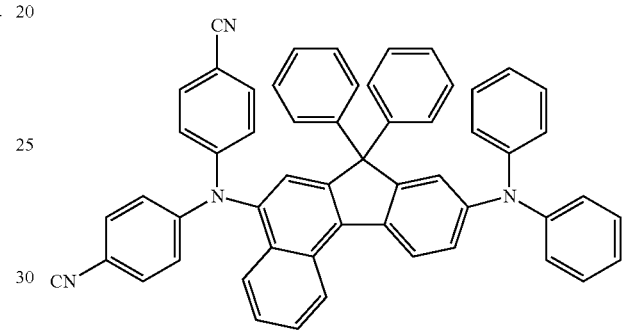
Compound 85
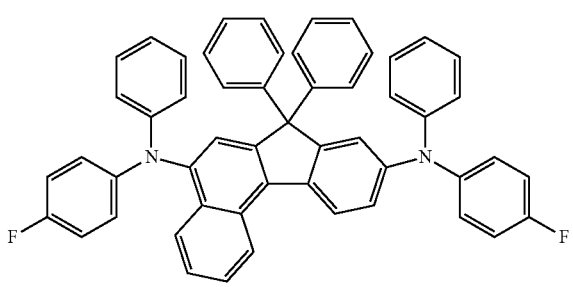
Compound 89
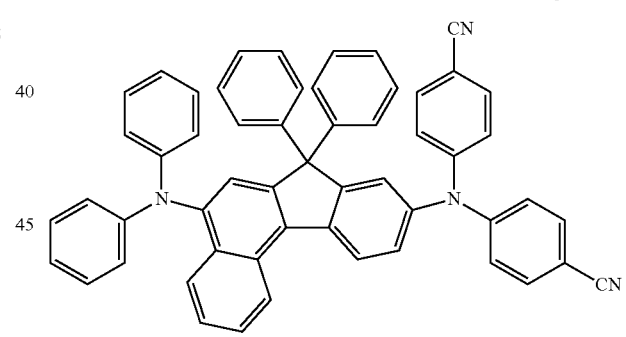
Compound 86
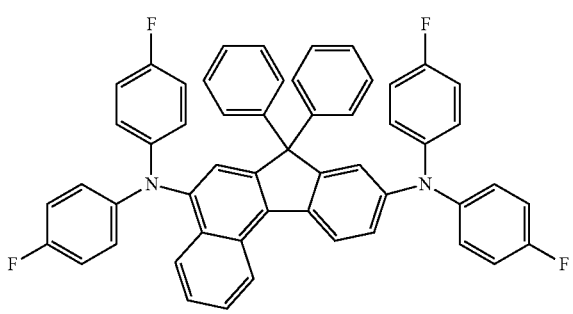
Compound 90
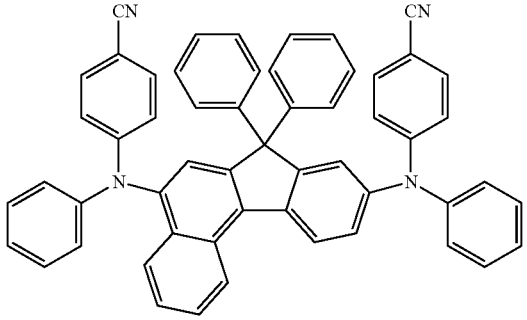

Compound 91
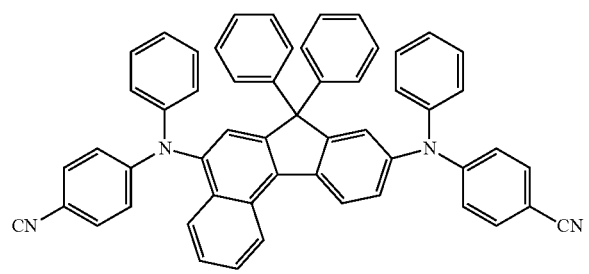
Compound 92
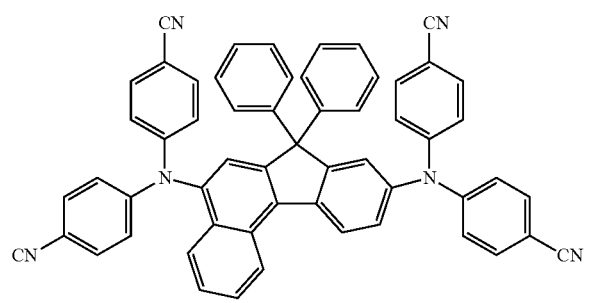
Compound 93
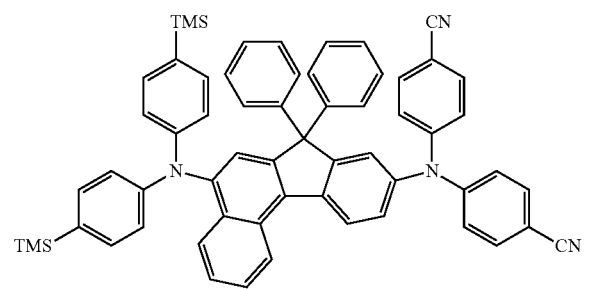
Compound 94
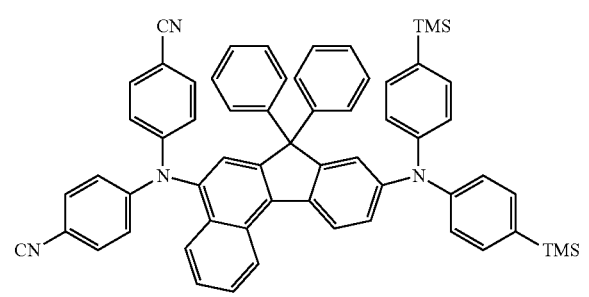
Compound 95
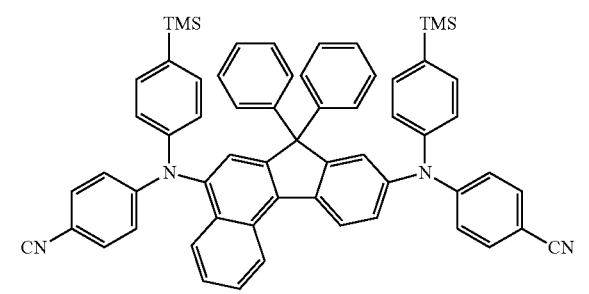
Compound 96
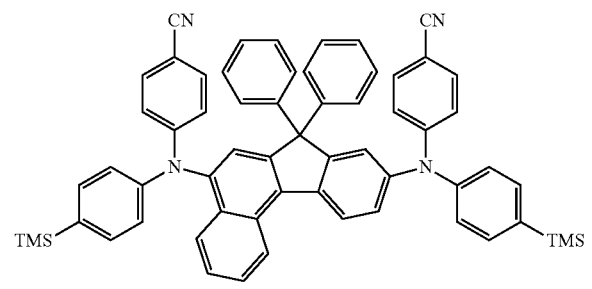
Compound 97
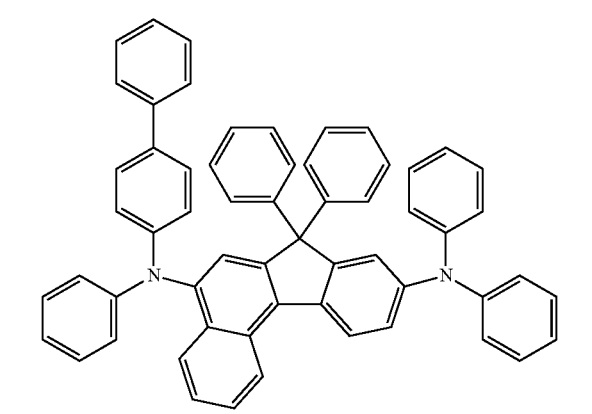
Compound 98
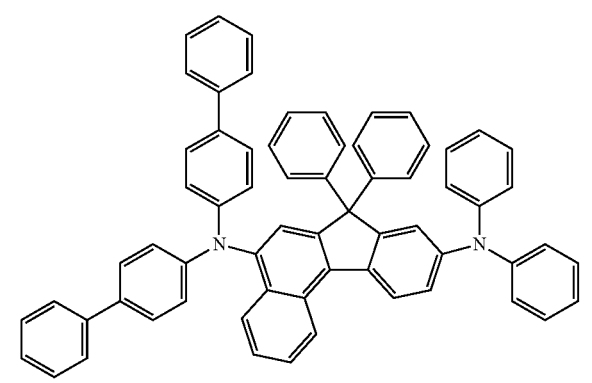
Compound 99
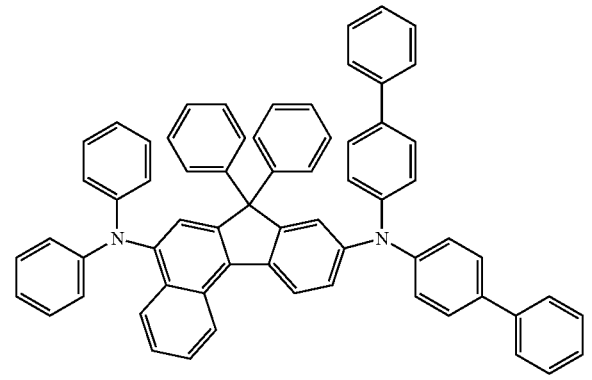

Compound 100
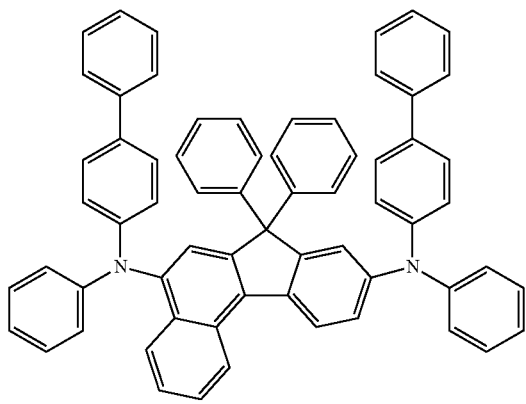
Compound 101
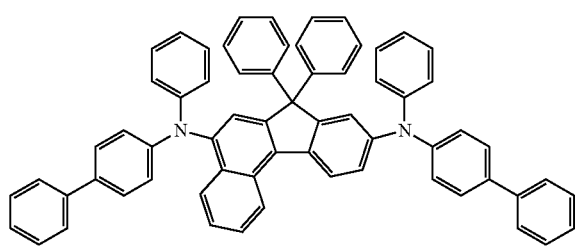
Compound 102
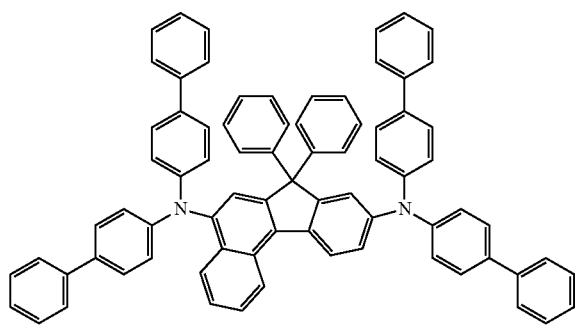
Compound 103
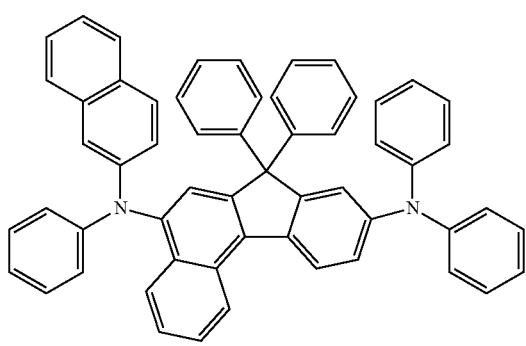
Compound 104
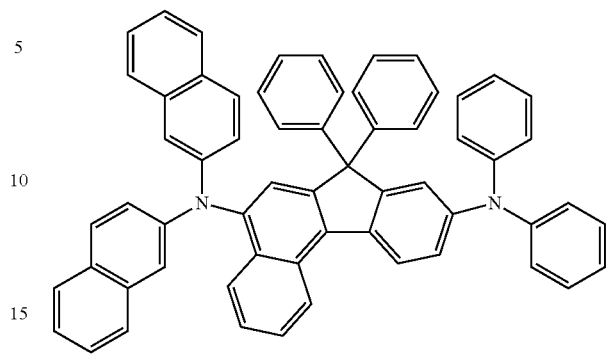
Compound 105
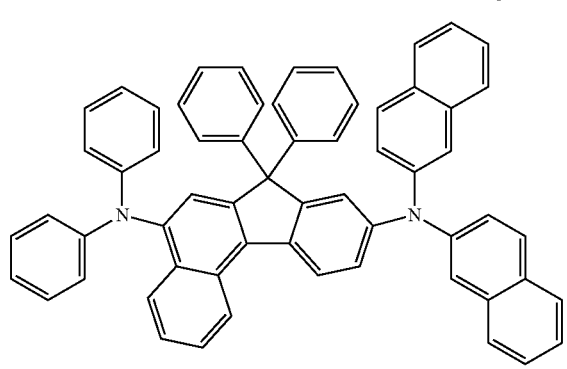
Compound 106
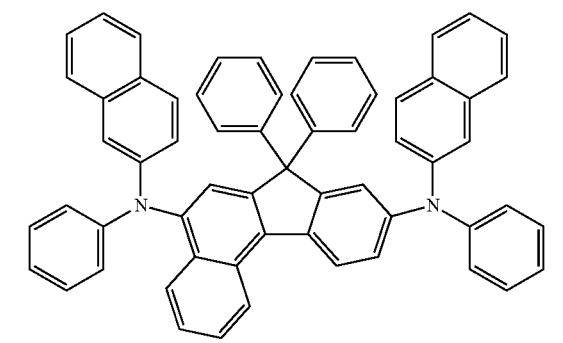
Compound 107
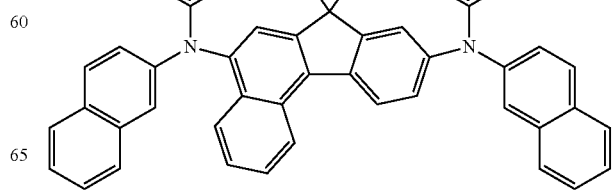

-continued

Compound 108
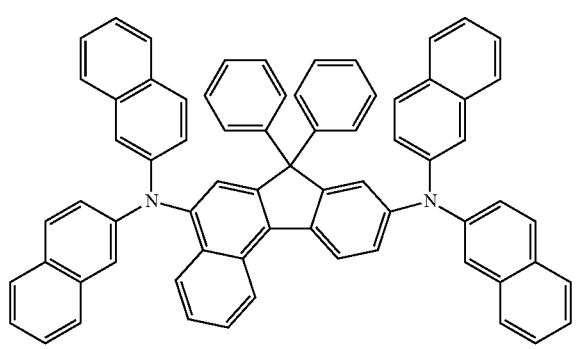

Compound 109
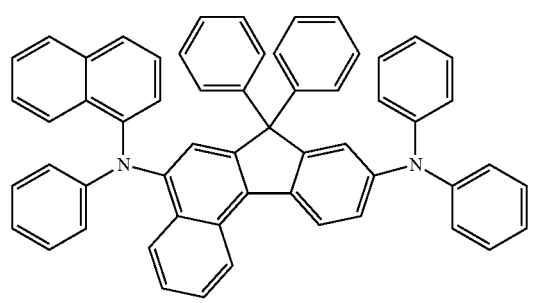

Compound 110
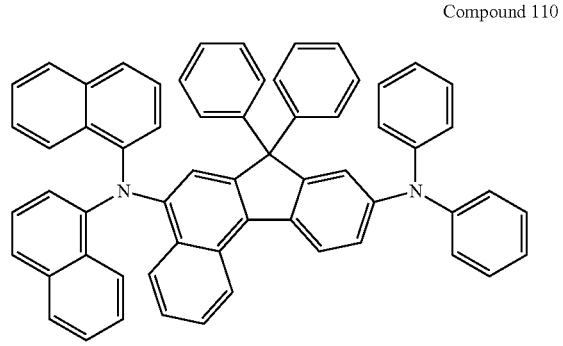

Compound 111
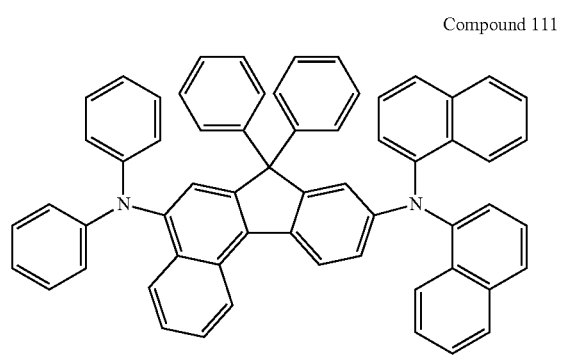

-continued

Compound 112
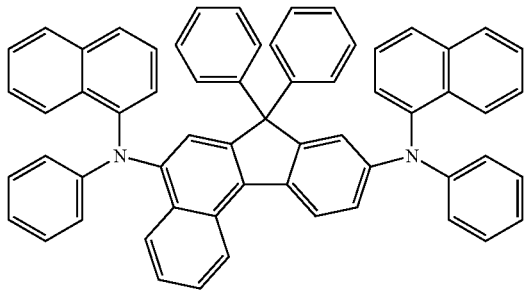

Compound 113
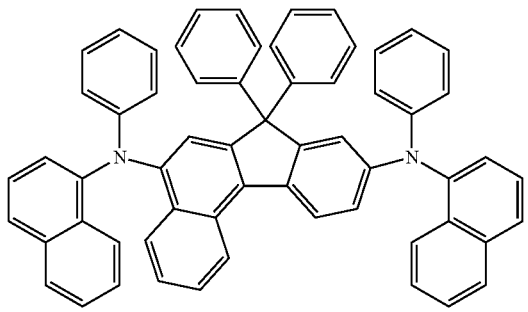

Compound 114
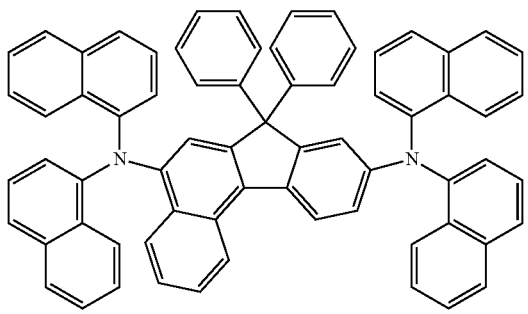

In some embodiments, the organic layer of the organic light-emitting device may be a blue emission layer.

In some embodiments, the organic layer of the organic light-emitting device may include at least one layer selected from among a hole injection layer, a hole transport layer, a functional layer having both hole injection and hole transport capabilities (hereinafter. "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

In some embodiments, the organic layer may be an emission layer, and the compounds represented by Formula 1 and Formula 2 may be used as a host or a dopant in a fluorescent or phosphorescent device.

In some embodiments, the organic layer of the organic light-emitting device may include an electron injection layer, an electron transport layer, an emission layer, a hole injection layer, a hole transport layer, or a functional layer having both hole injection and transport capabilities; and the emission layer may include the compound of Formula 1 and the compound of Formula 1 above, and an anthracene-based compound, an arylamine-based compound or a styryl-based compound.

In some other embodiments, the organic layer of the organic light-emitting device may include an electron injection layer, an electron transport layer, an emission layer, a hole injection layer, a hole transport layer, or a functional layer having both hole injection and transport capabilities; and the emission layer may include red, green, blue, and white emission layers. At least one of a red emission layer, a green emission layer, a blue emission layer, and a white emission layer of the emission layer may include a phosphorescent compound; and at least one of the hole injection layer, the hole transport layer, and the functional layer having both hole injection and hole transport capabilities may further include a charge-generating material, in addition to a hole transporting compound.

In some embodiments, the charge-generating material may be a p-type dopant, and the p-type dopant may be a quinine derivative, a metal oxide, tungsten oxide, or molybdenum oxide, or a cyano group-containing compound.

In some embodiments, the organic film may include an electron transport layer, and the electron transport layer may include an electron-transporting organic compound and a metal complex. The metal complex may be a lithium (Li) complex, such as lithium quinolate (LiQ), compound 203 below.

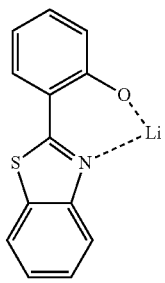

Compound 203

The term "organic layer" as used herein refers to a single organic layer and/or a plurality of organic layers disposed between the first and second electrodes of the organic light-emitting device.

The organic layer may include an emission layer, and the emission layer may include the compound of Formula 1 and the compound of Formula 2 described above.

The organic layer may include at least one of a hole injection layer, a hole transport layer, and a functional layer having both hole injection and hole transport capabilities (hereinafter, "H-functional layer"); and at least one of the hole injection layer, the hole transport layer, and the functional layer having both hole injection and hole transport capabilities may include the compound of Formula 1 and the compound of Formula 2 described above.

For example, the compound of Formula 1 above in the emission layer may serve as a host. For example, the compound of Formula 1 may serve as a blue fluorescent host emitting blue light. The compound of Formula 2 above in the emission layer may serve as a dopant.

In some embodiments, the organic layer may be formed from the compound of Formula 1 and the compound of Formula 2 using a wet process.

In some embodiments, a flat panel display device may include the organic light-emitting device described above, and the first electrode of the organic light-emitting device may be electrically connected to a source electrode or a drain electrode of a thin-film transistor.

FIG. 1 is a schematic sectional view of an organic light-emitting device according to an embodiment of the present invention. Hereinafter, a structure of an organic light-emitting device according to an embodiment of the present invention and a method of manufacturing the same will now be described with reference to FIG. 1.

A substrate (not shown) may be any substrate that is used in existing organic light emitting devices. In some embodiments, the substrate may be a glass substrate or a transparent plastic substrate with strong mechanical strength, thermal stability, transparency, surface smoothness, ease of handling, and water resistance.

A first electrode may be formed by depositing or sputtering a first electrode-forming material on the substrate.

When the first electrode is an anode, a material having a high work function may be used as the first electrode-forming material to facilitate hole injection.

The first electrode may be a reflective electrode or a transmission electrode.

Transparent and conductive materials such as ITO, IZO, $SnO_2$, and ZnO may be used to form the first electrode.

The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layer structure or a multi-layer structure including at least two layers.

For example, the first electrode may have a three-layered structure of ITO/Ag/ITO, but is not limited thereto.

An organic layer(s) is disposed on the first electrode.

The organic layer may include a hole injection layer (HIL), a hole transport layer (HTL), a buffer layer (not shown), an emission layer (EML), an electron transport layer (ETL), or an electron injection layer (EIL).

The HIL may be formed on the first electrode by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may be formed of any material that is commonly used to form a HIL. Non-limiting examples of the material that can be used to form the HIL may be N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

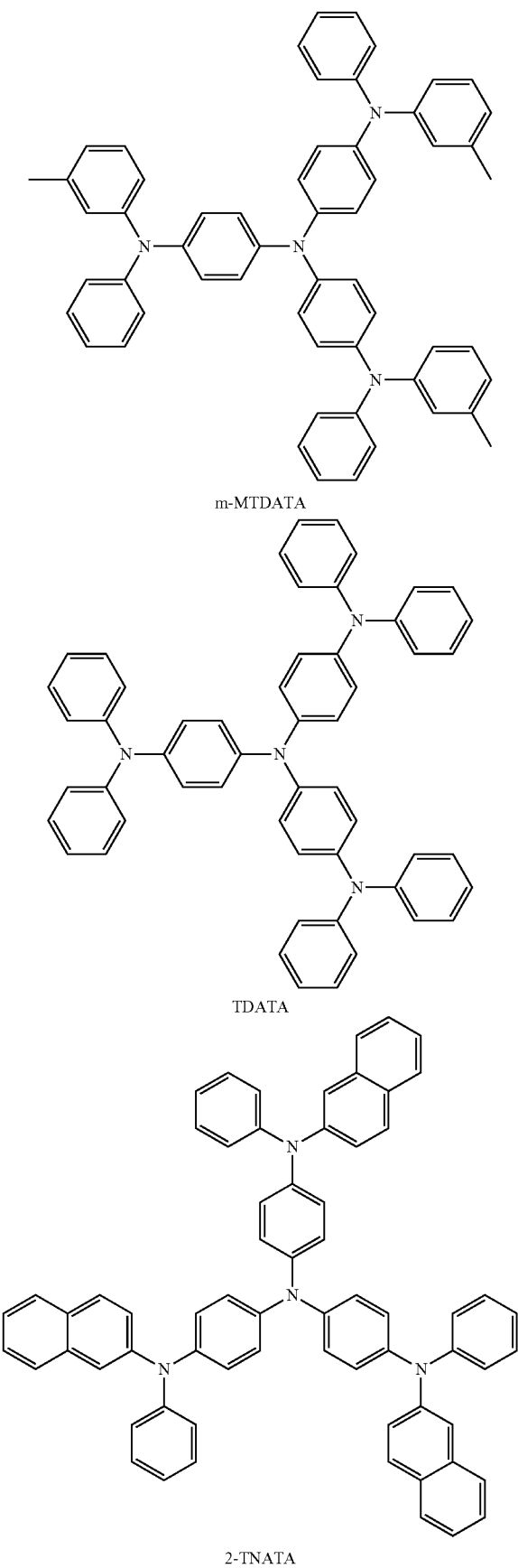

m-MTDATA

TDATA

2-TNATA

The thickness of the HIL may be from about 100 Å to about 1000 Å, and in some embodiments, from about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like.

When the HTL is formed using vacuum deposition or spin coating, the conditions for vacuum deposition and spin coating may be similar to those for the formation of the HIL, though the conditions for the vacuum deposition and spin coating may vary according to the material that is used to form the HTL.

The HTL may be formed of any known hole-transporting materials. Non-limiting examples of suitable known HTL forming materials may be carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

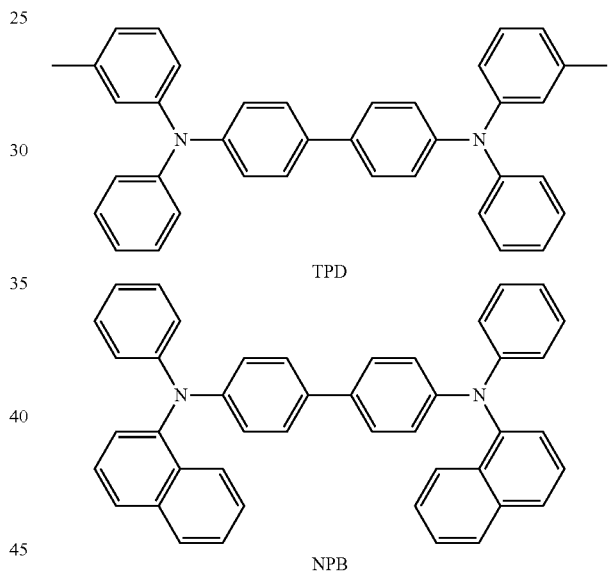

TPD

NPB

The thickness of the HTL may be from about 50 Å to about 2000 Å, and in some embodiments, from about 100 Å to about 1500 Å. When the thickness of the HTL is within these ranges, the HTL may have good hole transporting ability without a substantial increase in driving voltage.

A H-functional layer (having both hole injection and hole transport capabilities) may contain at least one material from each group of hole injection layer materials and hole transport layer materials.

The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of a compound of Formula 300 below and a compound of Formula 350 below:

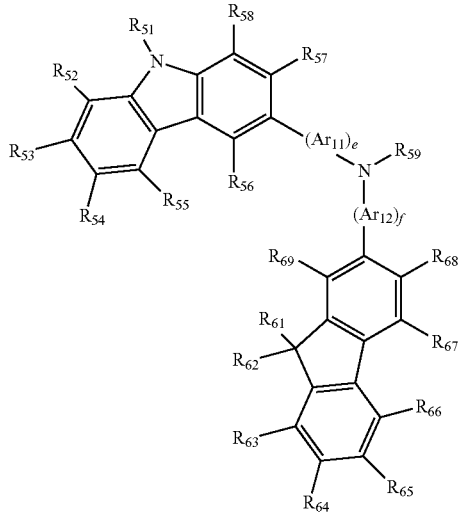

Formula 300

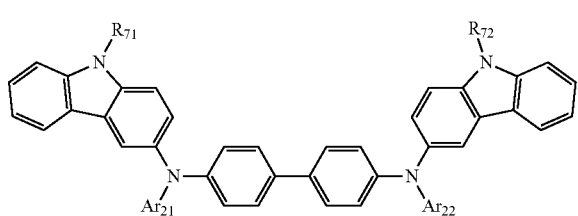

Formula 350

In Formulae 300 and 350, $Ar_{11}$, $Ar_{12}$, $Ar_{21}$, and $Ar_{22}$ may be each independently a substituted or unsubstituted $C_5$-$C_{60}$ arylene group.

In Formula 300, e and f may be each independently an integer from 0 to 5, for example, may be 0, 1, or 2. For example, e may be 1, and f may be 0, but not limited thereto.

In Formulae 300 and 350 above, $R_{51}$ to $R_{58}$, $R_{61}$ to $R_{69}$, $R_{71}$ and $R_{72}$ may be each independently hydrogen, deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

In some embodiments. $R_{51}$ to $R_{58}$, $R_{61}$ to $R_{69}$, $R_{71}$, and $R_{72}$ may be each independently one of hydrogen; deuterium; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{59}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an embodiment the compound of Formula 300 may be a compound represented by Formula 300A below:

Formula 300A

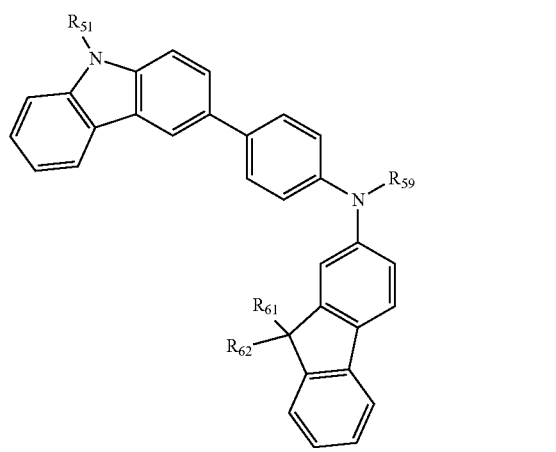

In Formula 300A, $R_{51}$, $R_{61}$, $R_{62}$, and $R_{59}$ may be as defined above.

In some non-limiting embodiments, at least one of the HIL, HTL, and H-functional layer may include at least one of compounds represented by Formulae 301 to 320 below:

301

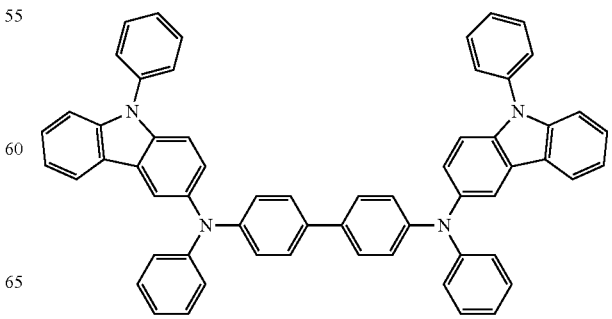

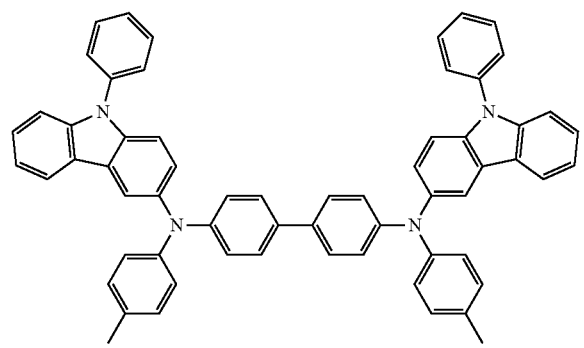
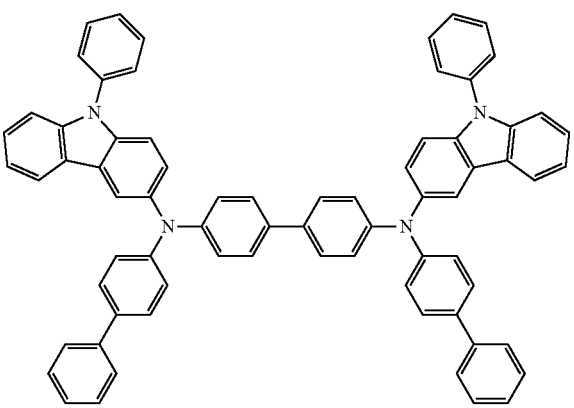
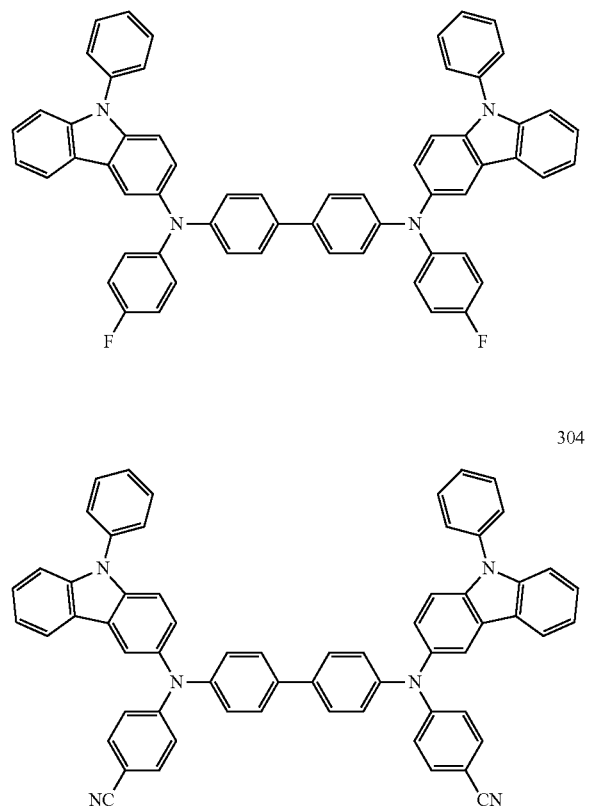
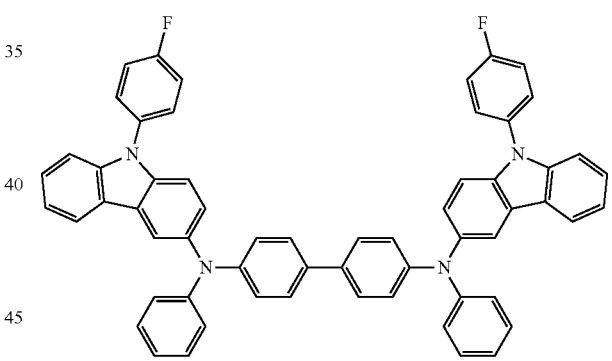
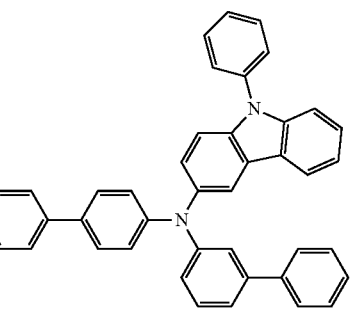
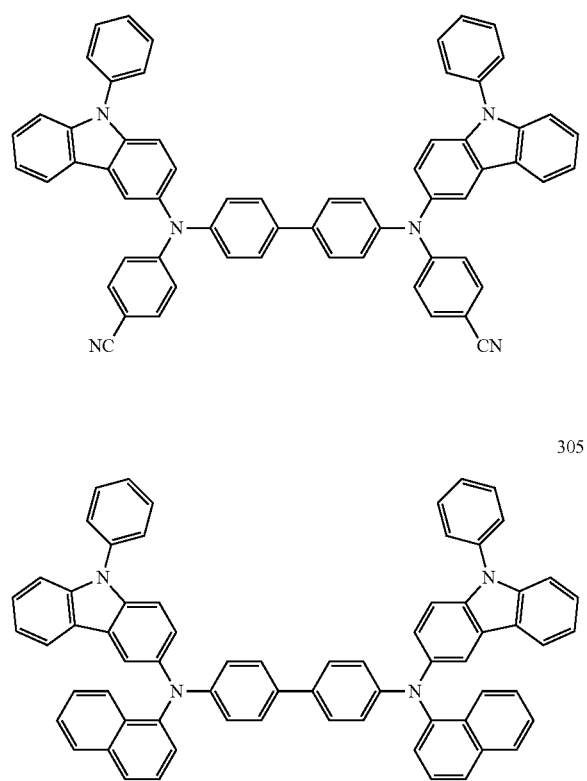
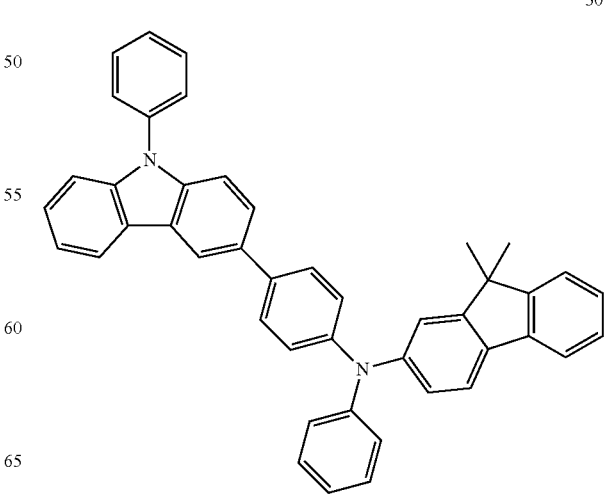

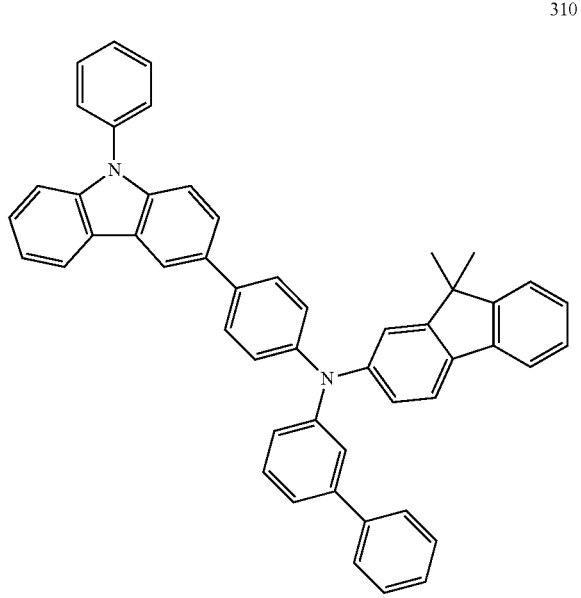
310
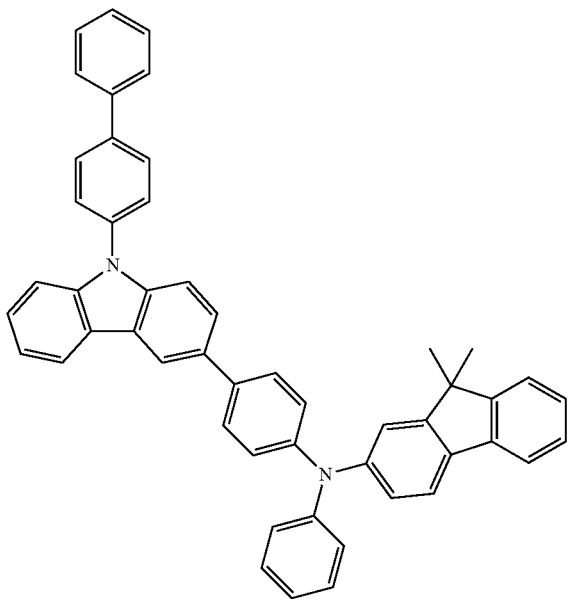
312
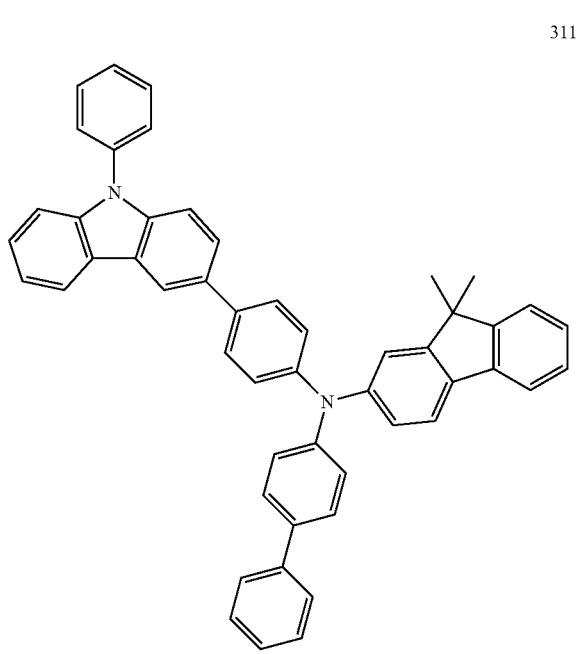
311
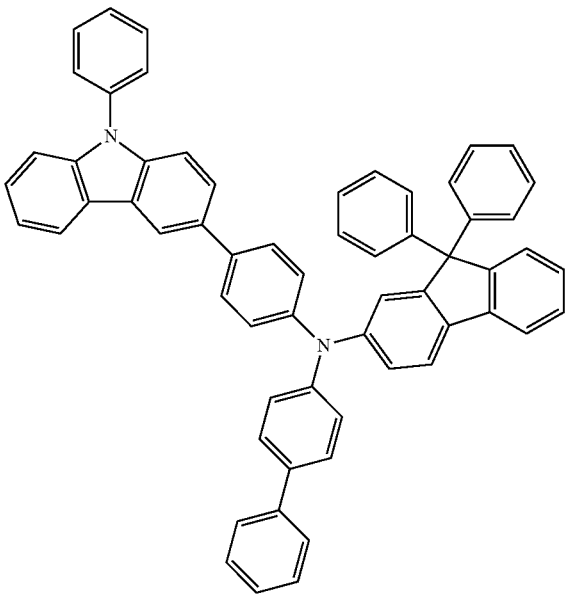
313

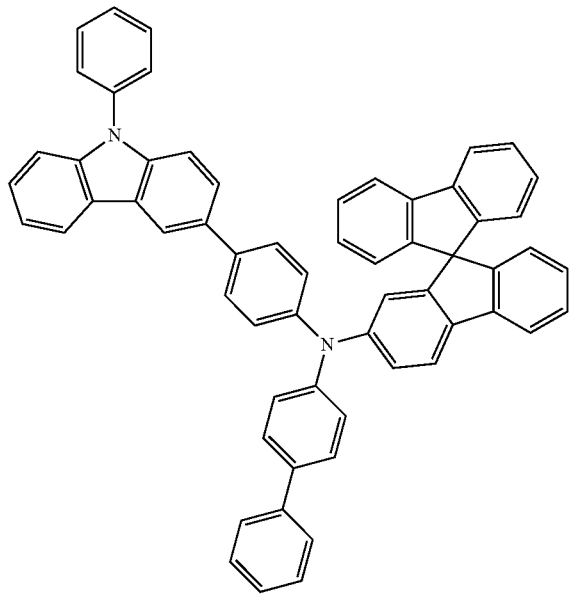
314
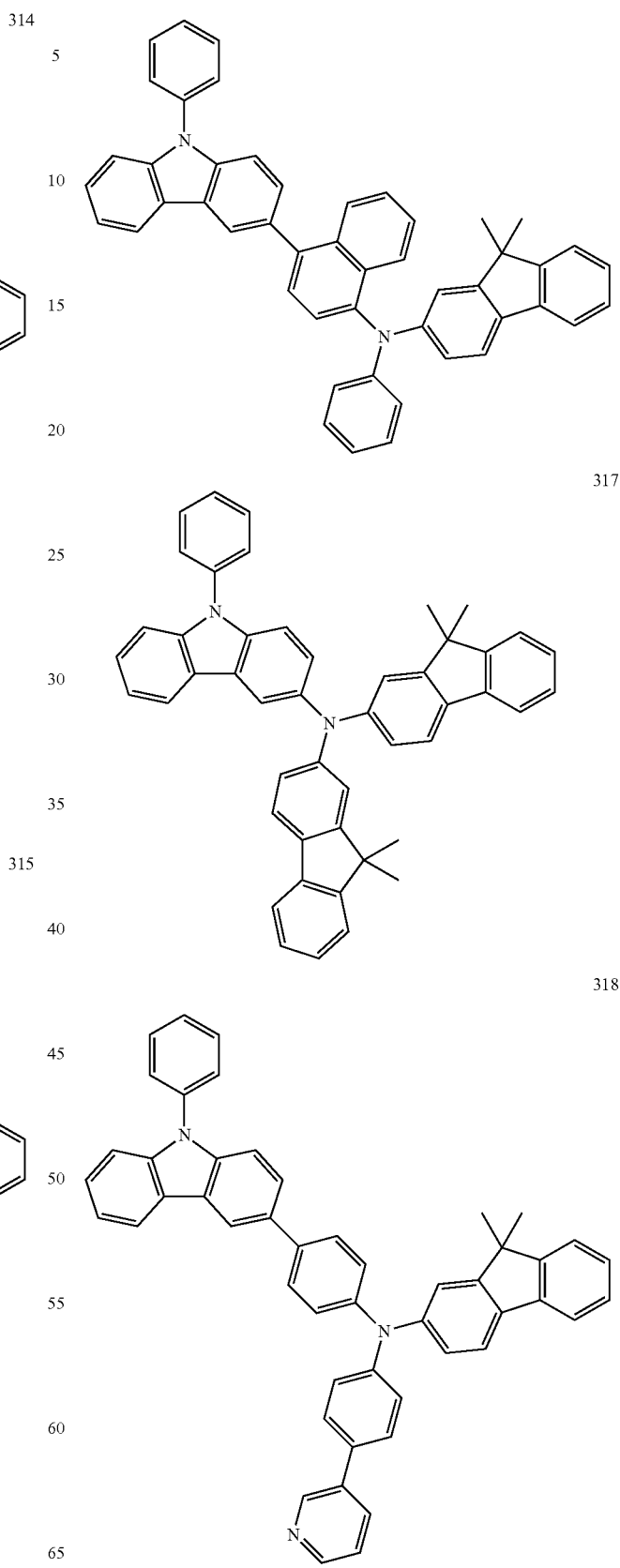

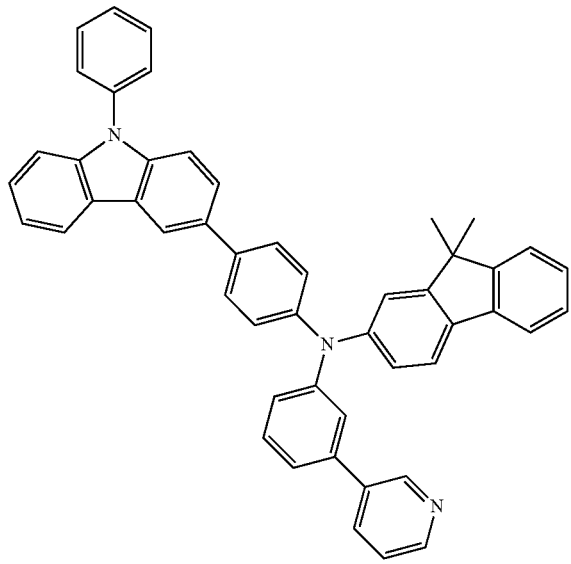

319

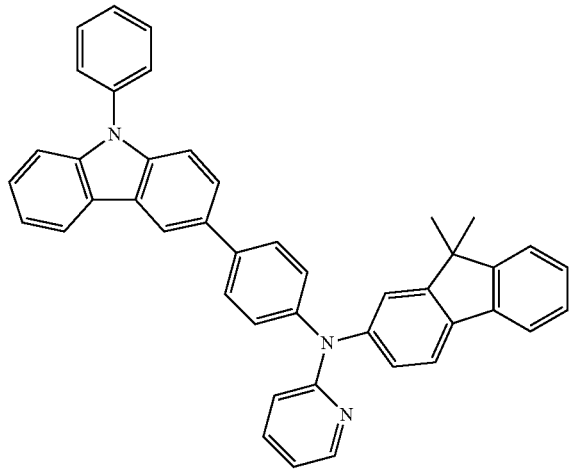

320

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-type dopant.

The p-type dopant may be one of quinine derivatives, metal oxides, and compounds with a cyano group, but are not limited thereto.

Non-limiting examples of the p-type dopant may be quinone derivatives such as tetracyanoquinonedimethane (TCNQ), 2,3,5,6-tetrafluoro-tetracyano-1,4-benzoquinon-cdimethane (F4-TCNQ), and the like; metal oxides such as tungsten oxide, molybdenum oxide, and the like; and cyano-containing compounds such as Compound 200 below.

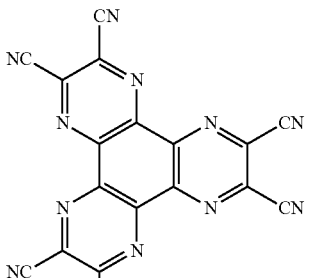

Compound 200

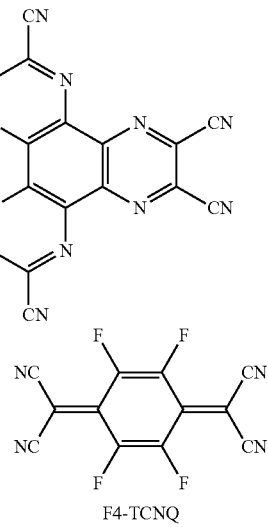

F4-TCNQ

When the hole injection layer, the hole transport layer, or the H-functional layer further includes a charge-generating material, the charge-generating material may be homogeneously dispersed or inhomogeneously distributed in the layer.

A buffer layer may be disposed between at least one of the HIL, HTL, and H-functional layer, and the EML.

The buffer layer may compensate for an optical resonance distance of light according to a wavelength of the light emitted from the EML, and thus may increase efficiency.

The butter layer may include any hole injecting material or hole transporting material that are widely known.

In some other embodiments, the buffer layer may include the same material as one of the materials included in the HIL, HTL, and H-functional layer that underly the buffer layer.

Then, an EML may be formed on the HTL, H-functional layer, or buffer layer by vacuum deposition, spin coating, casting, Langmuir-Blodget (LB) deposition, or the like.

When the EML is formed using vacuum deposition or spin coating, the vacuum deposition and spin coating conditions may be similar to those for the formation of the HIL, though the conditions for deposition and coating may vary according to the material that is used to form the EML.

The EML may include the compounds of Formula 1 and Formula 2 described above.

For example, the compounds of Formula 1 and Formula 2 may be used as a host or a dopant.

The EML may be formed using a variety of known light-emitting materials, in addition to the compounds of Formula 1 and Formula 2. In some embodiments, the EML may also be formed using a known host and a dopant.

Dopants that may be used to form the EML may include either a fluorescent dopant or a phosphorescent dopant which are widely known in the art.

Non-limiting example of the known host may be Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPB1), 3-tert-butyl-9,10-di-2-naphthylanthracene (TBADN), E3, distyrylarylene (DSA), dmCBP (see a formula below), and Compounds 501 to 509 below.

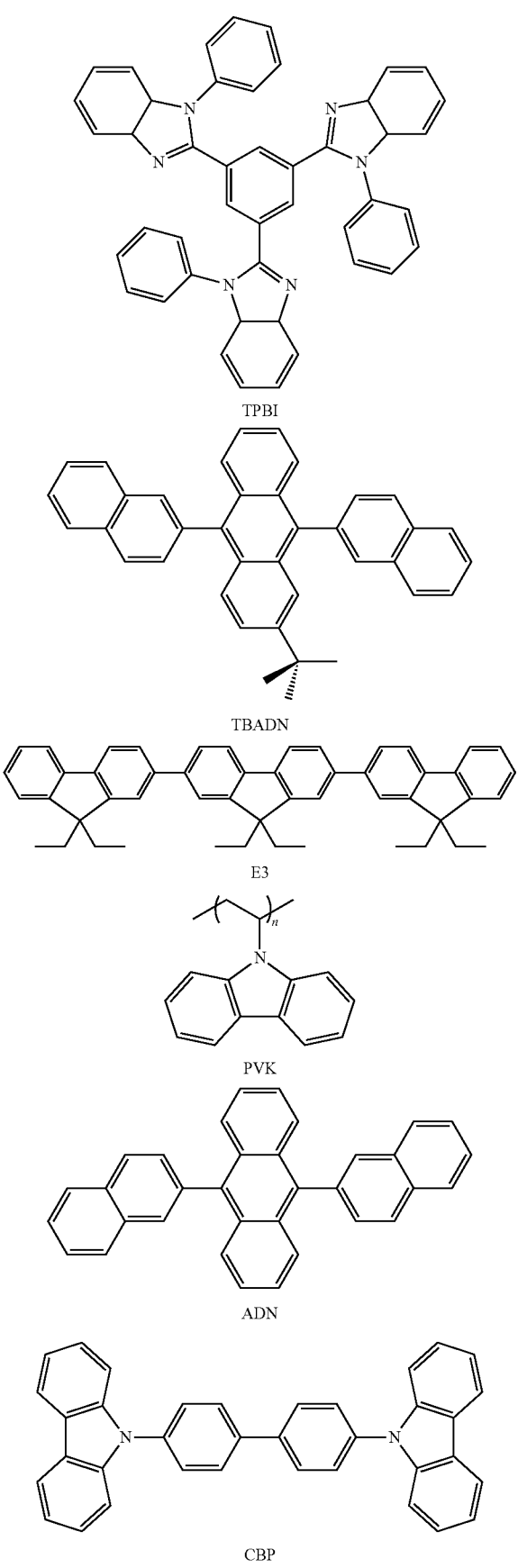
TPBI
TBADN
E3
PVK
ADN
CBP
-continued
dmCBP
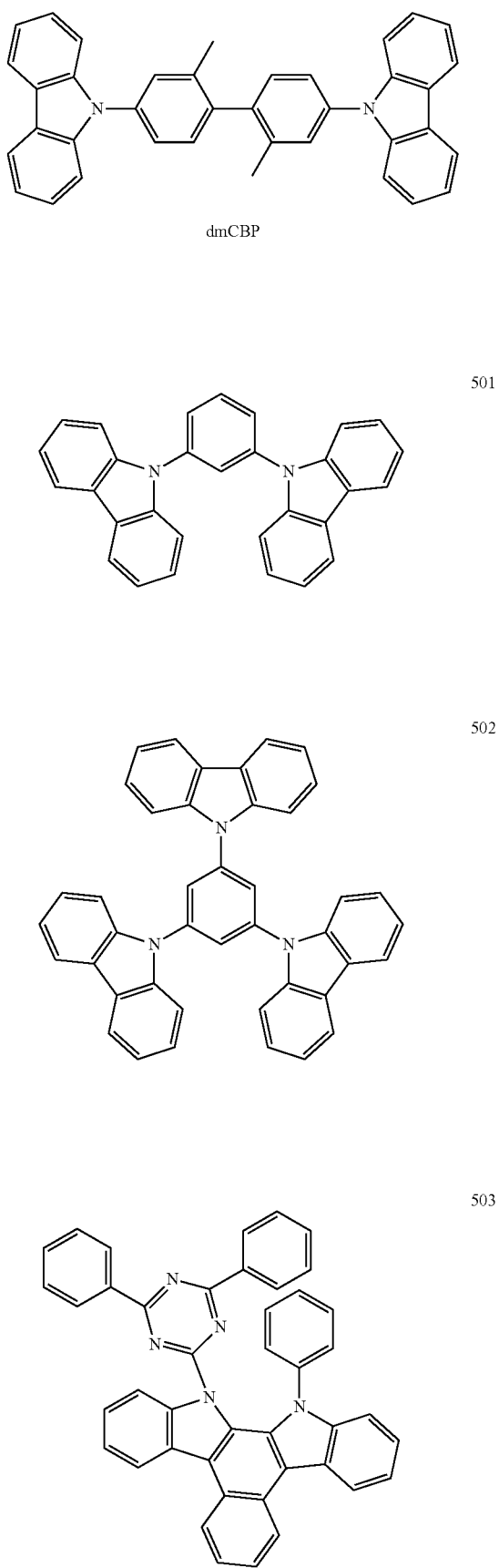

504
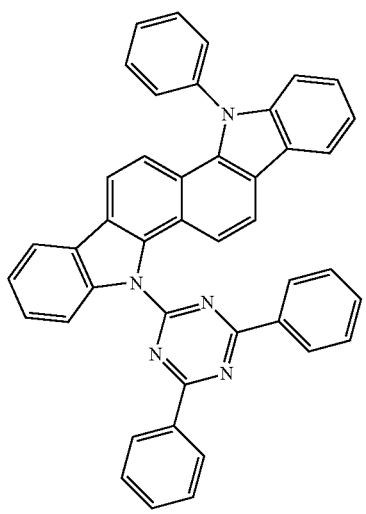
505
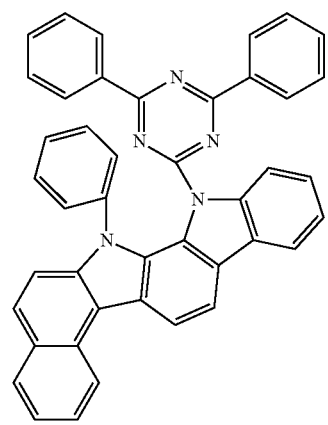
506
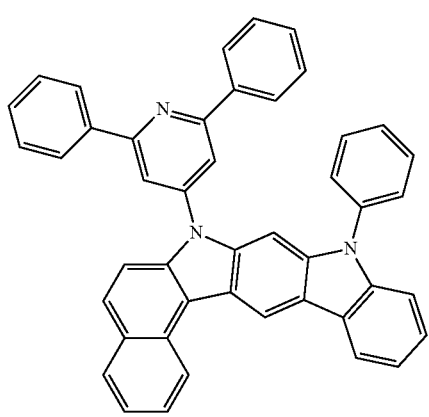
507
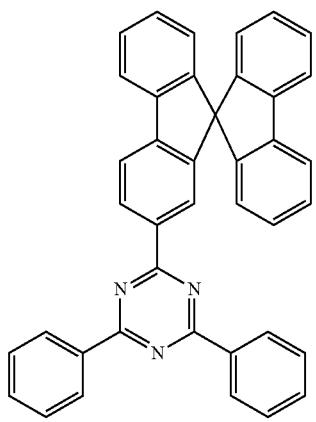
508
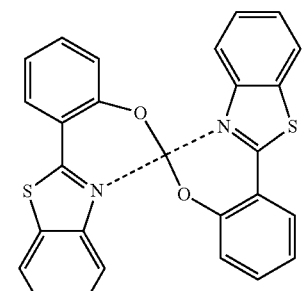
509
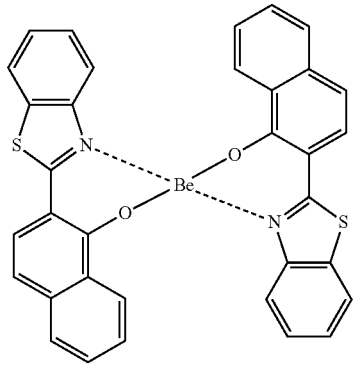
In some embodiments, an anthracene-based compound represented by Formula 400 below may be used as the host.
Formula 400
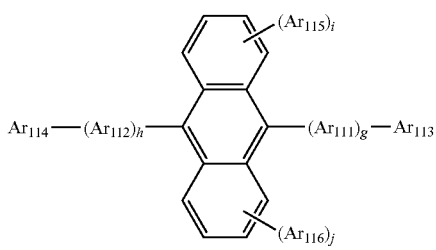
In Formula 400, $Ar_{111}$ and $Ar_{112}$ may be each independently a substituted or unsubstituted $C_5$-$C_{60}$ arylene group; $Ar_{113}$ to $Ar_{116}$ may be each independently a substituted or unsubstituted $C_1$-$C_{10}$ alkyl group, or a substituted or unsubstituted $C_5$-$C_{60}$ aryl group; and g, h, i, and j may be each independently an integer from 0 to 4.

In some embodiments, $Ar_{111}$ and $Ar_{112}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, and an anthryl group.

In Formula 400 above, g, h, i, and j may be each independently 0, 1, or 2.

In some embodiments, $Ar_{113}$ to $Ar_{116}$ in Formula 400 may be each independently one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of deuterium, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

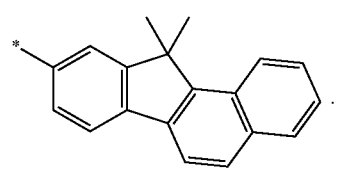 [SMILES: *c1ccc2c(c1)C(C)(C)c1c-2ccc2ccccc12]

For example, the anthracene-based compound of Formula 400 above may be one of the compounds represented by the following formulae, but is not limited thereto:

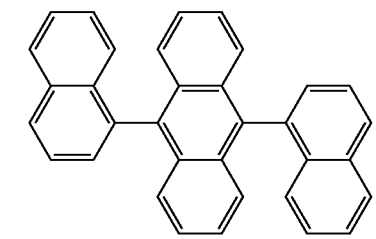

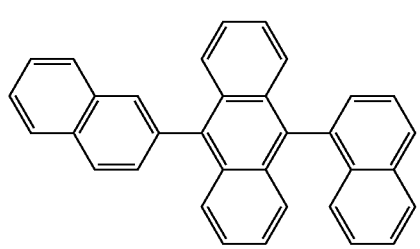

-continued

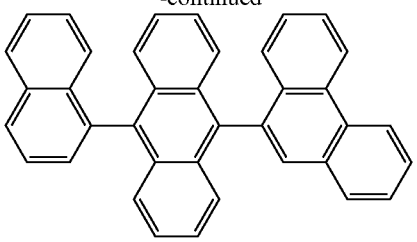

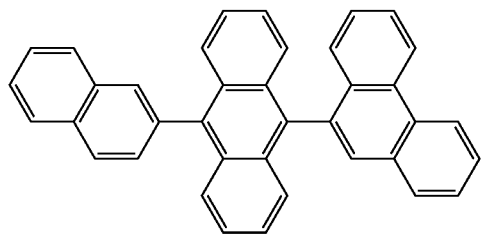

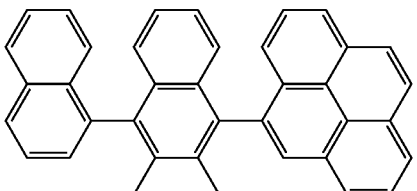

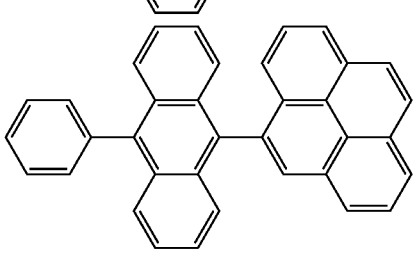

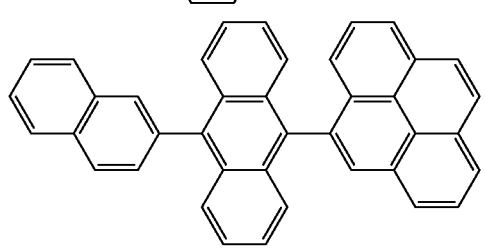

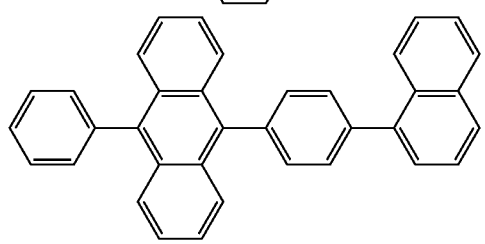

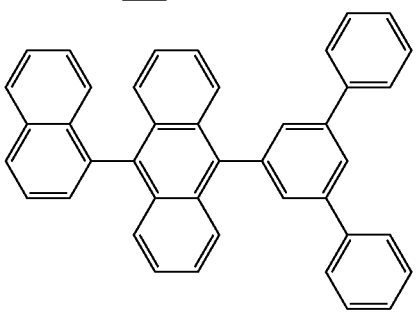

53
-continued
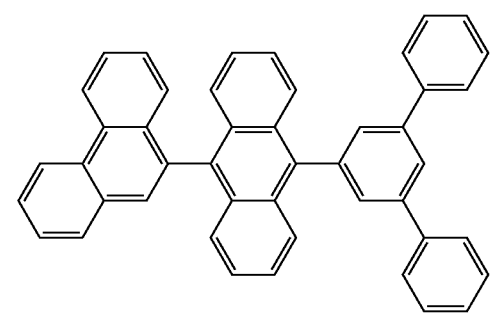
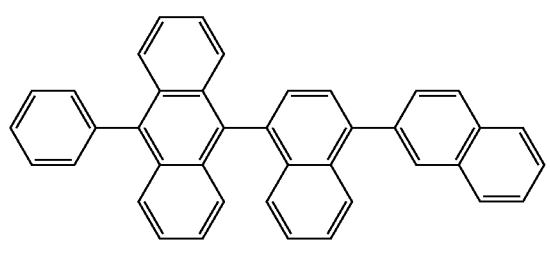
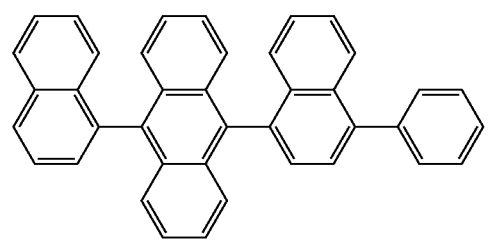
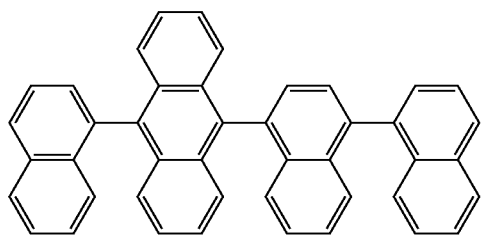
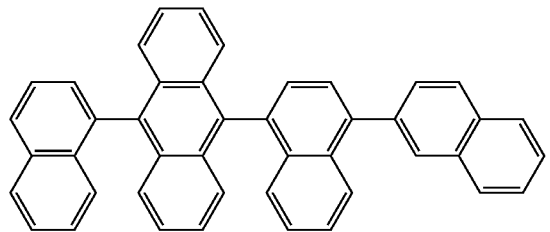
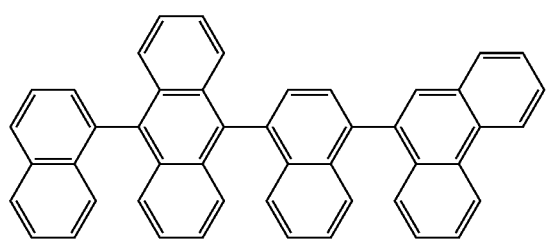
54
-continued
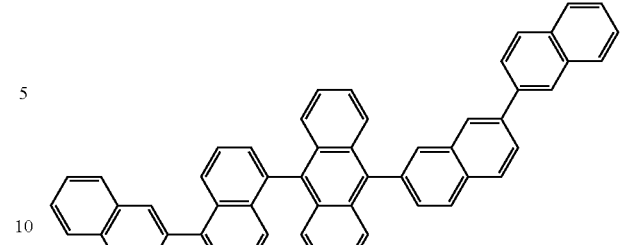
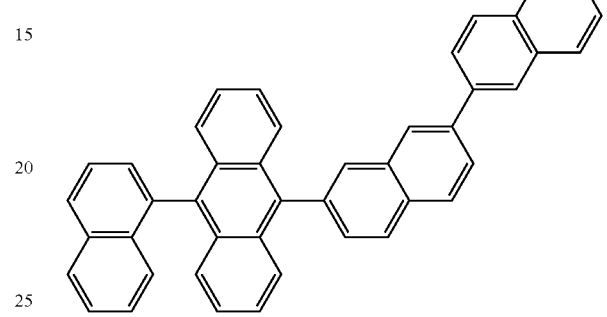
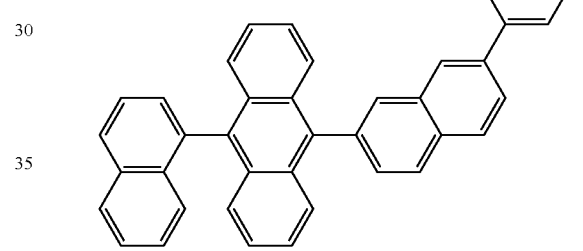
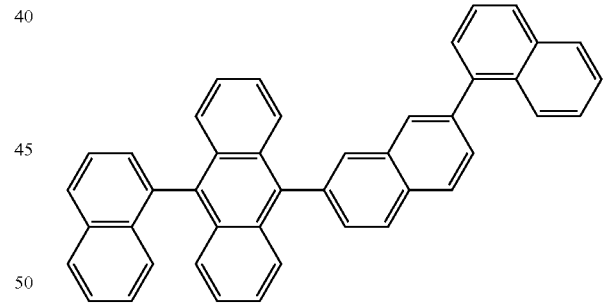
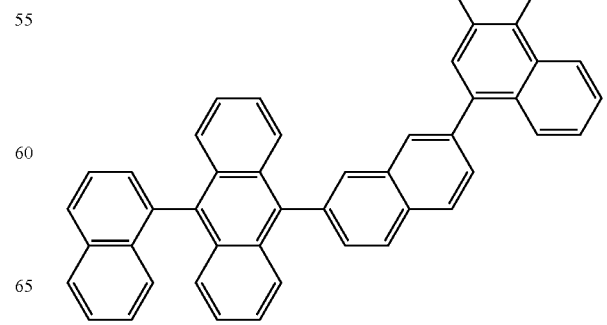

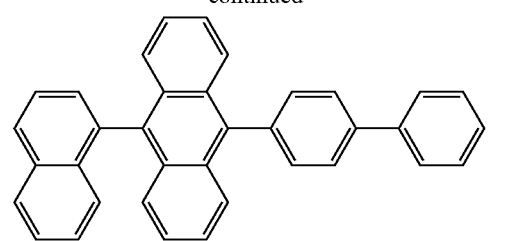

-continued

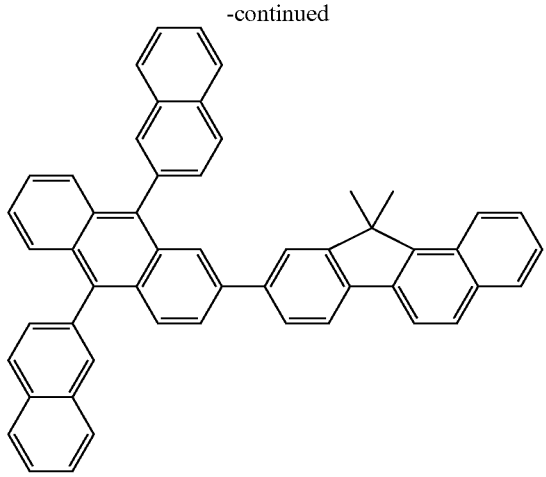

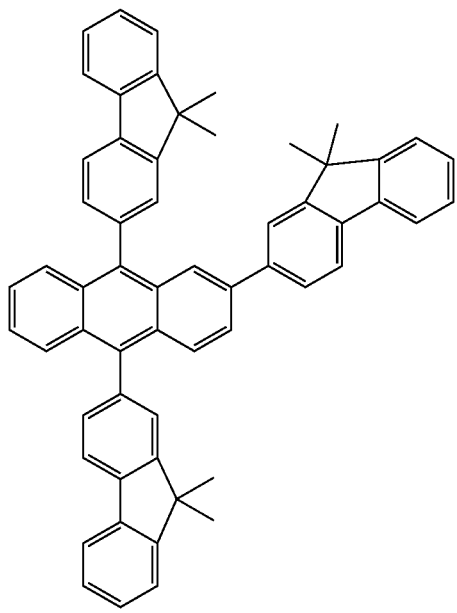

-continued

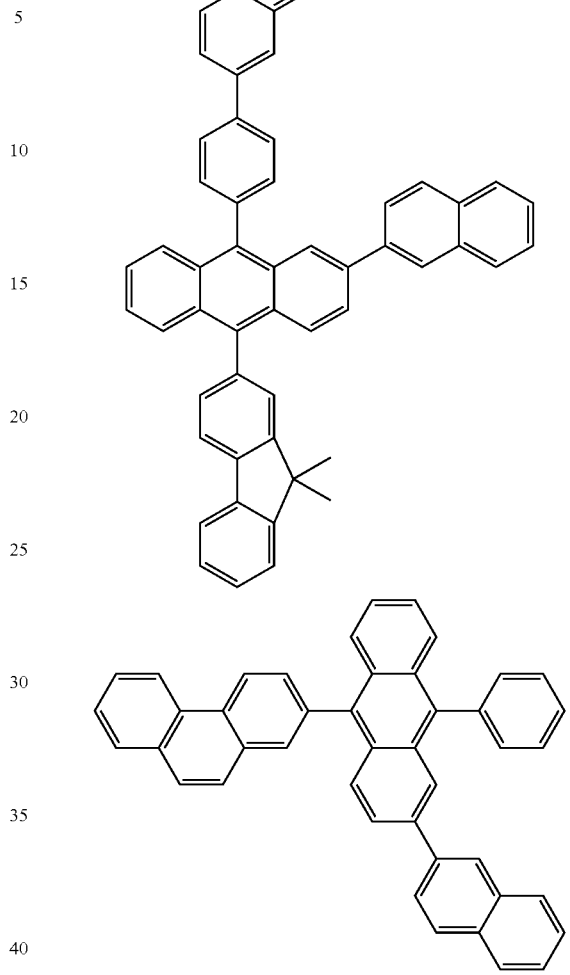

In some embodiments, an anthracene-based compound represented by Formula 401 below may be used as the host.

Formula 401

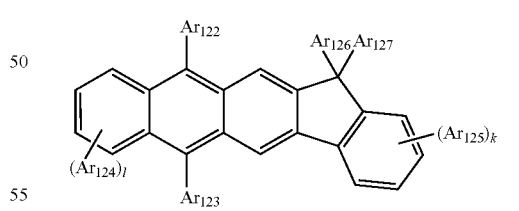

$Ar_{122}$ to $Ar_{125}$ in Formula 401 above may be defined as described above in conjunction with $Ar_{113}$ of Formula 400, and thus detailed descriptions thereof will not be provided here.

$Ar_{126}$ and $Ar_{127}$ in Formula 401 above may be each independently a $C_1$-$C_{10}$ alkyl group, for example, a methyl group, an ethyl group, or a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto:

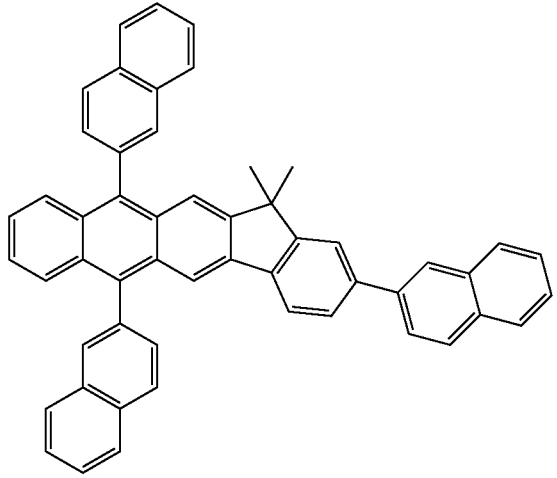

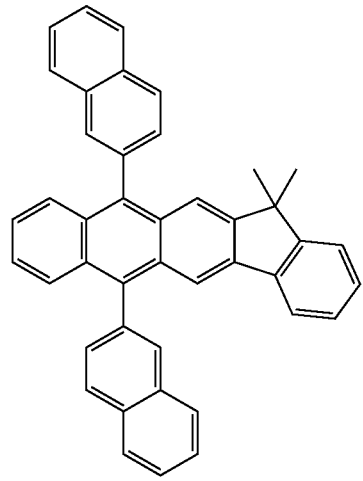

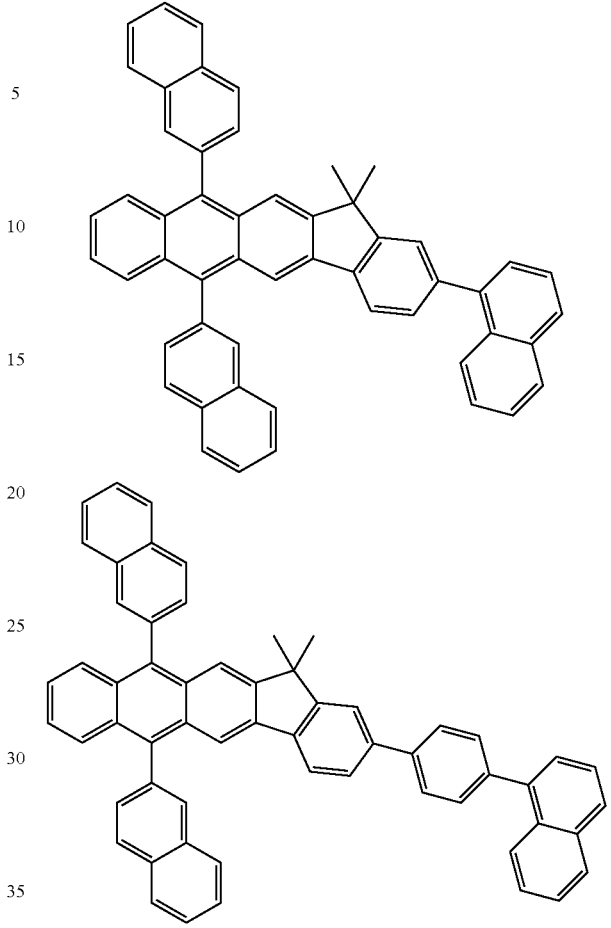

When the organic light-emitting device is a full color organic light-emitting device, the emission layer may be patterned into a red emission layer, a green emission layer, and a blue emission layer.

At least one of the red EML, the green EML, and the blue EML may include a dopant below (ppy=phenylpyridine).

The compound of Formula 2 in the present invention, or the well-known compounds represented by the formulae below may be used as blue dopants, but not limited thereto.

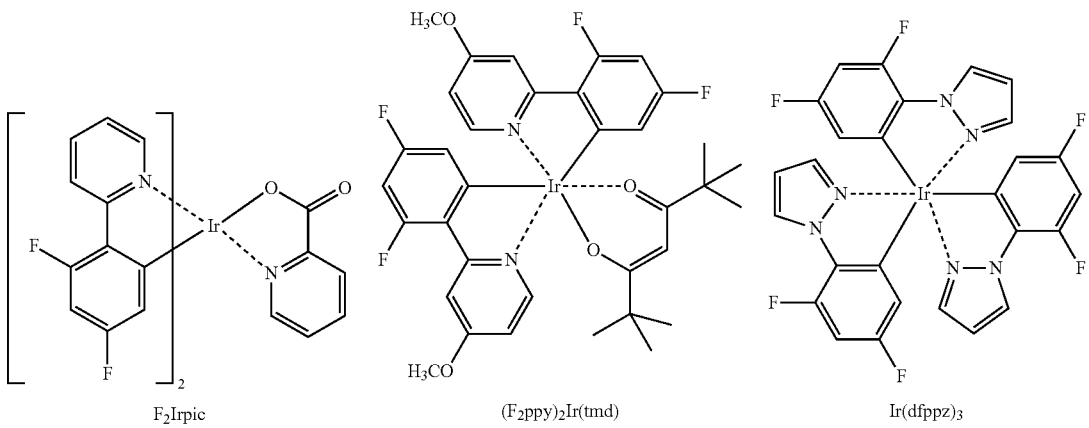

F₂Irpic     (F₂ppy)₂Ir(tmd)     Ir(dfppz)₃

-continued
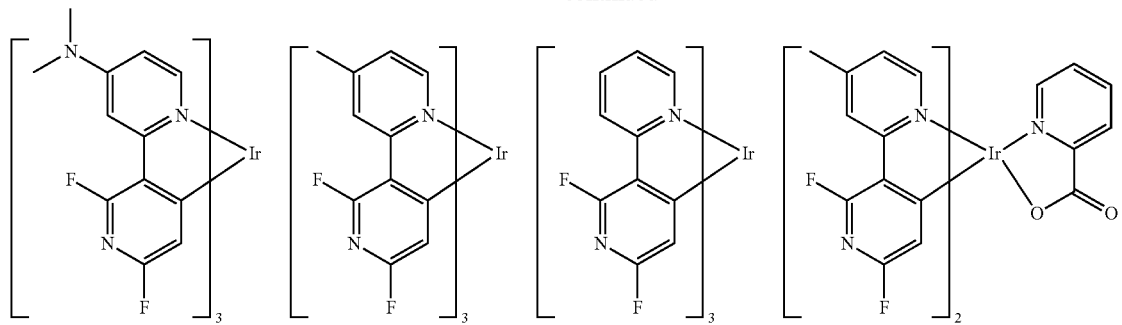
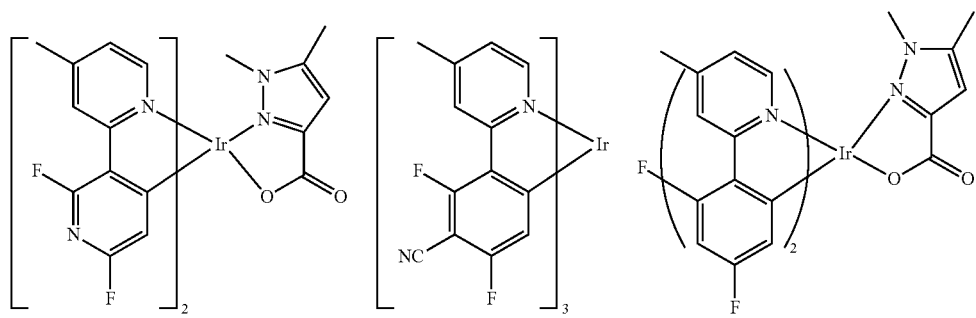
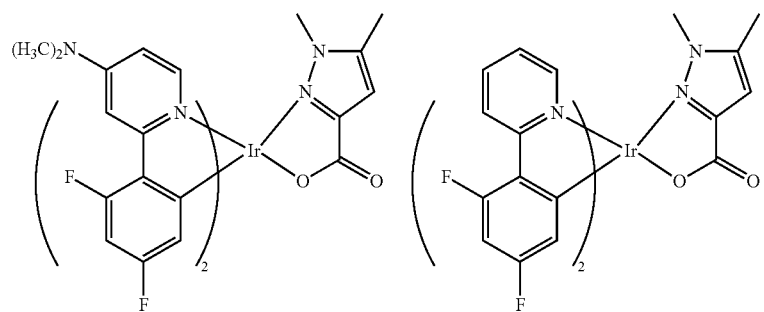
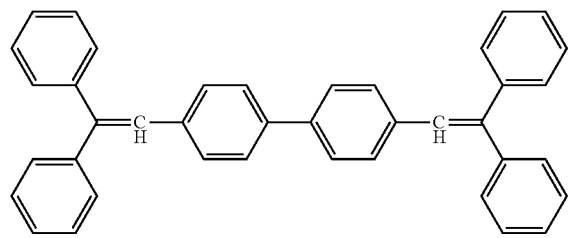
DPVBi
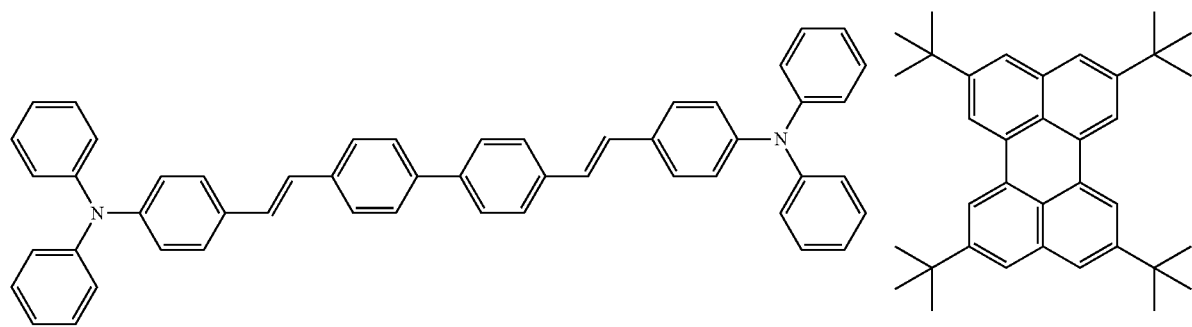
DPAVBi
TBPe Non-limiting examples of the red dopant may be compounds represented by the following formulae.
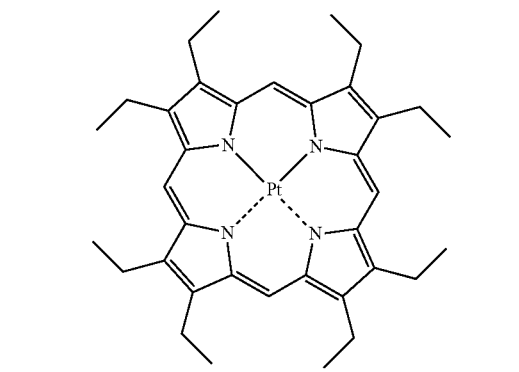
PtOEP
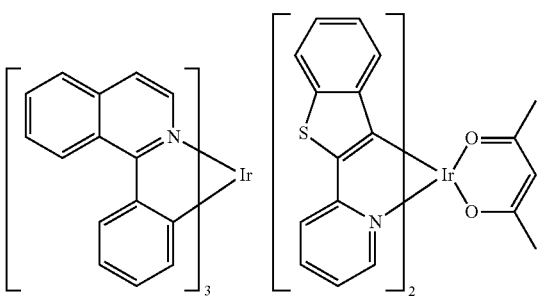
Ir(piq)₃        Btp₂Ir(acac)
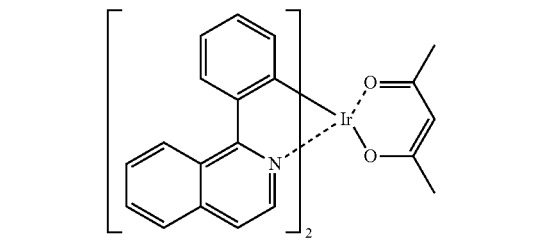
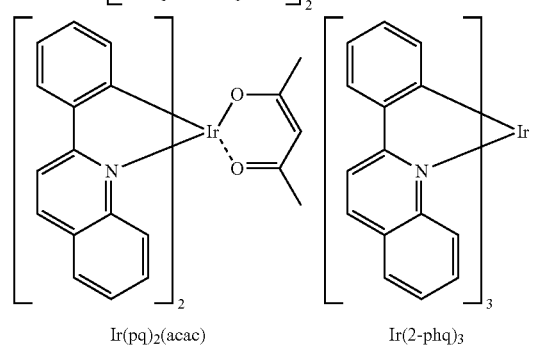
Ir(pq)₂(acac)        Ir(2-phq)₃
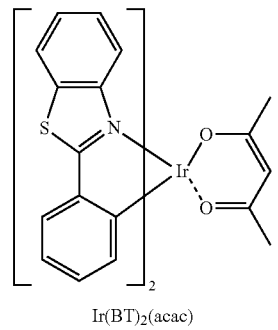
Ir(BT)₂(acac)
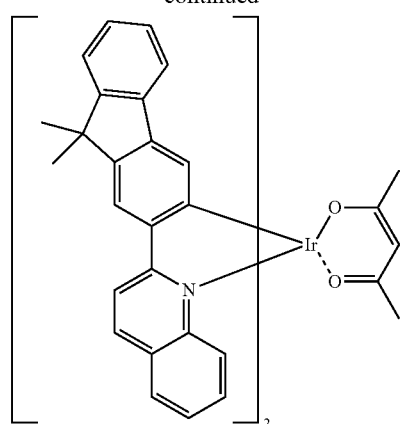
Ir(flq)₂(acac)
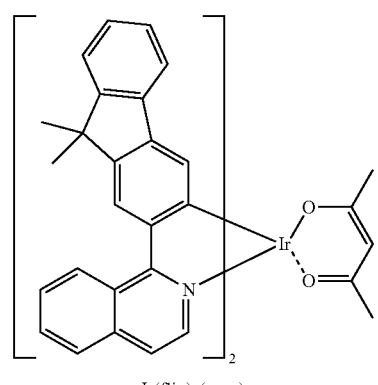
Ir(fliq)₂(acac)
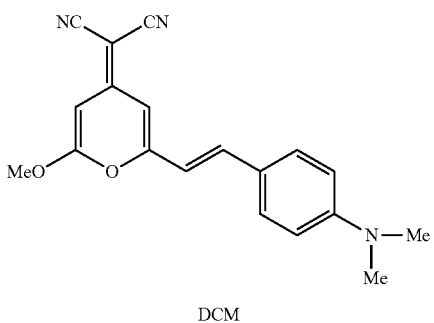
DCM
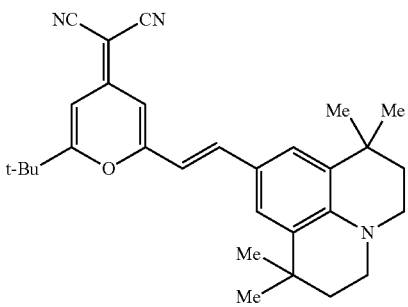
DCJTB
Non-limiting examples of the green dopant may be compounds represented by the following formula.

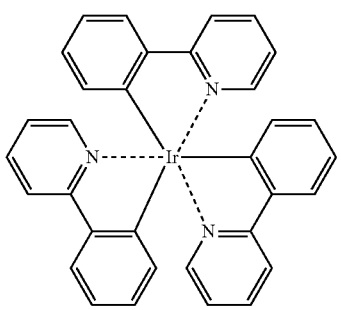
Ir(ppy)₃
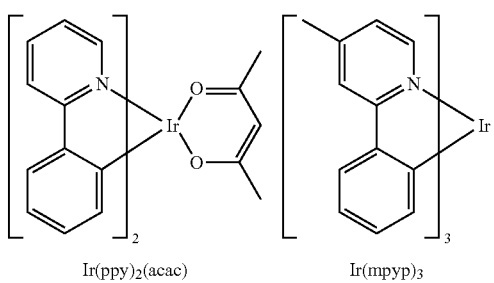
Ir(ppy)₂(acac)   Ir(mpyp)₃
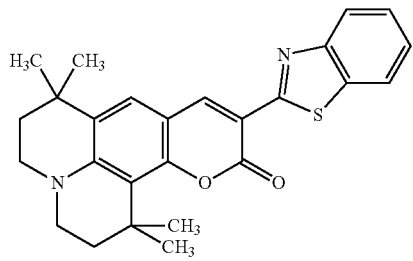
C545T
Non-limiting examples of the dopant that may be used in the EML may be Pd complexes or Pt complexes represented by the following formulae.
D1
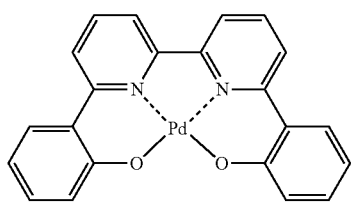
D2
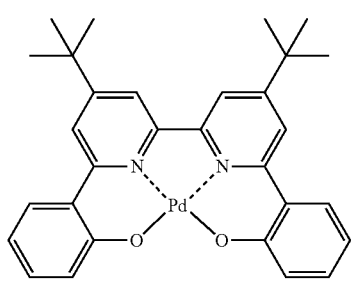
D3
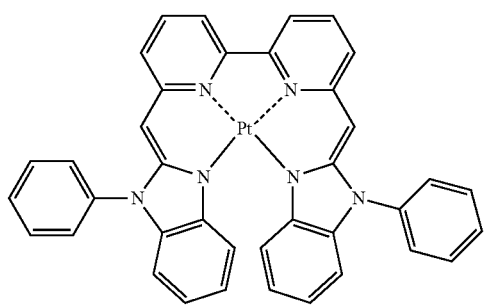
D4
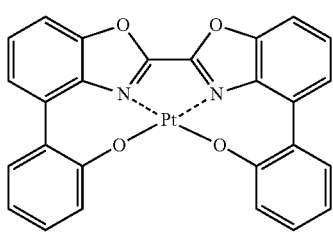
D5
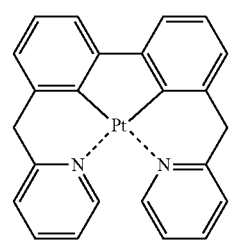
D6
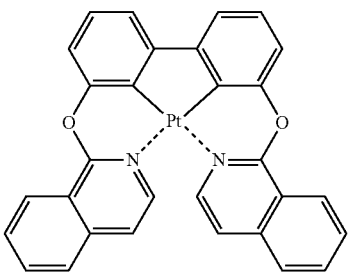
D7
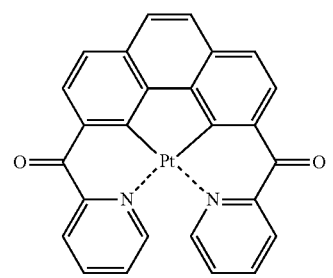
D8
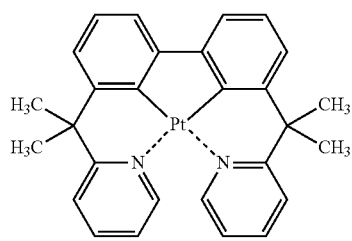

-continued
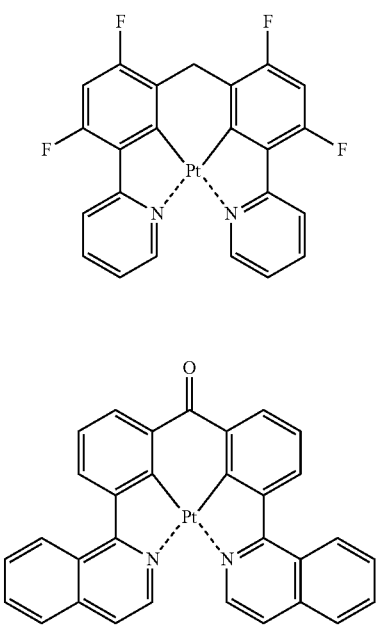
D9
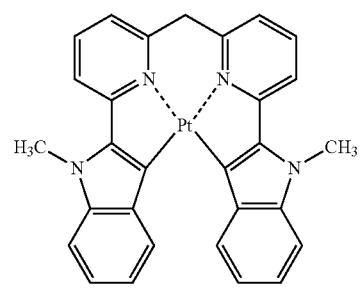
D10
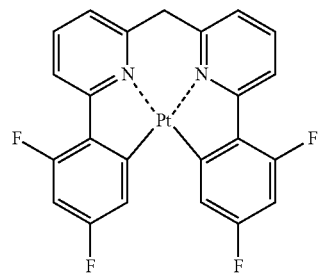
D11
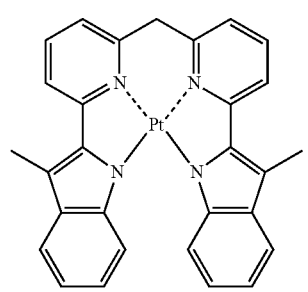
D12
D13
-continued
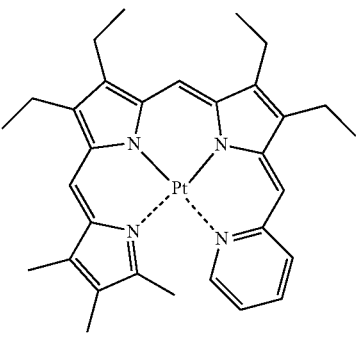
D14
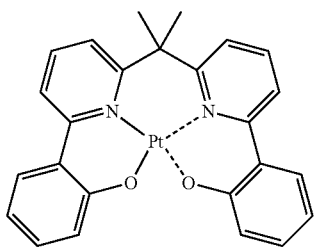
D15
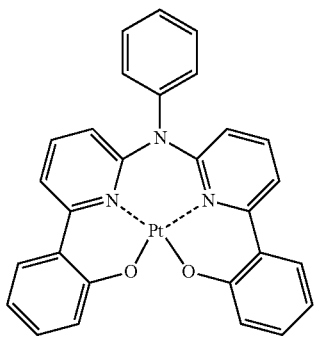
D16
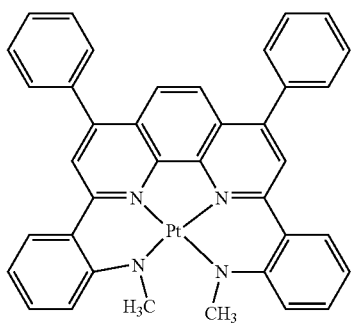
D17
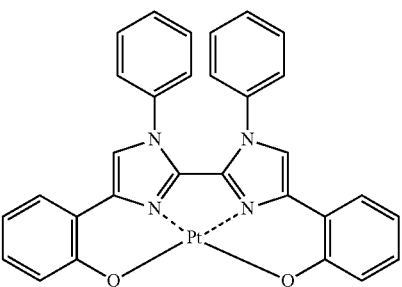
D18

-continued
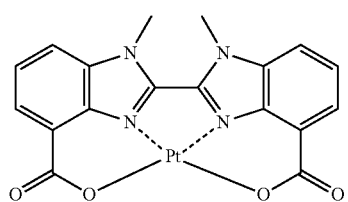
D19
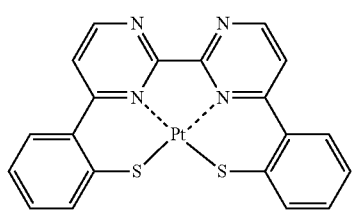
D20
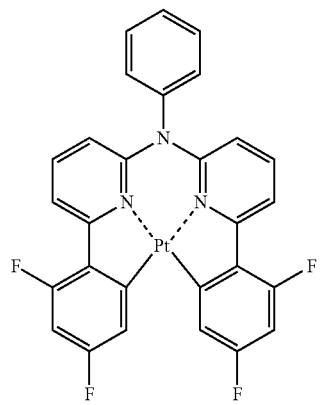
D21
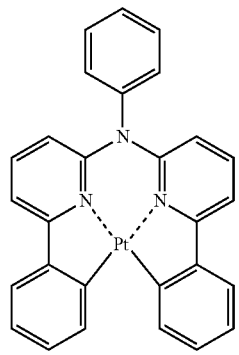
D22
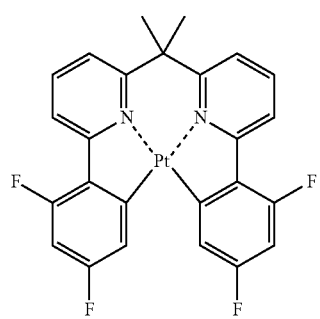
D23
-continued
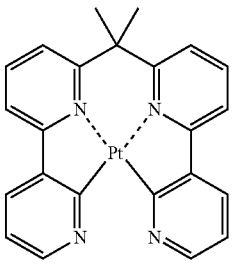
D24
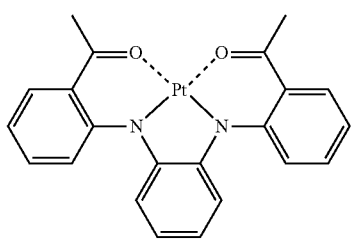
D25
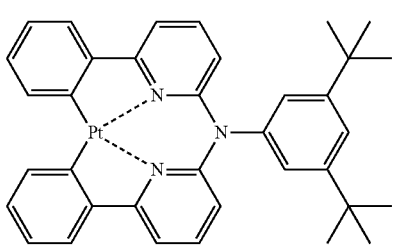
D26
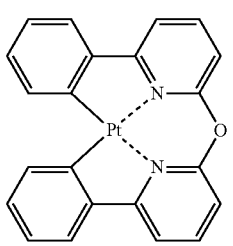
D27
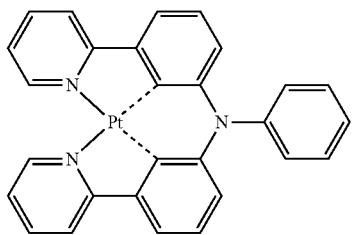
D28
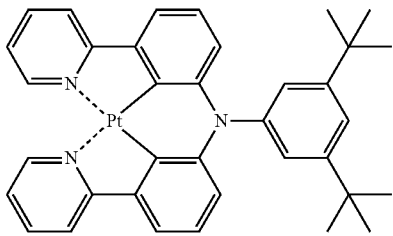
D29

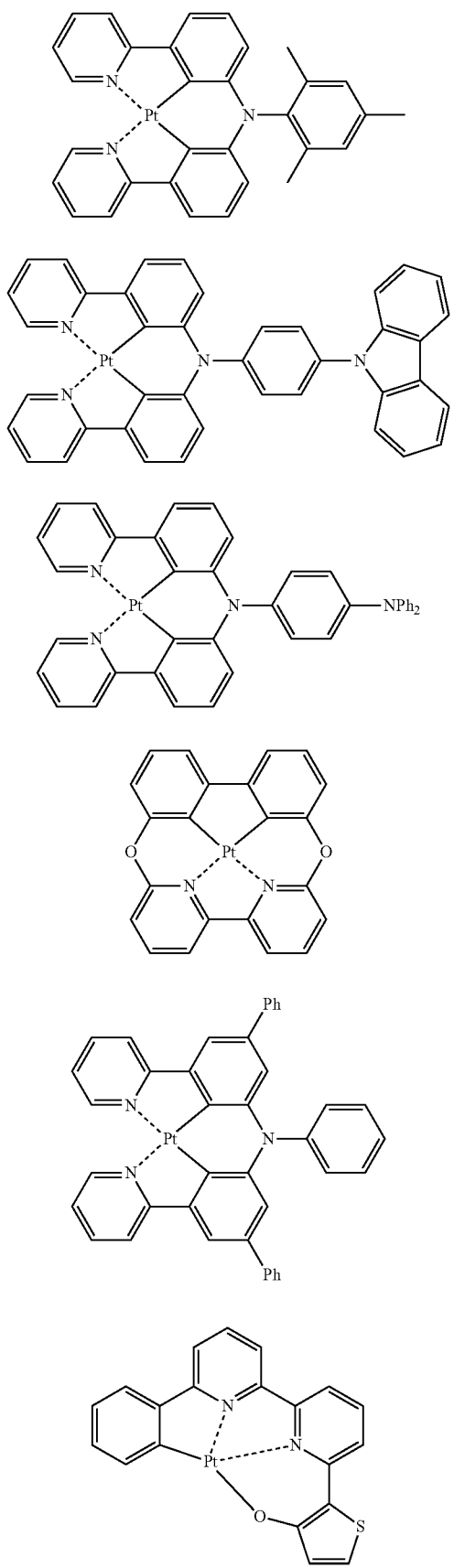
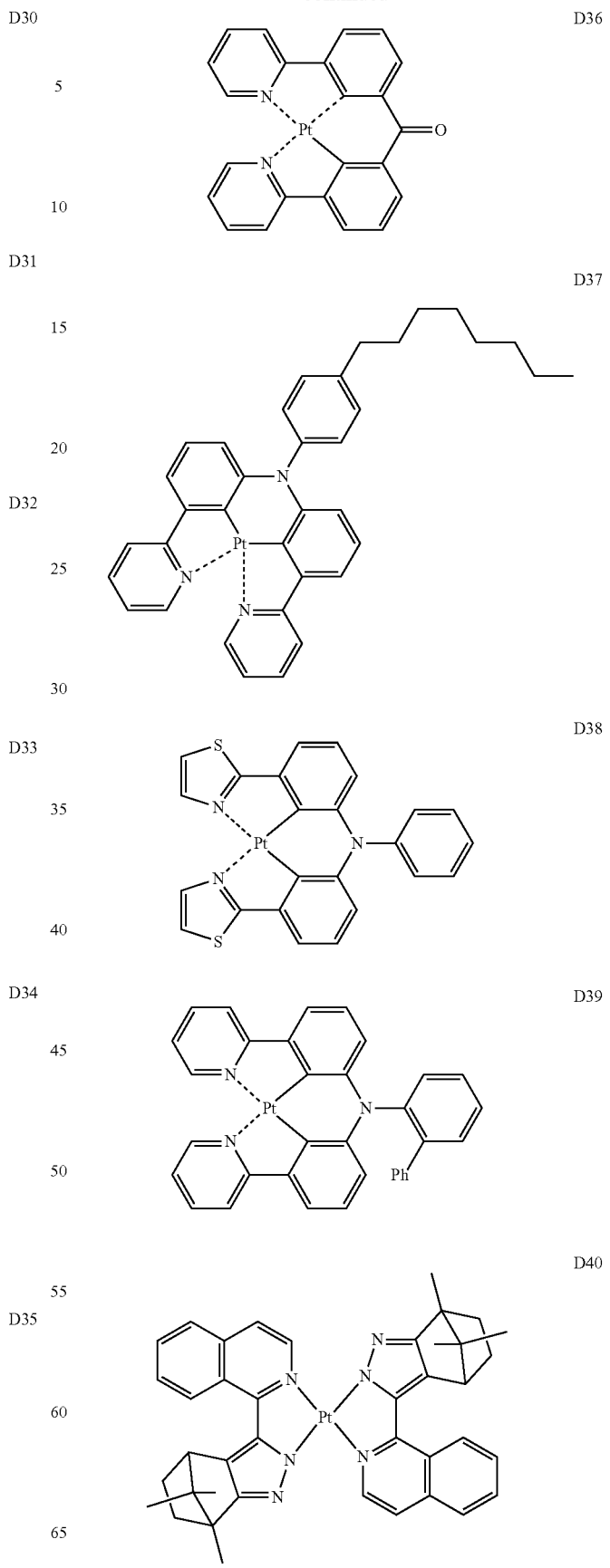

-continued
D41
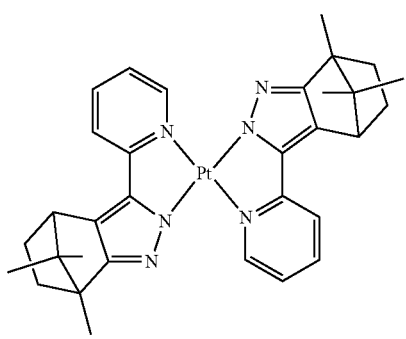
D42
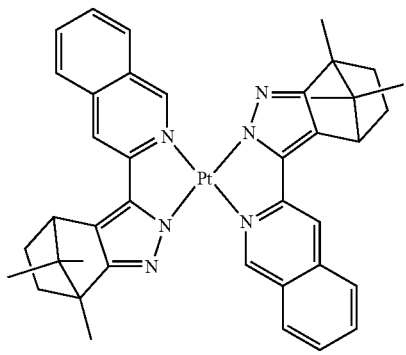
D43
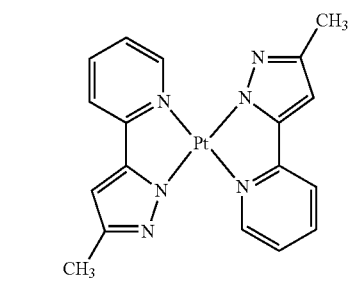
D44
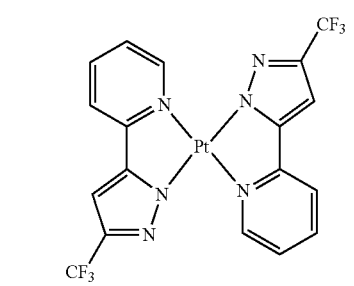
D45
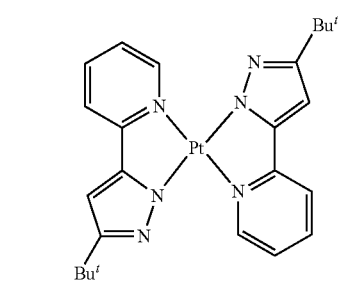
-continued
D46
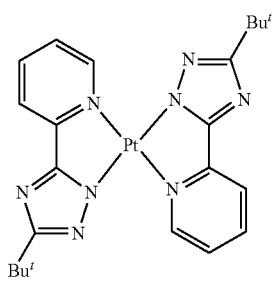
D47
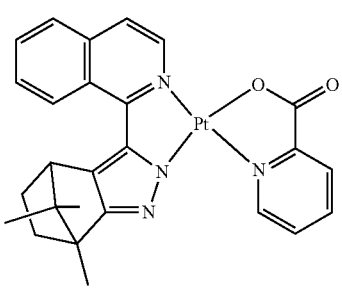
D48
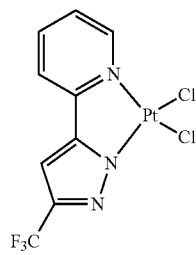
D49
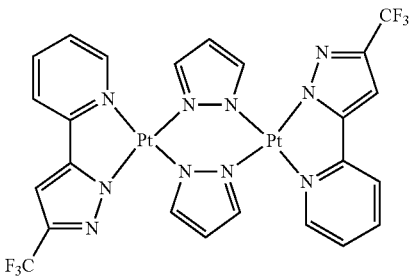
D50
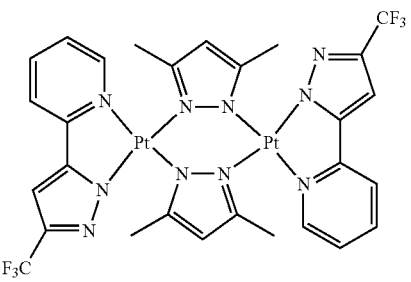
Non-limiting examples of the dopant that may be used in the EML may be Os complexes represented by the following formulae, in addition to the compound of Formula 2 above.

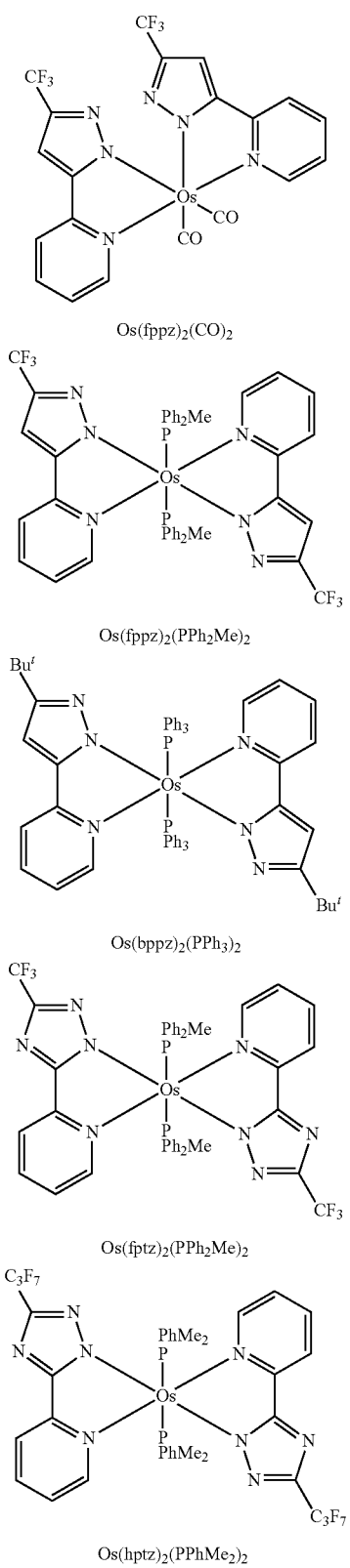

Os(fppz)₂(CO)₂

Os(fppz)₂(PPh₂Me)₂

Os(bppz)₂(PPh₃)₂

Os(fptz)₂(PPh₂Me)₂

Os(hptz)₂(PPhMe₂)₂

When the EML includes both a host and a dopant, the amount of the dopant may be from about 0.01 to about 15 parts by weight based on 100 parts by weight of the host. However, the amount of the dopant is not limited to this range.

The thickness of the EML may be from about 100 Å to about 1000 Å, and in some embodiments, from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like.

When the ETL is formed using vacuum deposition or spin coating, the vacuum deposition and spin coating conditions may be similar to those for the formation of the HIL, though the vacuum deposition and spin coating conditions may vary according to a compound that is used to form the ETL.

A material for forming the ETL may be the compound of Formula 1 above or any known material that can stably transport electrons injected from an electron injecting electrode (cathode).

Non-limiting examples of materials for forming the ETL may be a quinoline derivative, such as tris(8-quinolinorate) aluminum (Alq3), TAZ, BAlq, beryllium bis(benzoquinolin-10-olate (Bebq₂), 9,10-di(naphthalene-2-yl)anthracene (ADN). Compound 201, and Compound 202, but are not limited thereto.

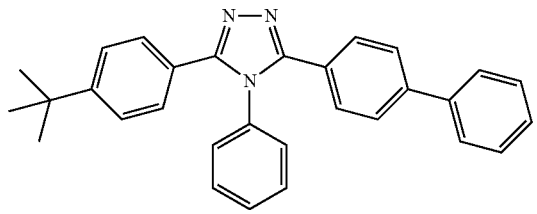

TAZ

BAlq

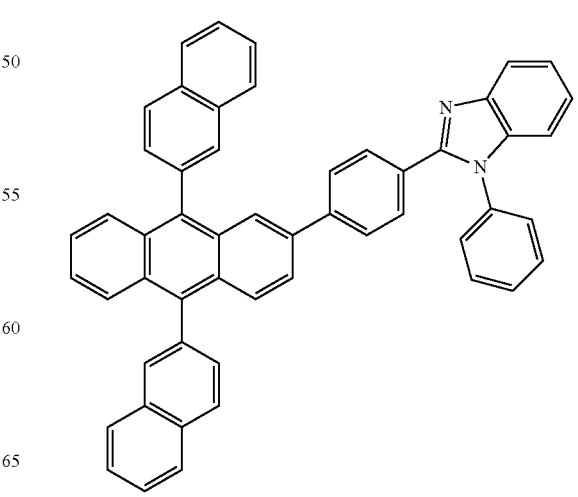

Compound 201

Compound 202

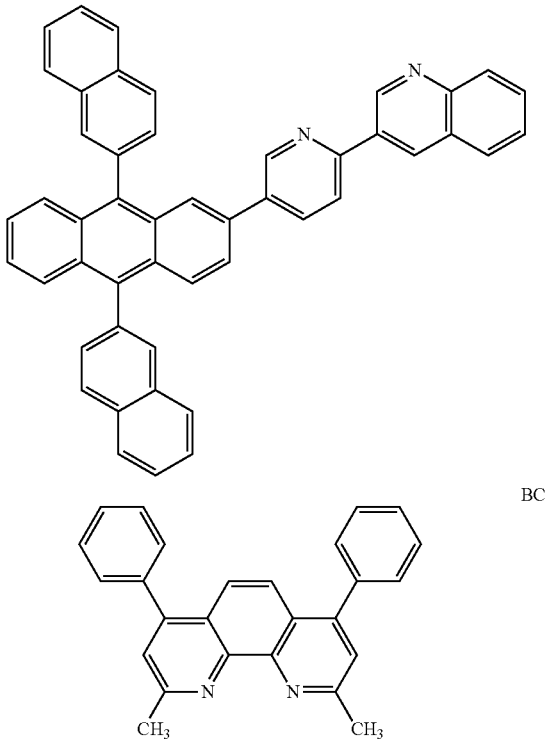

The thickness of the ETL may be from about 100 Å to about 1000 Å, and in some embodiments, from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to any known electron-transporting organic compound.

The metal-containing material may include a lithium (Li) complex.

Non-limiting examples of the Li complex may be lithium quinolate (LiQ) and Compound 203 below:

Compound 203

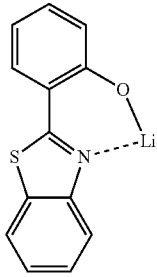

Then, an EIL, which facilitates injection of electrons from the cathode, may be formed on the ETL. Any suitable electron-injecting material may be used to form the EIL.

Non-limiting examples of materials for forming the EIL may be LiF, NaCl, CsF, $Li_2O$, and BaO, which are known in the art.

The deposition and coating conditions for forming the EIL may be similar to those for the formation of the HIL, though the deposition and coating conditions may vary according to the material that is used to form the EIL.

The thickness of the EIL may be from about 1 Å to about 100 Å, and in some embodiments, from about 3 Å to about 90 Å. When the thickness of the EIL is within these ranges, the EIL may have satisfactory electron injection ability without a substantial increase in driving voltage.

Finally, the second electrode is disposed on the organic layer.

The second electrode may be a cathode that is an electron injection electrode. A material for forming the second electrode may be a metal, an alloy, an electro-conductive compound, which have a low work function, or a mixture thereof.

In this regard, the second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode.

In some embodiments, to manufacture a top-emission light-emitting device, the transmission electrode may be formed of indium tin oxide (ITO) or indium zinc oxide (IZO).

Although the organic light-emitting device of FIG. 1 is described above, the present invention is not limited thereto.

When a phosphorescent dopant is used in the EML, a hole-blocking layer (HBL) may be formed between the ETL and the EML or between the E-functional layer and the EML by using vacuum deposition, spin coating, casting, Langmuir-Blodgett (LB) deposition, or the like, in order to prevent diffusion of triplet excitons or holes into the ETL.

When the HBL is formed using vacuum deposition or spin coating, the vacuum conditions for deposition and spin coating may be similar to those for the formation of the HIL, although the conditions for deposition and coating may vary according to the material that is used to form the HBL.

Any known hole-blocking material may be used. Non-limiting examples of hole-blocking materials may be oxadiazole derivatives, triazole derivatives, and phenanthroline derivatives.

For example, bathocuproine (BCP) represented by the following formula may be used as a material for forming the HBL.

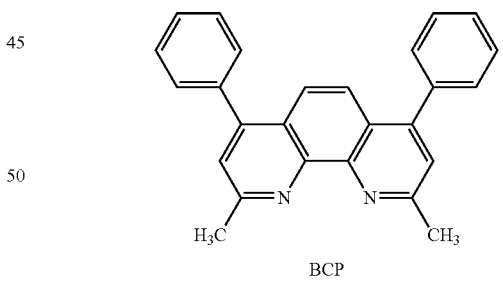

BCP

The thickness of the HBL may be from about 20 Å to about 1000 Å, and in some embodiments, from about 30 Å to about 300 Å. When the thickness of the HBL is within these ranges, the HBL may have improved hole blocking ability without a substantial increase in driving voltage.

According to embodiments of the present invention, the organic light-emitting device may be included in various types of flat panel display devices, such as in a passive matrix organic light-emitting display device or in an active matrix organic light-emitting display device.

In particular, when the organic light-emitting device is included in an active matrix organic light-emitting display device including a thin-film transistor, the first electrode on the substrate may function as a pixel electrode, electrically connected to a source electrode or a drain electrode of the thin-film transistor.

Moreover, the organic light-emitting device may also be included in flat panel display devices having double-sided screens.

In some embodiments, the organic layer of the organic light-emitting device may be formed of the compounds of the Formula 1 and the Formula 2 by using a deposition method or may be formed using a wet method of coating a solution of the compounds of the Formula 1 and the Formula 2.

Hereinafter, the present invention will be described in detail with reference to the following synthesis examples and other examples. However, these examples are for illustrative purposes only and are not intended to limit the scope of the present invention.

SYNTHESIS EXAMPLES

Synthesis Example 1

Synthesis of Compound 1

Synthesis of Compound 1-1

[Reaction Scheme 1-1]

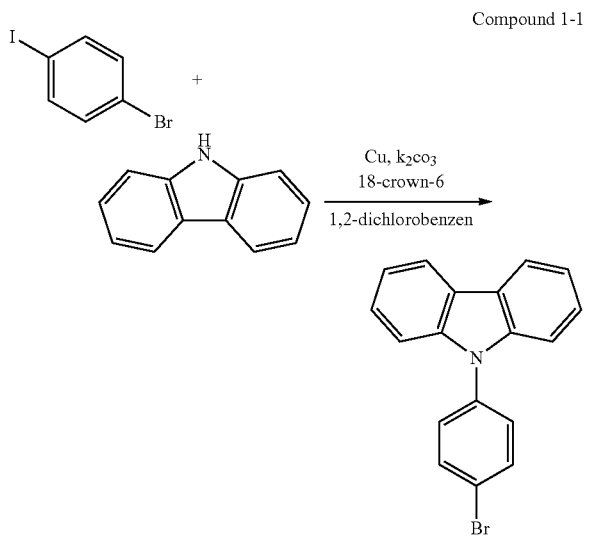

Compound 1-1

After 0.5 g (2.99 mmol) of carbazole, 0.38 g (5.98 mmol) of copper powder, 1.65 g (11.96 mmol) of $K_2CO_3$, and 0.79 g (2.99 mmol) 18-Crown-6 were put into a reaction vessel and dried in a vacuum, the reaction vessel was filled with nitrogen gas. 1.0 g (3.58 mmol) of 1-bromo-4-iodobenzene and 10 mL of 1,2-dichlorobenzene were added thereto, and then heated at about 120° C. for 12 hours. After termination of the reaction, the copper powder was removed through a celite filter using dichloromethane, and then subjected to vacuum distillation to remove 1,2-dichlorobenzene. The rest of the mixture was extracted with distilled water and dichloromethane to collect an organic layer, which was then dried using magnesium sulfate, filtered, and evaporated to remove the solvent. The resulting product was obtained by column chromatography as 58 g of Compound 1-1 (Yield=57%).

[Reaction Scheme 1-2]

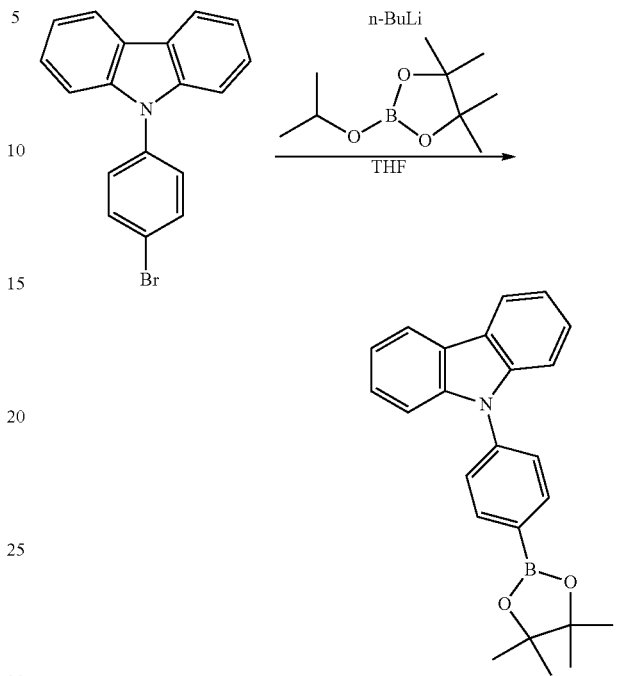

Compound 1-2

After 1.5 g (4.64 mmol) of Compound 1-1 was put into a reaction vessel and dried in a vacuum, the reaction vessel was filled with nitrogen gas. 30 mL of THF was added thereto, followed by cooling to about −78° C. 4.3 mL (6.98 mmol) of n-BuLi (1.6M) was slowly dropwise added thereto after 10 minutes, followed by, after 30 minutes, adding 1.43 mL (6.98 mmol) of 2-isopropoxy-4,4,5,5,-tetramethyl-1,3,2-dioxaborolane thereto. After 1 hour, the temperature was increased to room temperature, and the reaction mixture was stirred for 1 hours. After termination of the reaction, the reaction product was washed with distilled water, and then extracted with ethyl acetate to collect an organic layer, which was then dried using magnesium sulfate, filtered, and evaporated to remove the solvent. The resulting product was obtained by column chromatography as 1.03 g of Compound 1-2 (Yield=60%).

[Reaction Scheme 1-3]

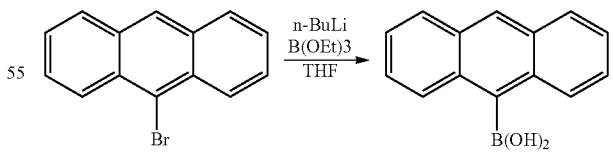

Compound 1-3

3.0 g (11.66 mmol) of 9-bromoanthracen acid was put into a reaction vessel and dried in a vacuum, the reaction vessel was filled with nitrogen gas. 110 mL of THF was added thereto, followed by cooling to about −78° C. 10.94 ml (17.50 mmol) of n-BuLi (1.6 M) was slowly dropwise added thereto after 10 minutes, followed by, after 30 minutes, adding 3.55 mL (21.00 mmol) of triethylbrorate. After 1 hour, the temperature was increased to room temperature, and the reaction mixture was stirred for 1 hours. After termination of the reaction, the reaction product was subject to a pH adjustment with 2M HCl, washed with distilled water, and then extracted with ethyl acetate to collect an organic layer, which was then dried using magnesium sulfate, filtered, and evaporated to remove the solvent, followed by recrystallization with dichloromethane and hexane to obtain 33.0 g of Compound 1-3 (Yield=90%).

[Reaction Scheme 1-4]

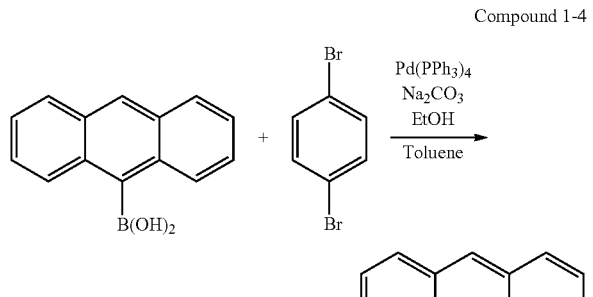

After 3.00 g (13.50 mmol) of Compound 1-3, 3.50 g (14.80 mmol) of 1,4-dibromobenzene, and 624 mg (0.54 mmol) tetrakis(triphenylphosphine)palladium(0) were put into a reaction vessel and dried in a vacuum, the reaction vessel was filled with nitrogen gas. The mixture in the reaction vessel was dissolved with 60 mL of toluene, followed by adding 33 mL of ethanol and 33.0 mL (67.5 mmol) of a 2.0M sodium carbonate aqueous solution to obtain a reaction mixture, which was then stirred under reflux at about 120° C. for 3 hours. After termination of the reaction, the reaction product was washed with distilled water and then extracted with ethyl acetate to collect an organic layer, which was then dried using magnesium sulfate, filtered, and evaporated to remove the solvent. The resulting product was obtained by column chromatography as 2.69 g of Compound 1-4 (Yield=60%).

[Reaction Scheme 1-5]

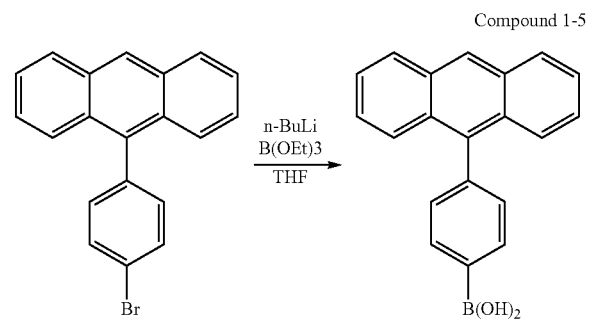

2.69 g (8.07 mmol) of Compound 1-4 was put into a reaction vessel and dried in a vacuum, the reaction vessel was filled with nitrogen gas. 75.0 mL of THF was added thereto, followed by cooling to about −78° C. 7.57 mL (12.10 mmol) of n-BuLi (1.6 M) was slowly dropwise added thereto after 10 minutes, followed by, after 30 minutes, adding 2.05 mL (12.10 mmol) of triethylbrorate. After 1 hour, the temperature was increased to room temperature, and the reaction mixture was stirred for 1 hours. After termination of the reaction, the reaction product was subject to a pH adjustment with 2M HCl, washed with distilled water, and then extracted with ethyl acetate to collect an organic layer, which was then dried using magnesium sulfate, filtered, and evaporated to remove the solvent, followed by recrystallization with dichloromethane and hexane to obtain 10 g of Compound 1-5 (Yield=87%).

[Reaction Scheme 1-6]

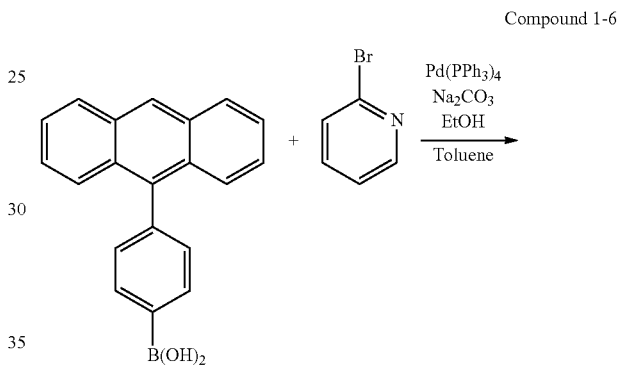

After 1.00 g (3.35 mmol) of Compound 1-5 and 155.0 mg (0.13 mmol) of tetrakis(triphenylphosphine)palladium(0) were put into a reaction vessel and dried in a vacuum, the reaction vessel was filled with nitrogen gas. The mixture in the reaction vessel was dissolved with 0.48 mL (5.03 mmol) of 2-bromopyridine and 34 mL of toluene, followed by adding 17 mL of ethanol and 17 mL (33.54 mmol) of a 2.0 M sodium carbonate aqueous solution to obtain a reaction mixture, which was then stirred under reflux at about 120° C. for 3 hours. After termination of the reaction, the reaction product was washed with distilled water and then extracted with ethyl acetate to collect an organic layer, which was then dried using magnesium sulfate, filtered, and evaporated to remove the solvent. The resulting product was obtained by column chromatography as 1.48 g of Compound 1-6 (Yield=66%).

[Reaction Scheme 1-7]

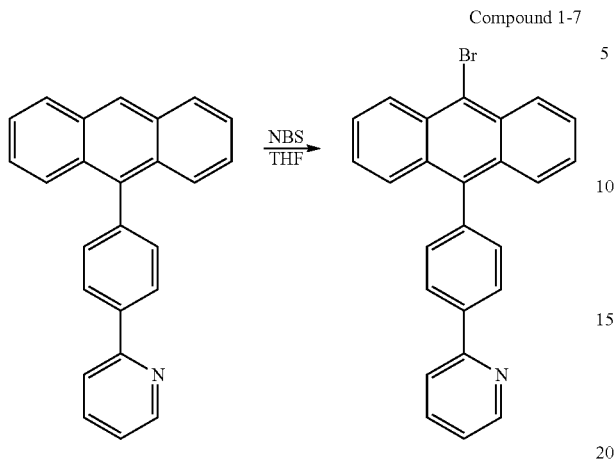

After 1.48 g (4.22 mmol) of Compound 1-6 and 1.18 g (6.64 mmol) of N-bromosuccinimide were put into a reaction vessel and dried in a vacuum, the reaction vessel was filled with nitrogen gas. 40 mL of THF was added thereto, followed by stirring at room temperature for about 3 hours. After termination of the reaction, the reaction product was washed with distilled water and extracted with ethyl acetate to collect an organic layer, which was then dried using magnesium sulfate, filtered, and evaporated to remove the solvent, followed by recrystallization with dichloromethane and hexane to obtain 1.43 g of Compound 1-7 (Yield=88%).

[Reaction Scheme 1]

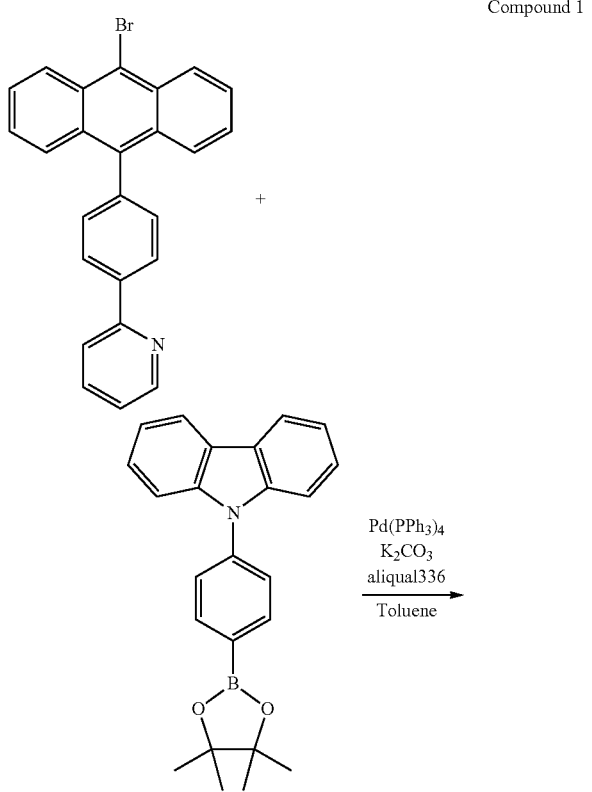

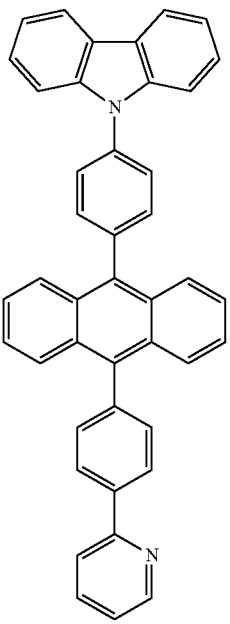

After 0.70 g (1.70 mmol) of Compound 1-7, 0.75 g (2.04 mmol) of Compound 1-3, and 79.0 mg (0.07 mmol) of tetrakis(triphenylphosphine)palladium(0) were put into a reaction vessel and dried in a vacuum, the reaction vessel was filled with nitrogen gas. The mixture in the reaction vessel was dissolved with 17 mL of toluene, followed by adding Aliquat336 and 8.5 mL (17.00 mmol) of a 2.0 M potassium carbonate aqueous solution to obtain a reaction mixture, which was then stirred under reflux at about 120° C. for 3 hours. After termination of the reaction, the reaction product was filtered to obtain a solid, which was then dissolved with toluene, filtered using charcoal, and evaporated to remove the solvent. The resulting product was recrystallized using dichloromethane and ethanol to obtain 0.61 g of Compound 1 (Yield=62%).

1H NMR (300 MHz, CDCl3): δ (ppm) 8.82-8.79 (m, 1H), 8.26 (d, J=8.3 Hz, 2H), 8.22 (d, J=7.6 Hz, 2H), 7.93-7.81 (m, 8H), 7.74 (d. J=8.4 Hz, 2H), 7.69 (d. J=8.2 Hz, 2H), 7.65 (d, J=8.4 Hz, 2H), 7.53 (td, J=1.2, 7.6 Hz, 2H), 7.48-7.30 (m, 7H); 13C NMR (75 MHz, CDCl3): δ (ppm) 157.4, 150.1, 140.9, 139.9, 138.9, 138.3, 137.2, 137.1, 137.0, 136.3, 132.9, 131.9, 130.1, 130.0, 127.2, 127.1, 127.0, 126.9, 126.2, 125.5, 125.4, 123.7, 122.5, 120.8, 120.6, 120.4, 110.1; FT-IR (ATR, cm−1): 3033, 1515, 1451, 1229, 782, 751; MS (EI+, m/z): [M+]; HRMS (EI+, m/z): [M+] calcd for C43H28N2, 572.2252. found.

Synthesis Example 2

Synthesis of Compound 14

Compound 14 was synthesized in the same manner as in Synthesis Example 1, except that 1,3-dibromobenzene, instead of 1,4-dibromobenzene, was used (Yield=90%).

1H NMR (300 MHz, CDCl3): δ (ppm) 8.73-8.71 (m, 1H), 8.27 (dt, J=1.7, 6.4 Hz, 1H), 8.22 (d, J=7.7 Hz, 2H), 8.13 (t, J=1.6 Hz, 1H), 7.88-7.80 (m, 6H), 7.78-7.72 (m, 4H), 7.69 (d, J=8.2 Hz, 2H), 7.59 (dt, J=1.4, 6.2 Hz, 1H), 7.55-7.50 (m, 2H), 7.48-7.34 (m, 7H), 7.28-7.23 (m, 1H); 13C NMR (75 MHz, CDCl3): δ (ppm) 157.2, 149.8, 140.9, 139.7, 139.5, 138.2, 137.4, 137.1, 136.9, 136.2, 132.9, 132.8, 131.9, 130.1, 130.0, 129.9, 129.1, 127.3, 126.9, 126.8, 126.3, 126.1, 125.5, 125.3, 123.6, 122.4, 120.8, 120.5, 120.2, 110.1; FT-IR (ATR, cm−1): 3043, 1517, 1452, 1231, 772, 750; MS (EI+, m/z): [M+]; HRMS (EI+, m/z): [M+] calcd for C43H28N2, 572.2252. found.

Synthesis Example 3

Synthesis of Compound 15

Compound 15 was synthesized in the same manner as in Synthesis Example 1, except that 1-bromo-3-iodobenzene, instead of 1-bromo-4-iodobenzene, was used (Yield=83%).

1H NMR (300 MHz, CDCl3): δ (ppm) 8.80-8.78 (m, 1H), 8.24 (t, J=6.8 Hz, 2H), 8.15 (dd, J=0.6, 7.8 Hz, 2H), 7.89-7.74 (m, 8H), 7.64-7.59 (m, 5H), 7.46-7.37 (m, 6H), 7.36-7.27 (m, 4H); 13C NMR (125 MHz, CDCl3): δ (ppm) 157.6, 150.1, 141.3, 140.9, 139.9, 139.0, 138.2, 137.4, 137.1, 136.1, 135.4, 132.1, 130.6, 130.5, 130.2, 130.1, 129.9, 128.1, 127.4, 127.3, 126.8, 126.3, 126.2, 125.7, 125.5, 123.8, 122.5, 120.9, 120.4, 110.1; FT-IR (ATR, cm−1): 3045, 1598, 1453, 1231, 780, 752; MS (EI+, m/z): [M+]; HRMS (EI+, m/z): [M+] calcd for C43H28N2, 572.2252. found.

Synthesis Example 4

Synthesis of Compound 19

Compound 19 was synthesized in the same manner as in Synthesis Example 1, except 1-bromo-3-iodobenzene, instead of 1-bromo-4-iodobenzene, and 1,3-dibromobenzene, instead of 1,4-dibromobenzene, were used (Yield=86%).

1H NMR (300 MHz, CDCl3): δ (ppm) 8.72-8.68 (m, 1H), 8.28-8.23 (m, 1H), 8.15 (d, J=7.7 Hz, 2H), 8.12 (s, 1H), 8.07 (s, 1H), 7.89-7.74 (m, 8H), 7.64-7.52 (m, 6H), 7.44 (t, J=7.4 Hz, 4H), 7.38 (d, J=8.2 Hz, 2H), 7.30 (t, J=7.4 Hz, 2H); 13C NMR (75 MHz, CDCl3): δ (ppm) 157.1, 149.9, 149.8, 141.1, 140.7, 139.7, 139.6, 139.4, 139.3, 137.9, 137.4, 136.9, 136.8, 135.9, 131.9, 131.8, 130.3, 130.2, 130.0, 129.9, 129.8, 129.7, 129.6, 129.1, 127.2, 126.6, 126.3, 126.2, 126.1, 125.9, 125.6, 125.3, 123.5, 122.4, 120.7, 120.4, 120.1, 109.9; FT-IR (ATR, cm−1): 3062, 1584, 1452, 1230, 777, 750; MS (EI+, m/z): [M+]; HRMS (EI+, m/z): [M+] calcd for C43H28N2, 572.2252. found.

Synthesis Example 5

Synthesis of Compound 68

[Reaction Scheme 5]

Compound 68

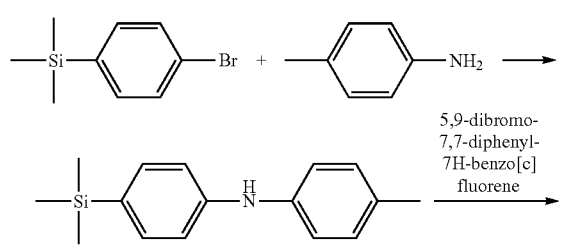

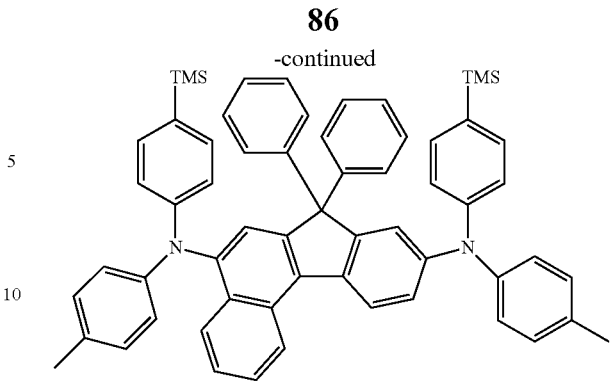

22.8 g (100 mmol) of 1-bromo-4-(trimethylsilyl)benzene and 10.71 g (100.0 mmol) of p-toluidine were dissolved in 150.0 ml of toluene in a nitrogen atmosphere, 45.0 mg of palladium acetate, 12.5 g of sodium t-butoxide, and 1.2 g of tris(t-butyl)phosphine were added thereto, and then heated at about 100° C. for 8 hours.

After termination of the reaction, water was added to extract an organic layer and an aqueous layer, followed by concentration of the organic layer.

The concentrated organic layer was purified with a silica gel column to obtain 4-methyl-N-(4-trimethylsilyl)phenyl)aniline.

20.7 g (81.1 mmol) of 4-methyl-N-(4-(trimethylsilyl)phenyl)aniline and 21.25 g (40.55 mmol) of 5,9-dibromo-7,7-diphenyl-7H-benzo[c]fluorene were dissolved in 150.0 ml of toluene in a nitrogen atmosphere, 32.0 mg of palladium acetate, 10.4 g of sodium t-butoxide, and 0.6 g of tris(t-butyl)phosphine were added thereto, and then heated at about 80° C. for about 1 hour.

After termination of the reaction, the reaction product was purified with a silica gel column to obtain Compound D24 (40.40 g, 46.23 mmol, Yield: 46%), 1H NMR (300 MHz, CDCl3) δ: 8.70 (1H), 8.11 (1H), 7.99 (1H), 7.52 (1H), 7.33-6.84 (30H), 2.31 (3H), 2.24 (3H), 0.24 (9H), 0.20 (9H).

HRMS (FAB): calcd for C61H58N2Si2: 874.41. found: 875.30.

Example 1

As a substrate and anode, a corning 15 Ω/cm² (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2T-NATA was deposited on the ITO glass layer (anode) of the substrate to form an HIL having a thickness of 600 Å on the anode, and then 4,4'-bis[N-(1-naphthyl)-N-phenylamino]biphenyl (NPB) was deposited on the HIL to form a HTL having a thickness of 300 Å.

Compound 1 (host) and Compound 68 (dopant) were co-deposited on the HTL in a weight ratio of about 95:5 to form an EML having a thickness of about 400 Å.

Then, Compound 201 was deposited on the EML to form an ETL having a thickness of about 300 Å, and then LiF was deposited on the ETL to form an EIL having a thickness of about 10 Å. Then, Al was deposited on the EIL to form a second electrode (cathode) having a thickness of about 1100 Å, thereby completing the manufacture of an organic light-emitting device.

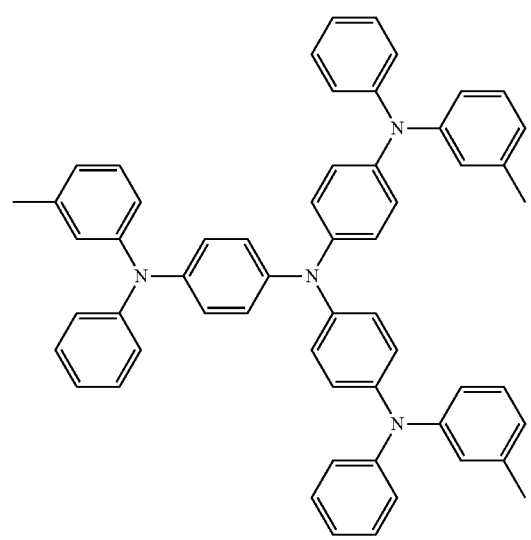

2T-NATA

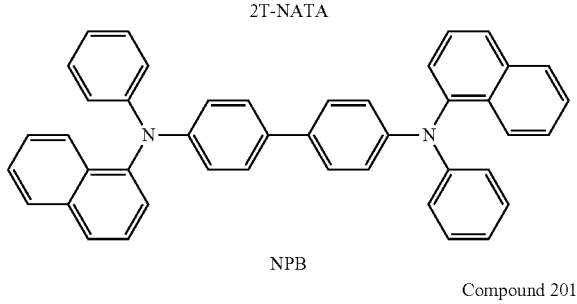

NPB

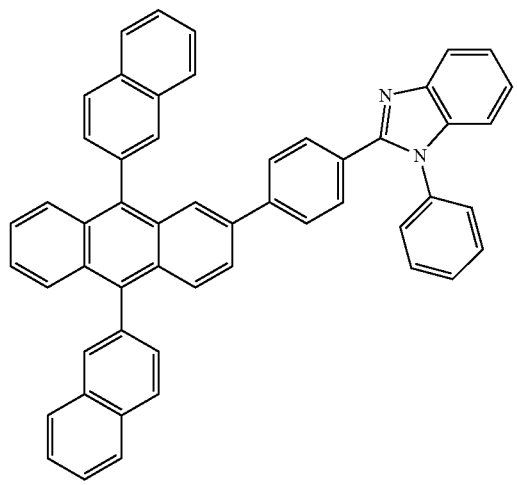

Compound 201

Example 2

An organic light-emitting device was manufactured in the same manner as in Example 1, except that Compound 14, instead of Compound 1, was used.

Example 3

An organic light-emitting device was manufactured in the same manner as in Example 1, except that Compound 15, instead of Compound 1, was used.

Example 4

An organic light-emitting device was manufactured in the same manner as in Example 1, except that Compound 19, instead of Compound 1, was used.

Comparative Example 1

An organic light-emitting device was manufactured in the same manner as in Example 1, except that the following compound, instead of Compound 1, was used.

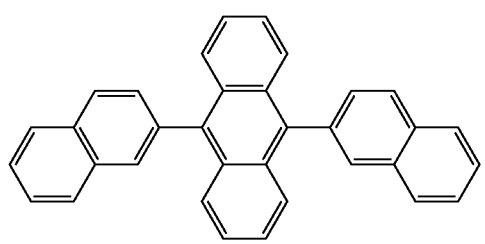 [SMILES: c1ccc2cc(-c3c4ccccc4c(-c4ccc5ccccc5c4)c4ccccc34)ccc2c1]

Comparative Example 2

An organic light-emitting device was manufactured in the same manner as in Example 1, except that the following compound, instead of Compound 1, was used.

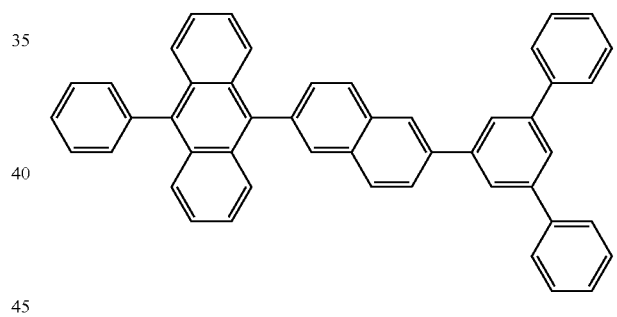

Comparative Example 3

An organic light-emitting device was manufactured in the same manner as in Example 1, except that the following compound, instead of Compound 68, was used.

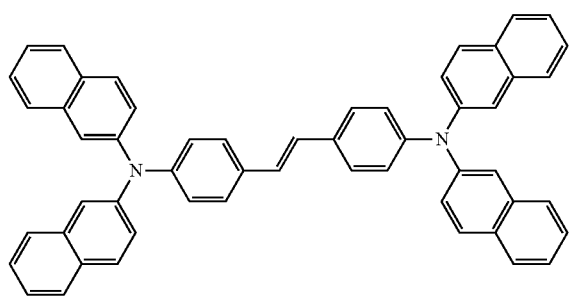 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]

Comparative Example 4

An organic light-emitting device was manufactured in the same manner as in Example 1, except that the following compound, instead of Compound 68, was used.

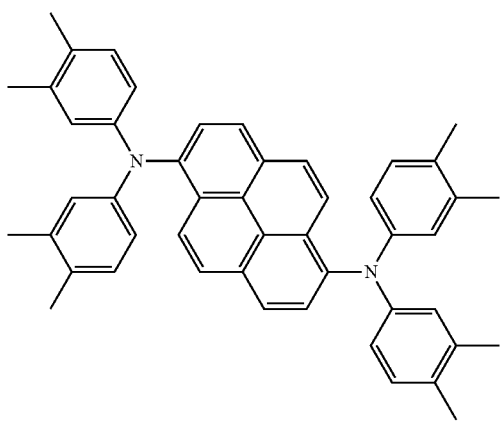

The organic light-emitting devices of Examples 1 to 4 had significantly lower driving voltages, and improved I-V-L characteristics with higher efficiencies, as compared to those of Comparative Examples 1 to 4, and in particular, had remarkably improved lifetime characteristics.

Some main characteristics and lifetime characteristics of the organic light-emitting devices of Examples 1 to 4 and Comparative Examples 1 to 4 are shown in Table 1 below. (T95 lifetime indicates the time taken until a measured initial luminosity (assumed as 100%) is reduced to 95%.)

TABLE 1

| | Driving voltage (V) | Current (mA/cm$^2$) | Efficiency (cd/A) | Color coordinates | T95 lifetime (hr) |
|---|---|---|---|---|---|
| Example 1 | 3.4 | 19.1 | 3.6 | 0.142, 0.049 | 190 |
| Example 2 | 4.0 | 19.1 | 3.6 | 0.140, 0.052 | 210 |
| Example 3 | 3.6 | 18.9 | 3.7 | 0.139, 0.055 | 200 |
| Example 4 | 3.7 | 17.3 | 4.1 | 0.141, 0.053 | 230 |
| Comparative Example 1 | 4.6 | 21.9 | 3.2 | 0.141, 0.052 | 120 |
| Comparative Example 2 | 5.1 | 13.5 | 5.2 | 0.128, 0.083 | 90 |
| Comparative Example 3 | 4.4 | 20.0 | 3.5 | 0.142, 0.058 | 70 |
| Comparative Example 4 | 4.2 | 18.9 | 3.7 | 0.144, 0.062 | 130 |

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting device comprising:
   a first electrode;
   a second electrode; and
   an organic layer interposed between the first electrode and the second electrode,
   wherein the organic layer comprises a compound represented by Formula 1 and a compound represented by Formula 2 below:

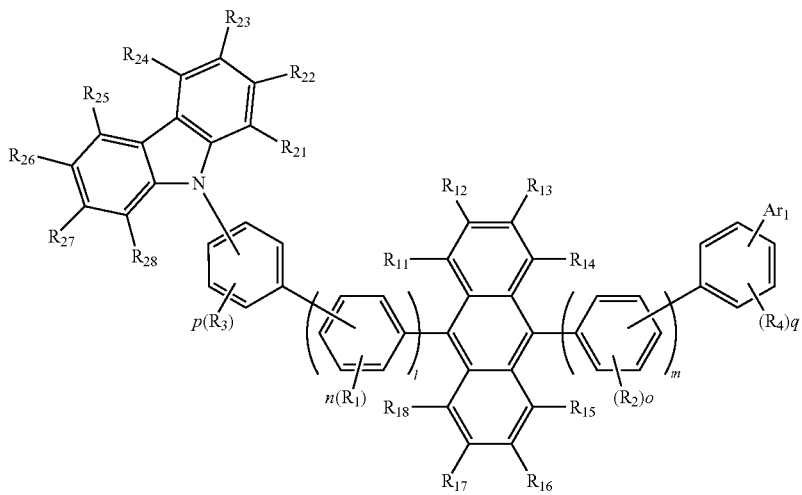

Formula 1 wherein, in Formula 1, $Ar_1$ is a substituted or unsubstituted $C_3$-$C_{60}$ heteroaryl group;
$R_1$ to $R_4$, $R_{11}$ to $R_{18}$, and $R_{21}$ to $R_{28}$ are each independently hydrogen, deuterium, a halogen atom, a cyano group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ trialkylsilyl group, a substituted or unsubstituted $C_1$-$C_{60}$ dialkylarylsilyl group, a substituted or unsubstituted $C_1$-$C_{60}$ triarylsilyl group, or a substituted or unsubstituted $C_3$-$C_{60}$ heteroaryl group;

l and m are each independently an integer from 0 to 2; and n, o, p, and q are each independently an integer from 0 to 4, and Formula 2

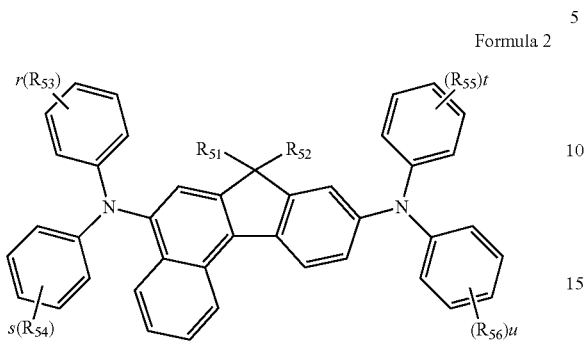

wherein, in Formula 2, $R_{51}$ and $R_{52}$ are each independently hydrogen, deuterium, a substituted or unsubstituted $C_1$-$C_{60}$ alkyl group, or a substituted or unsubstituted $C_6$-$C_{12}$ aryl group;

$R_{53}$ to $R_{56}$ are each independently hydrogen, deuterium, a halogen atom, a cyano group, a nitro group, a hydroxyl group, a substituted or unsubstituted $C_1$-$C_{60}$ alkyl group, a substituted or unsubstituted $C_2$-$C_{60}$ alkenyl group, a substituted or unsubstituted $C_3$-$C_{60}$ cycloalkyl group, a substituted or unsubstituted $C_1$-$C_{60}$ cycloalkenyl group, a substituted or unsubstituted $C_1$-$C_{60}$ trialkylsilyl group, a substituted or unsubstituted dialkylarylsilyl group, a substituted or unsubstituted $C_1$-$C_{60}$ triarylsilyl group, a substituted or unsubstituted $C_6$-$C_{60}$ aryl group, or a substituted or unsubstituted $C_3$-$C_{60}$ heteroaryl group; and r, s, t, and u are each independently an integer from 0 to 5.

2. The organic light-emitting device of claim 1, wherein adjacent substituents of $R_{21}$ to $R_{28}$ in Formula are selectively linked together to form a ring.

3. The organic light-emitting device of claim 1, wherein adjacent substituents of $R_{51}$ and $R_{52}$ in Formula 2 are selectively linked together to form a ring.

4. The organic light-emitting device of claim 1, wherein adjacent substituents of $R_{53}$ to $R_{56}$ in Formula 2 are selectively linked together to form a ring.

5. The organic light-emitting device of claim 1, wherein $Ar_1$ in Formula 1 is one of the groups represented by Formulae 2a to 2k below:

2a

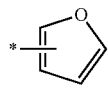

2b

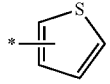

2c

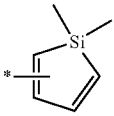

2d

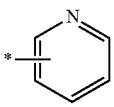

2e

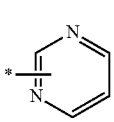

2f

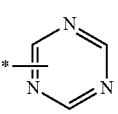

2g

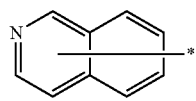

2h

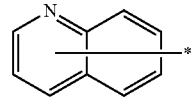

2i

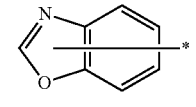

2j

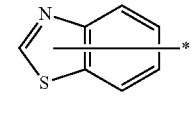

2k

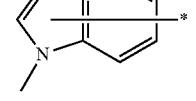

wherein, in Formulae 2a to 2k, * indicates a binding site.

6. The organic light-emitting device of claim 1, wherein the compound of Formula 1 is one of Compounds 1 to 46 below:

Compound 1

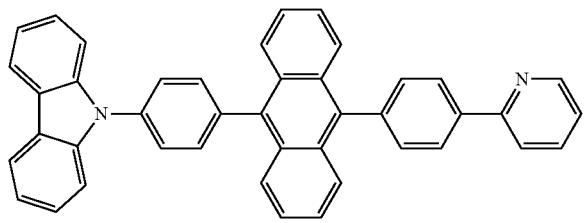

Compound 2

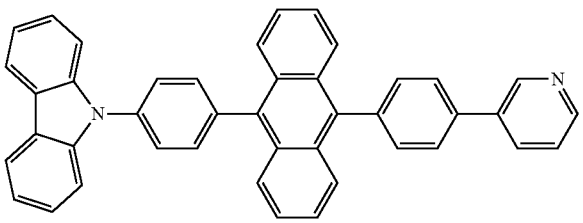

-continued
Compound 3
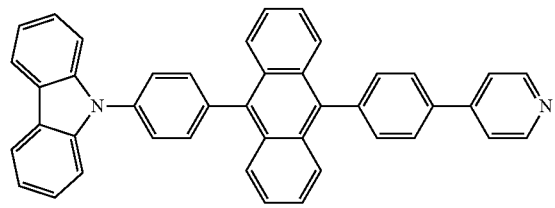
Compound 4
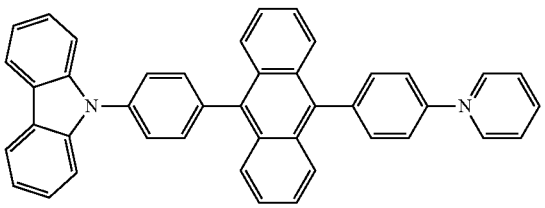
Compound 5
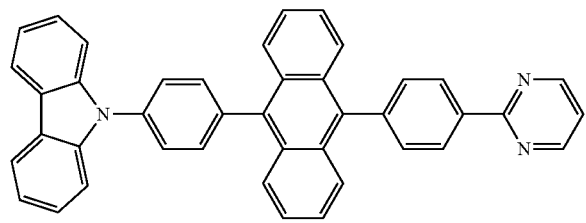
Compound 6
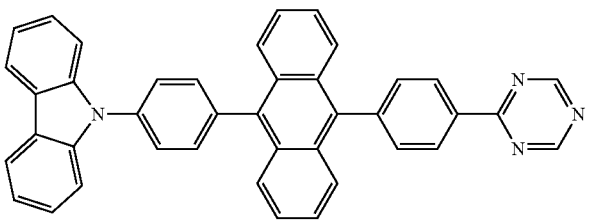
Compound 7
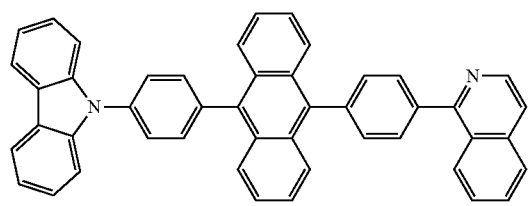
Compound 8
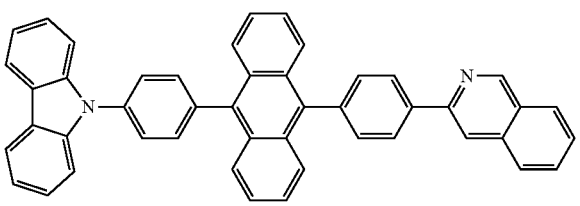
Compound 9
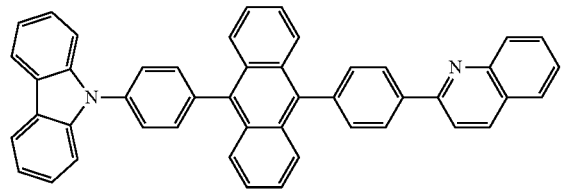
Compound 10
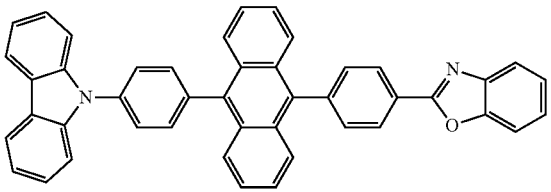
Compound 11
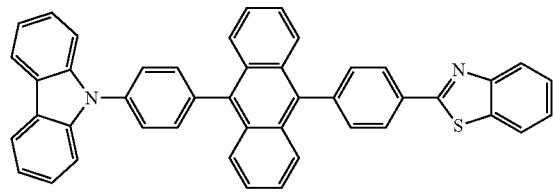
Compound 12
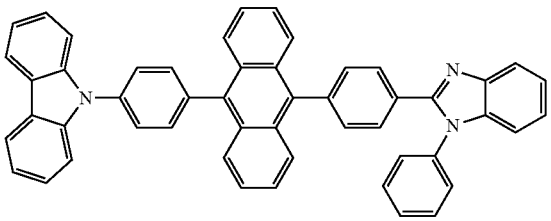
Compound 13
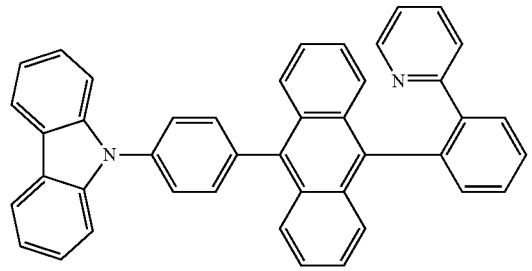
Compound 14
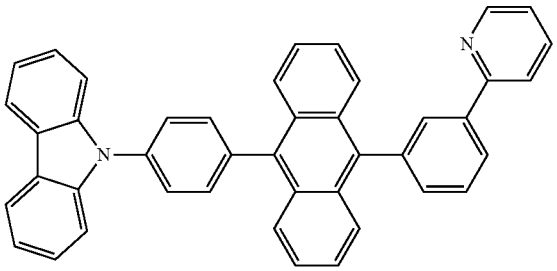

-continued
Compound 15
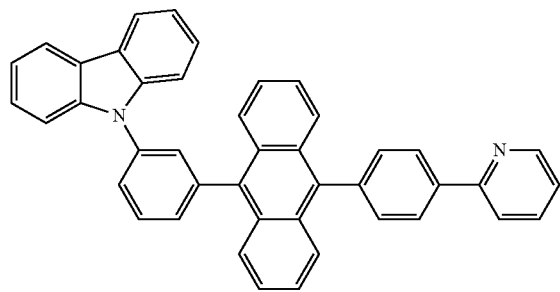
Compound 16
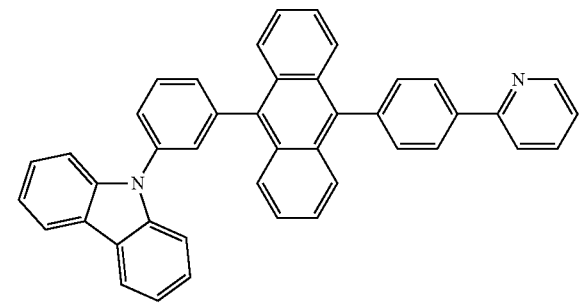
Compound 17
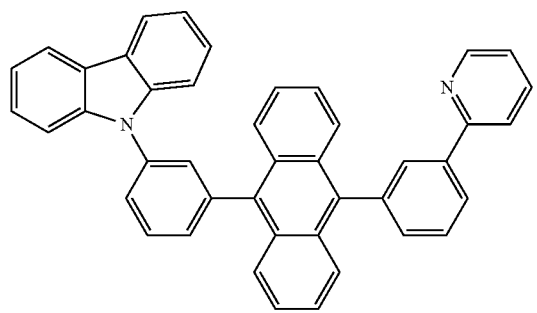
Compound 18
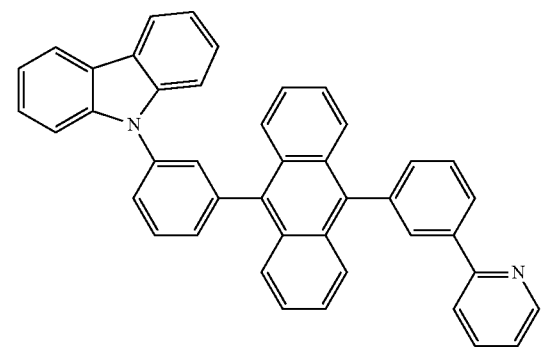
Compound 19
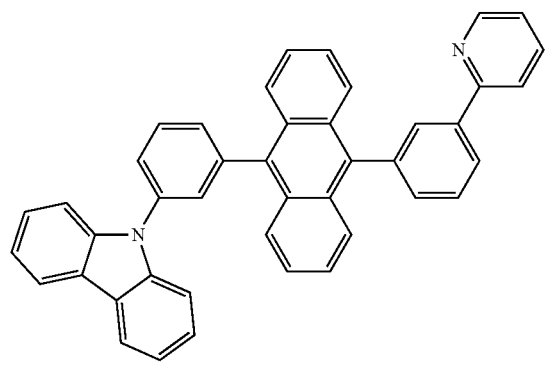
Compound 20
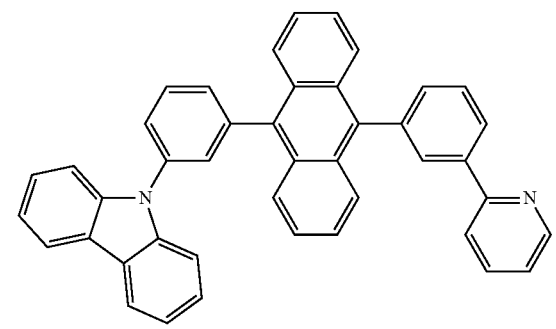
Compound 21
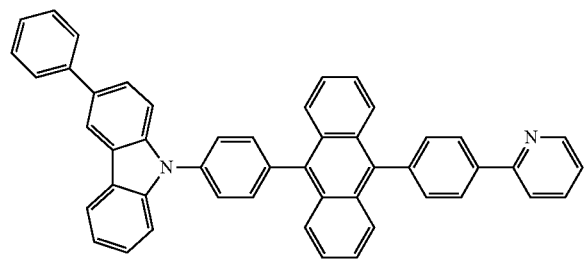
Compound 22
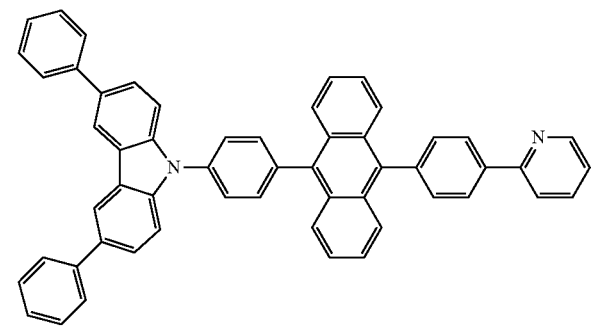

-continued
Compound 23
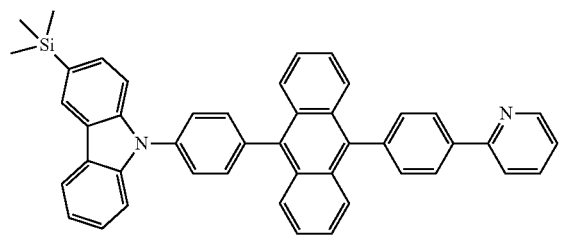
Compound 24
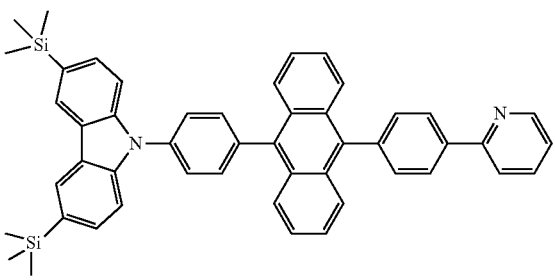
Compound 25
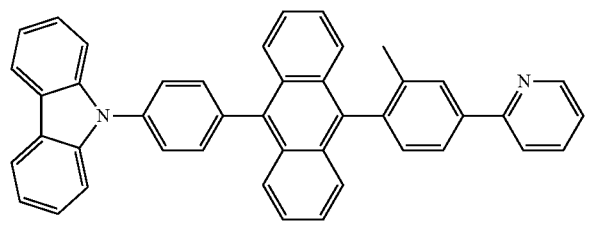
Compound 26
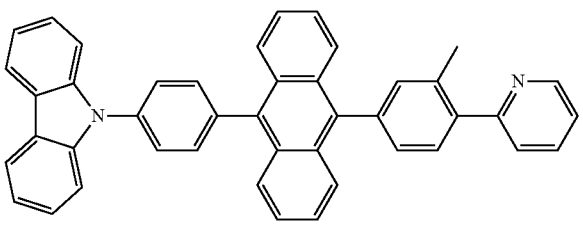
Compound 27
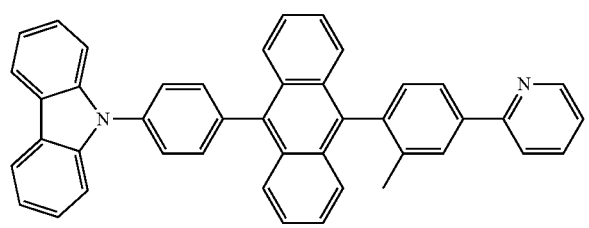
Compound 28
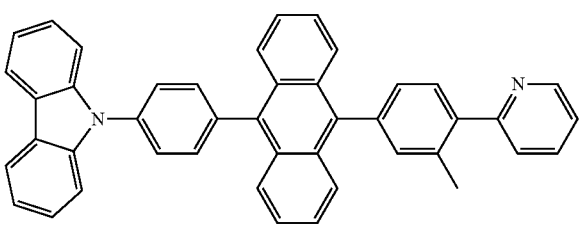
Compound 29
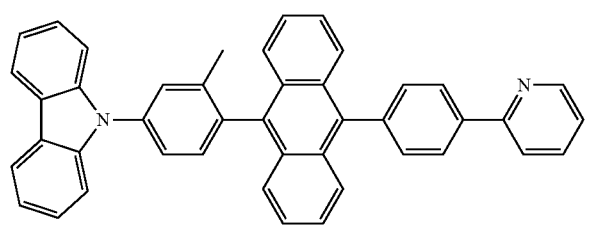
Compound 30
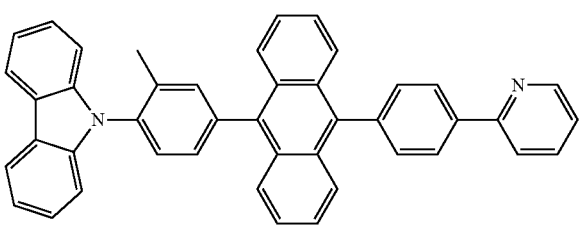
Compound 31
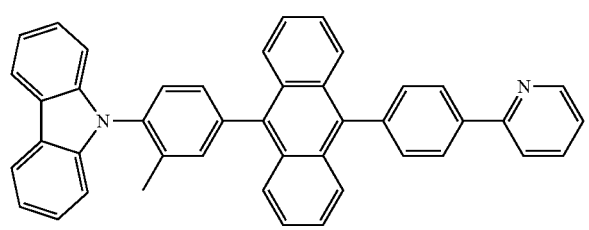
Compound 32
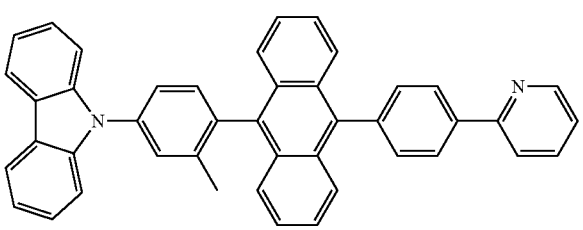
Compound 33
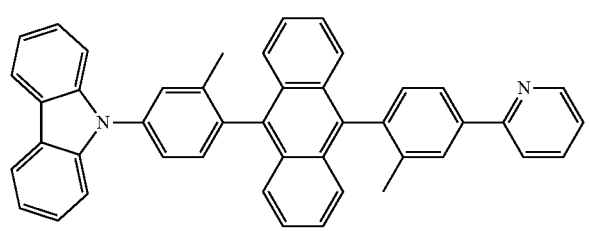
Compound 34
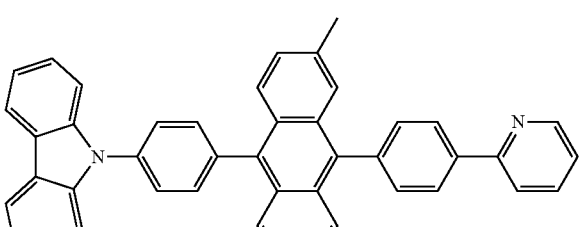

-continued
Compound 35
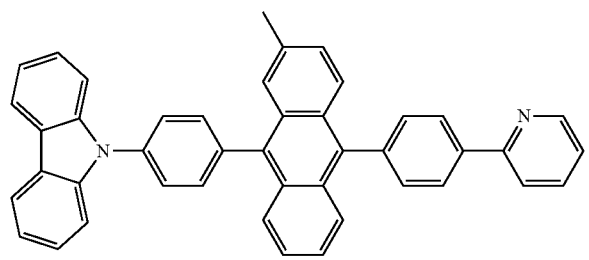
Compound 36
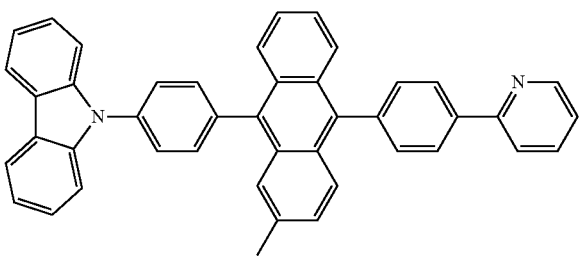
Compound 37
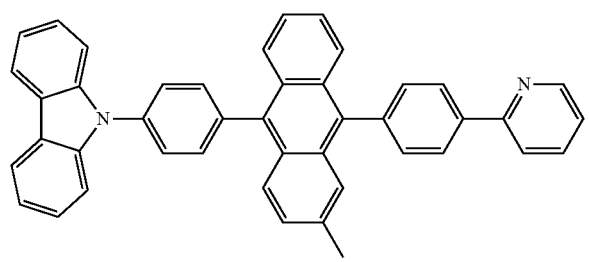
Compound 38
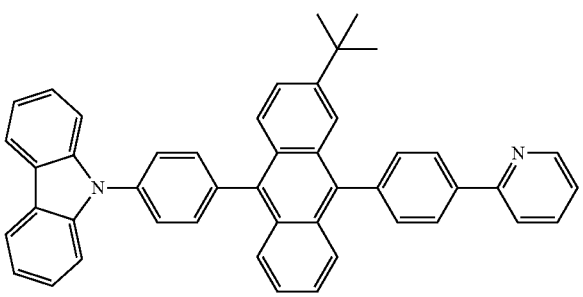
Compound 39
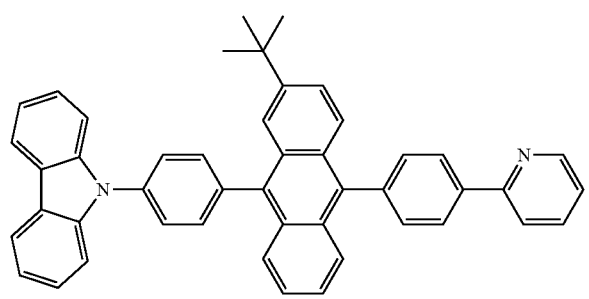
Compound 40
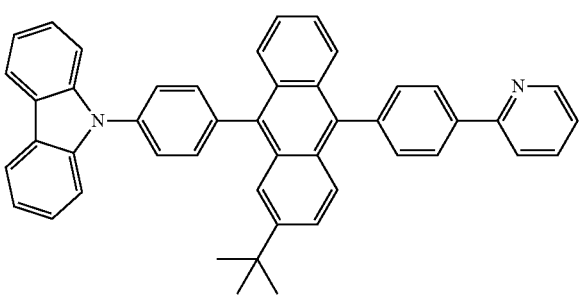
Compound 41
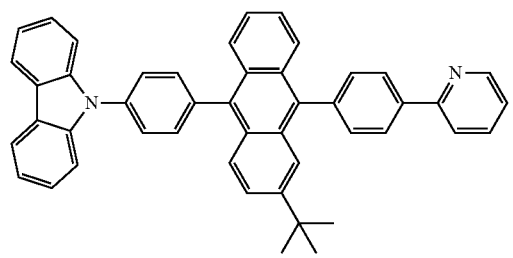
Compound 42
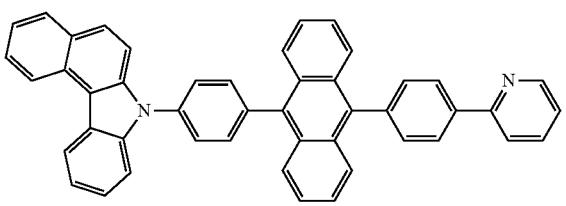
Compound 43
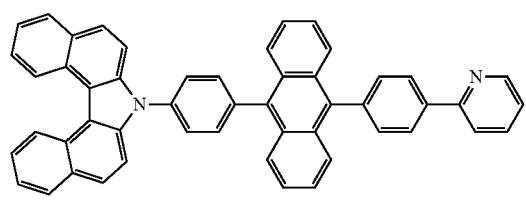
Compound 44
Compound 45
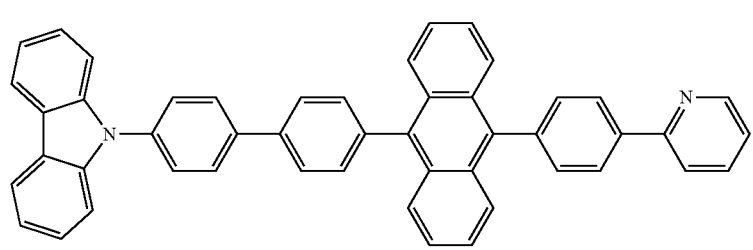

-continued
Compound 46
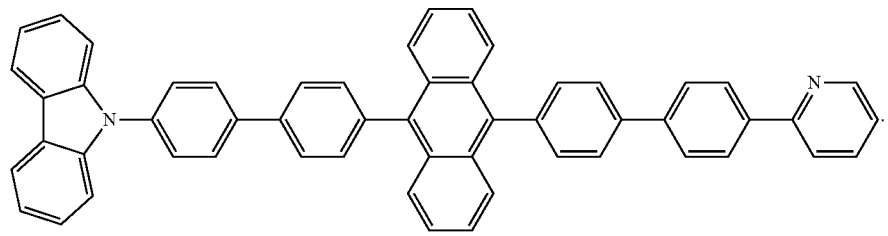
7. The organic light-emitting device of claim 1, wherein the compound of Formula 2 is one of Compounds 47 to 114 below:
-continued
Compound 47
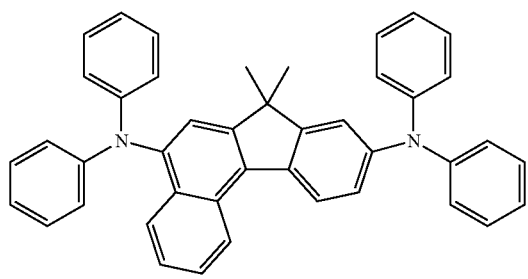
Compound 50
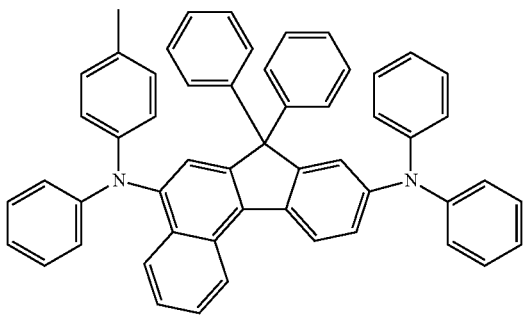
Compound 48
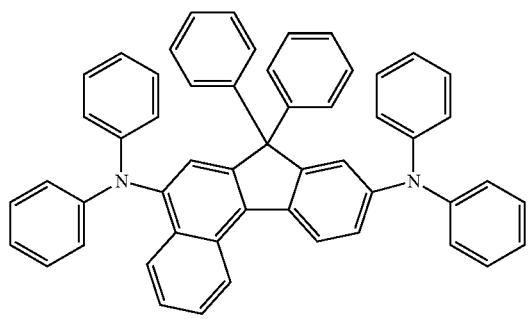
Compound 51
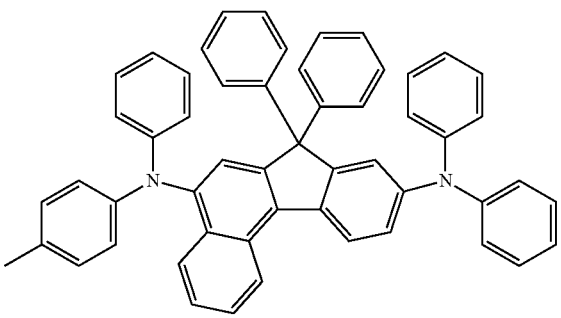
Compound 49
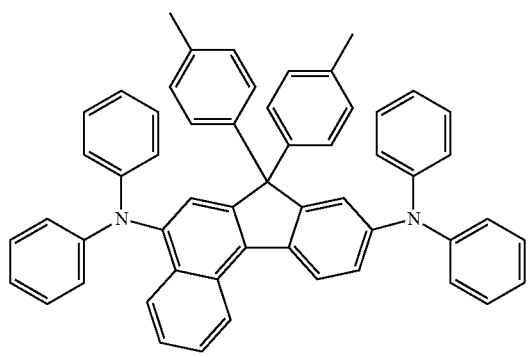
Compound 52
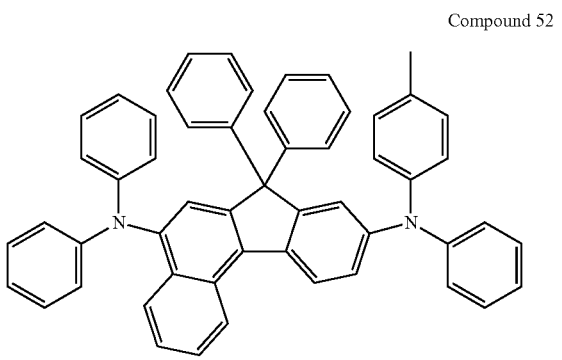

Compound 53
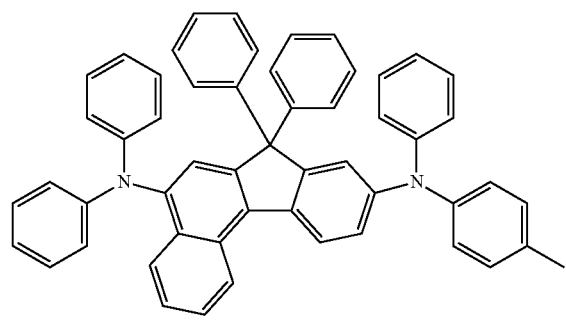
Compound 54
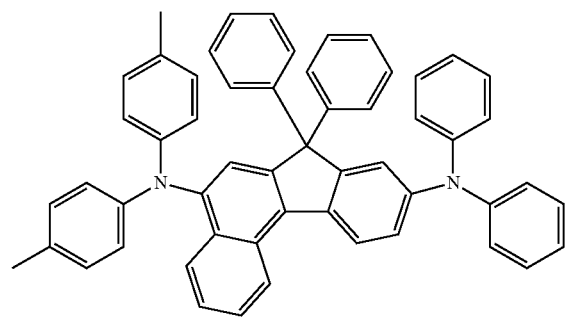
Compound 55
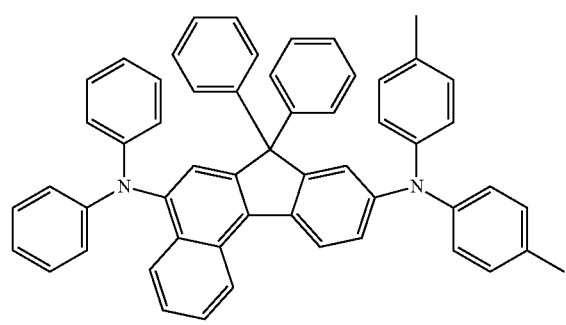
Compound 56
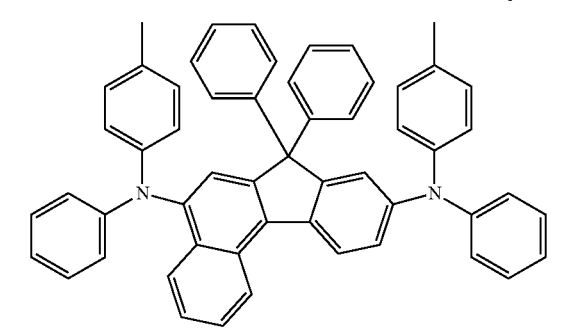
Compound 57
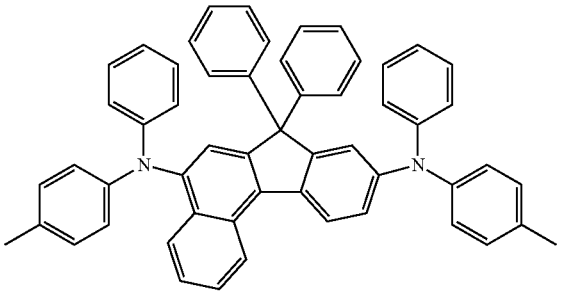
Compound 58
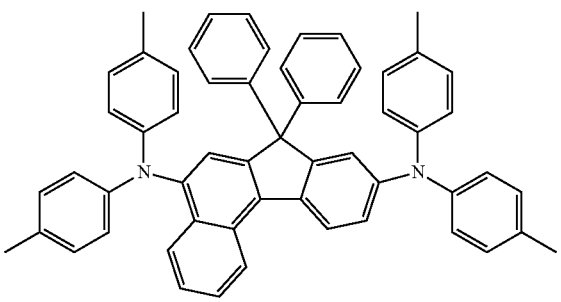
Compound 59
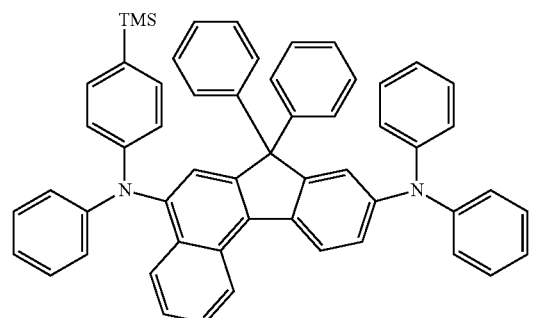
Compound 60
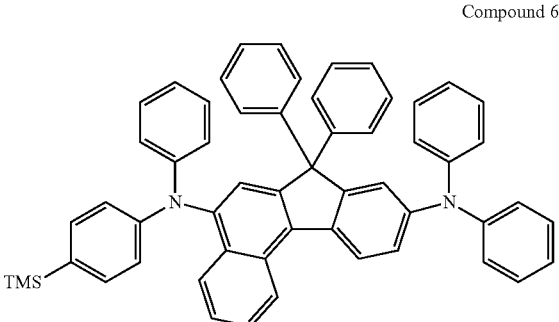
Compound 61
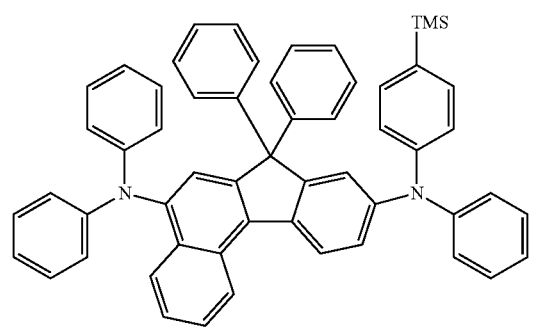

Compound 62
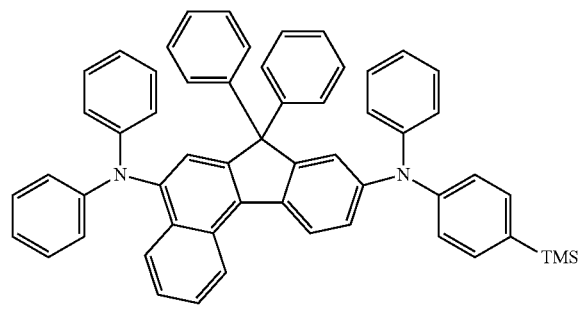
Compound 63
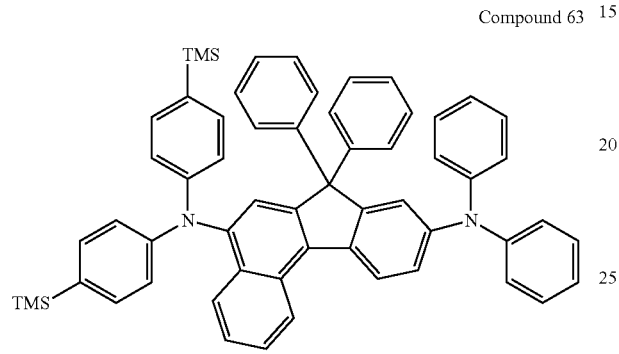
Compound 64
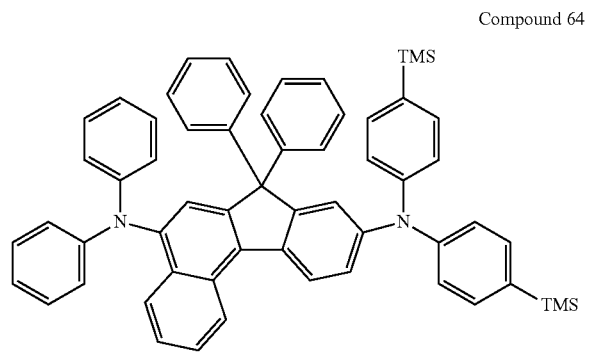
Compound 65
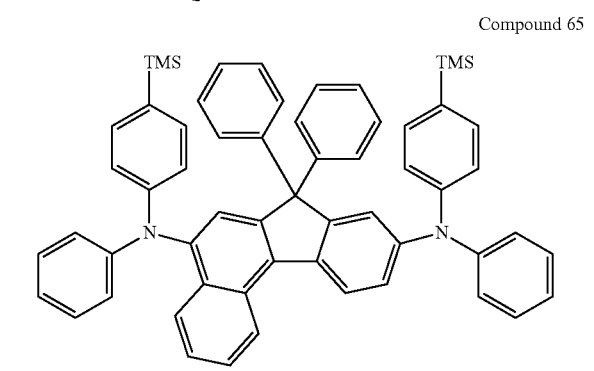
Compound 66
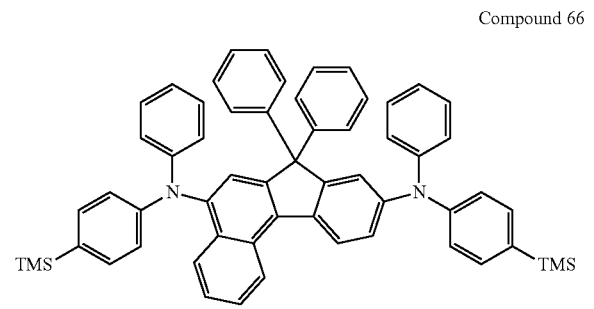
Compound 67
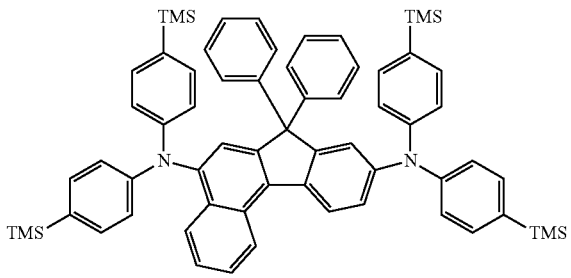
Compound 68
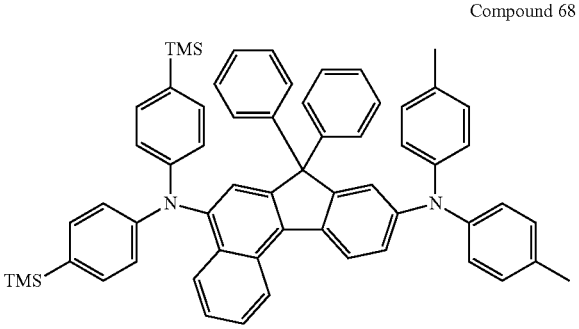
Compound 69
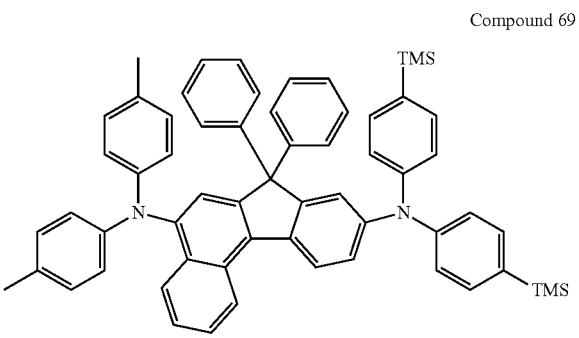
Compound 70
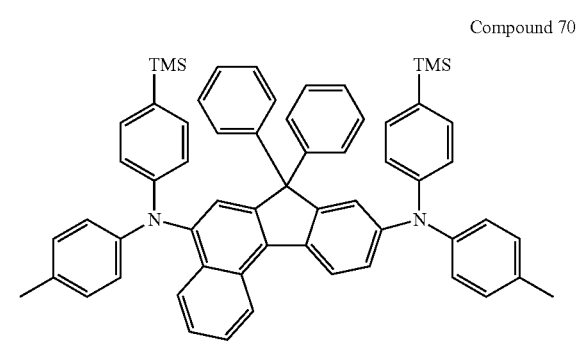
Compound 71
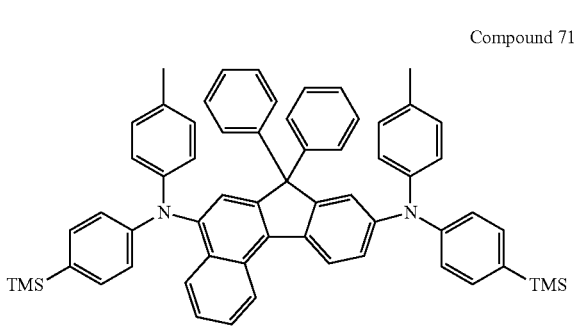

Compound 72
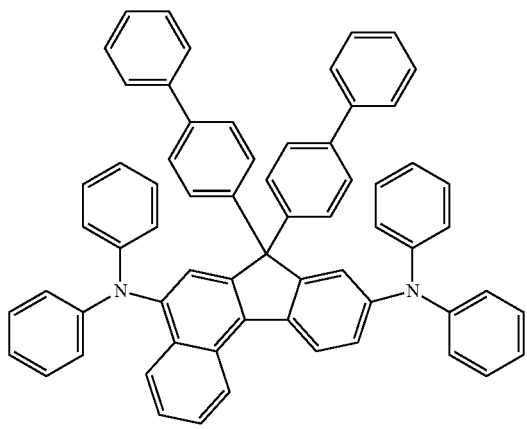
Compound 73
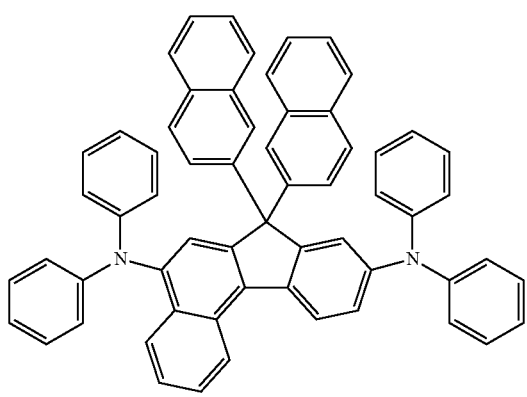
Compound 74
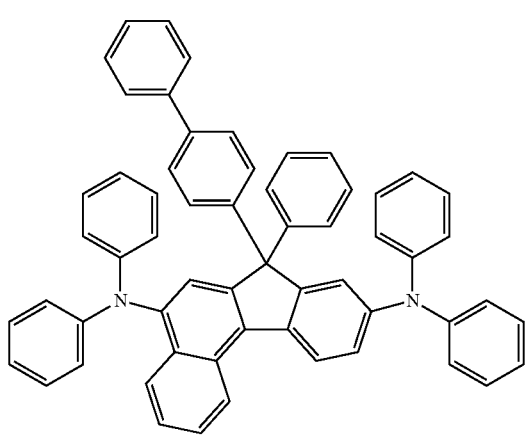
Compound 75
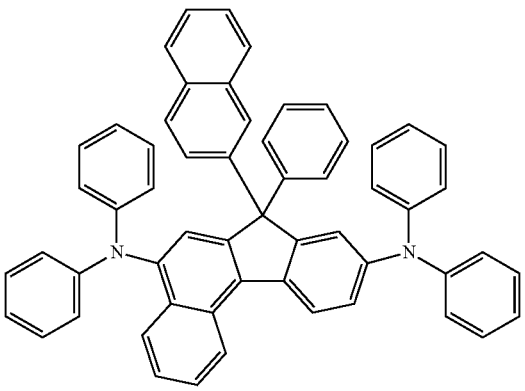
Compound 76
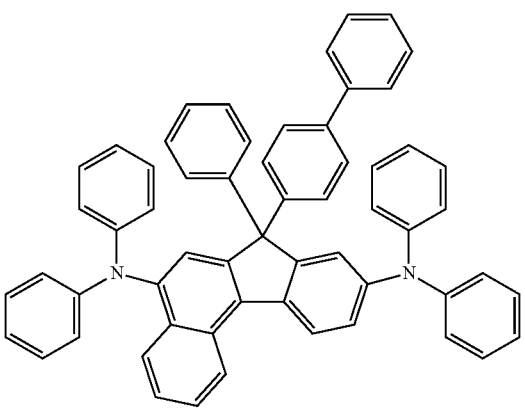
Compound 77
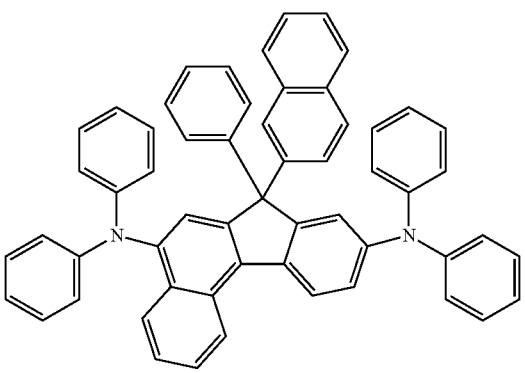
Compound 78
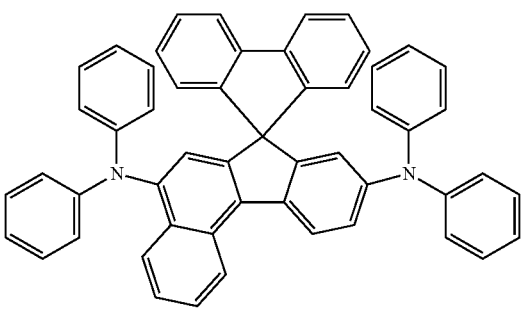

Compound 79
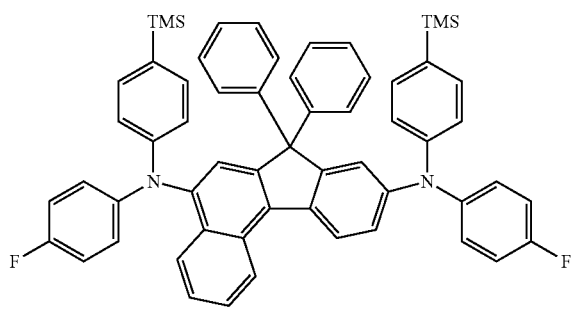
Compound 83
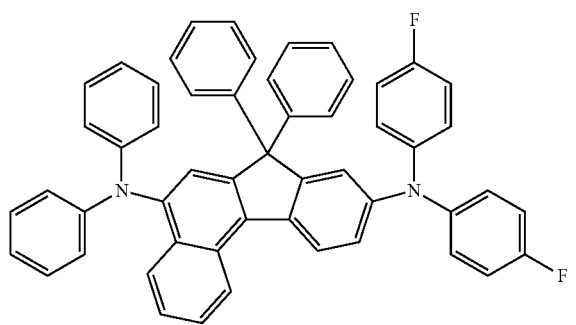
Compound 80
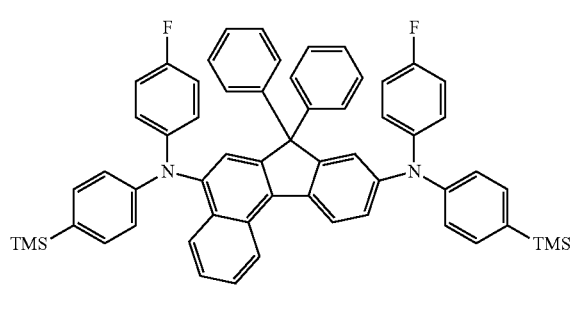
Compound 84
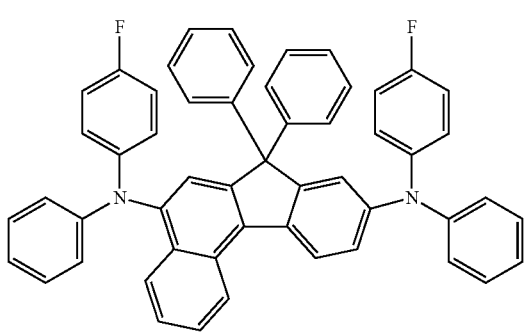
Compound 81
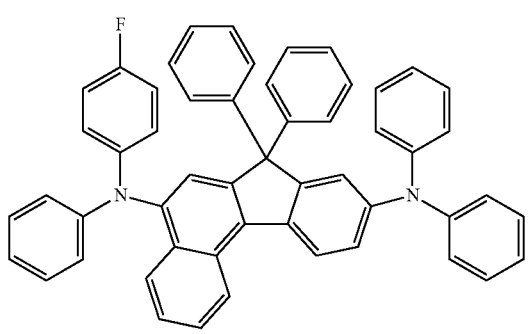
Compound 85
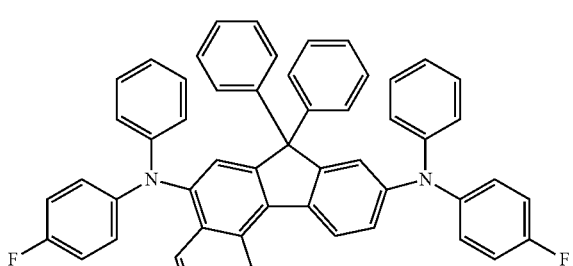
Compound 82
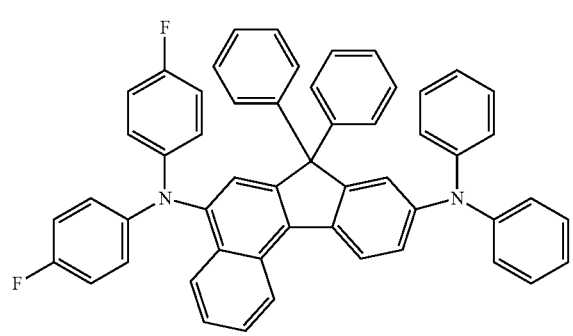
Compound 86
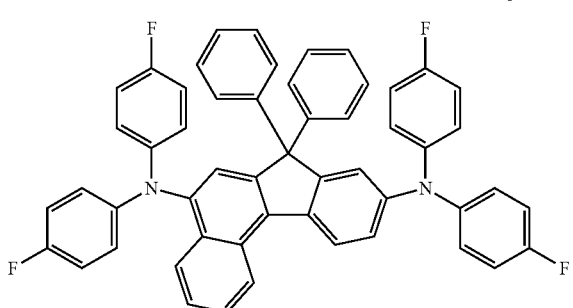

Compound 87
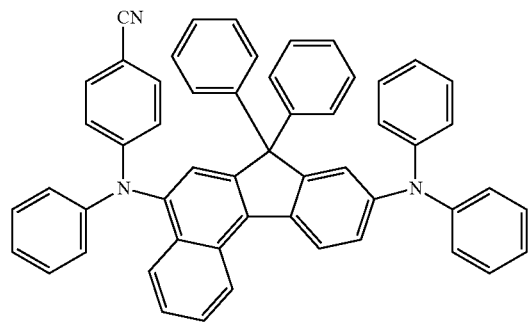
Compound 88
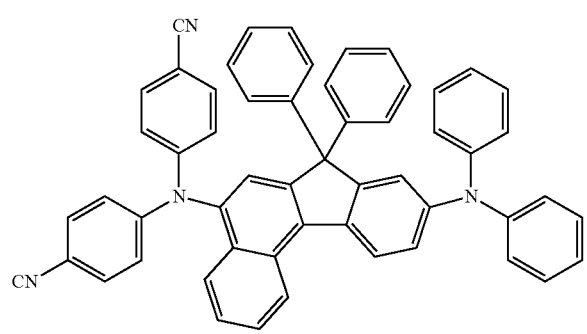
Compound 89
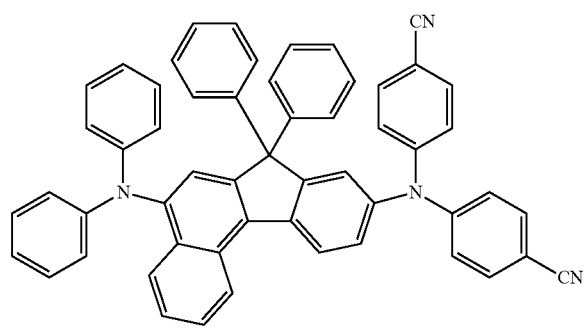
Compound 90
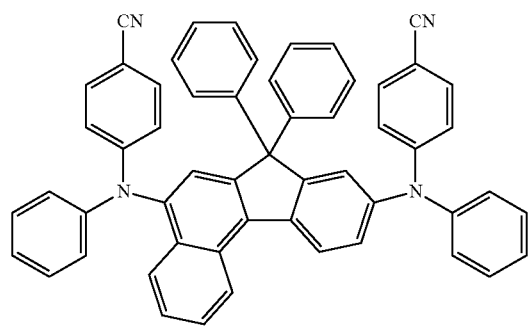
Compound 91
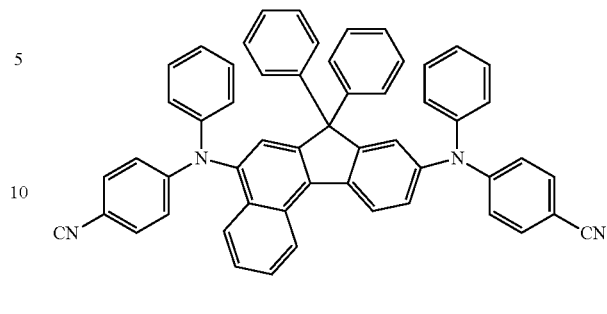
Compound 92
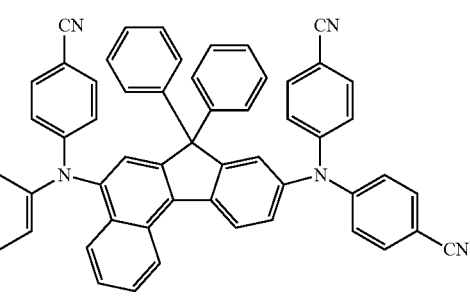
Compound 93
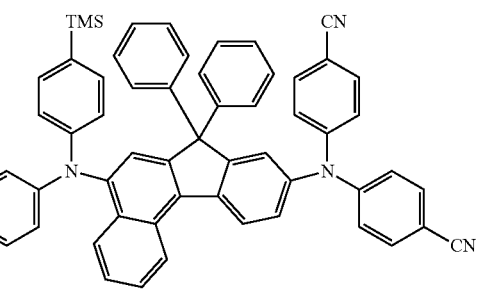
Compound 94
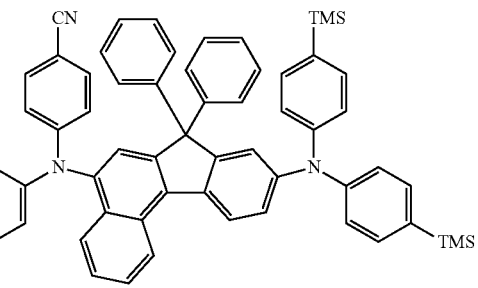
Compound 95

Compound 96
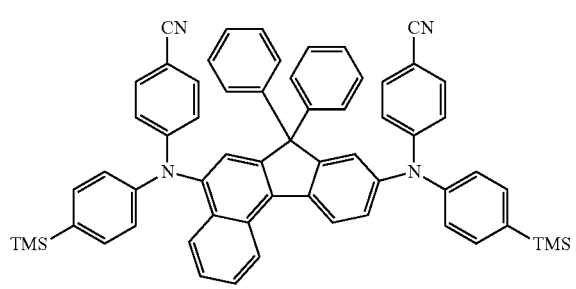
Compound 97
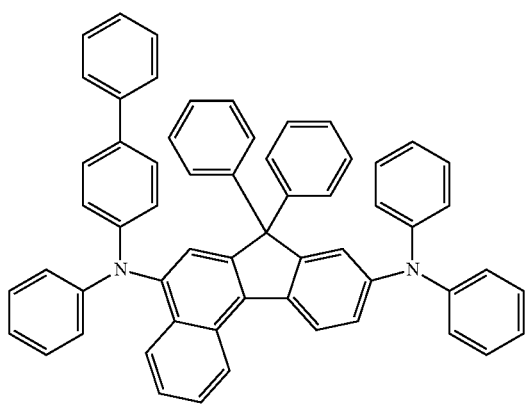
Compound 98
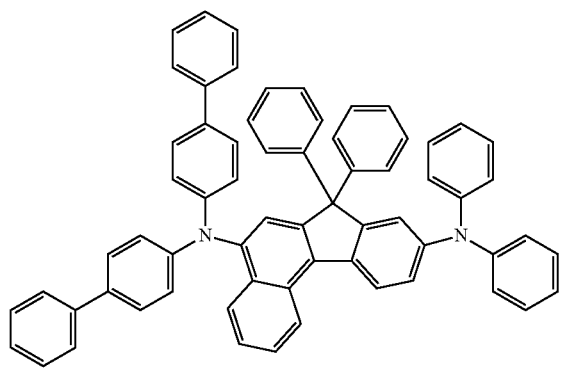
Compound 99
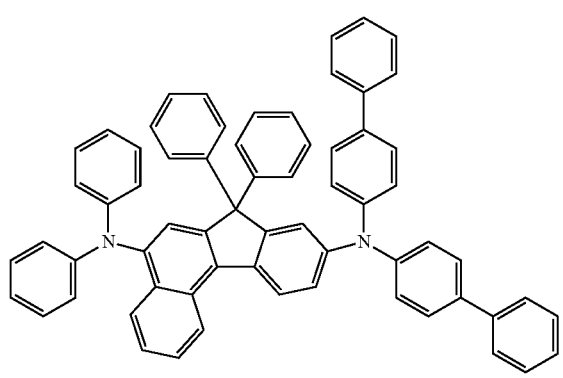
Compound 100
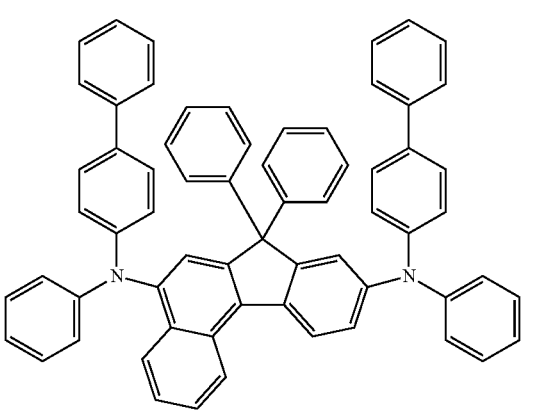
Compound 101
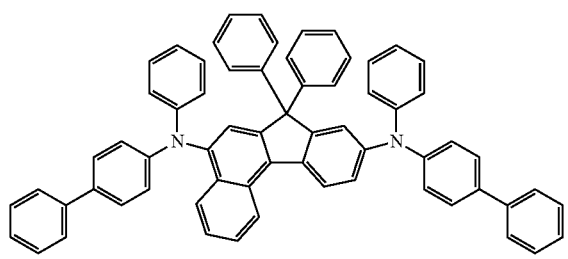
Compound 102
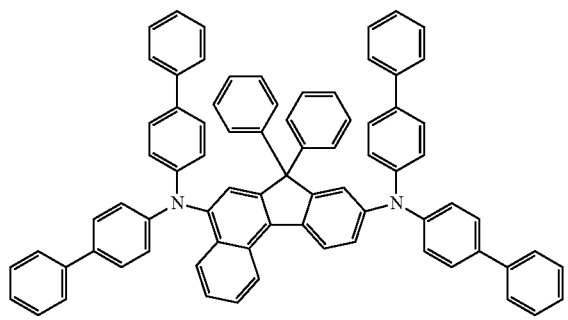
Compound 103
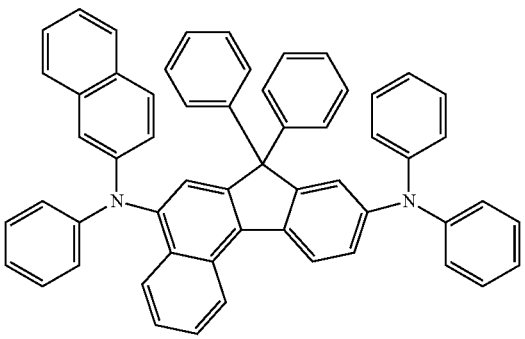

Compound 104
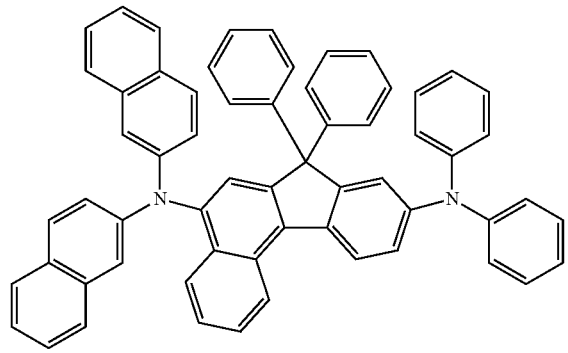
Compound 108
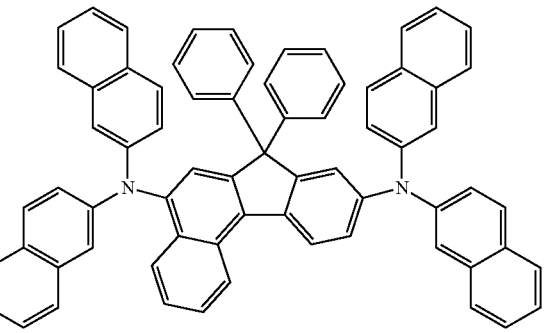
Compound 105
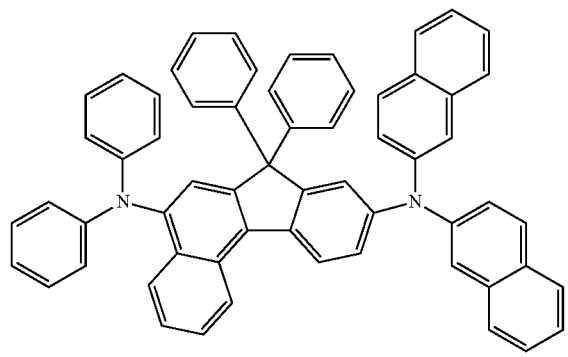
Compound 109
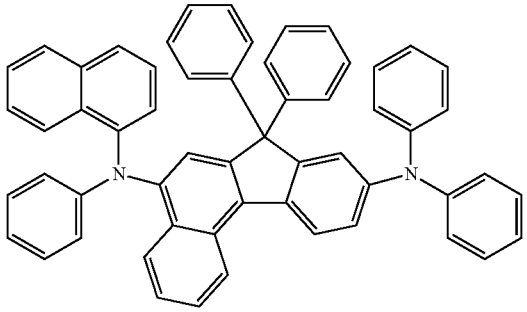
Compound 106
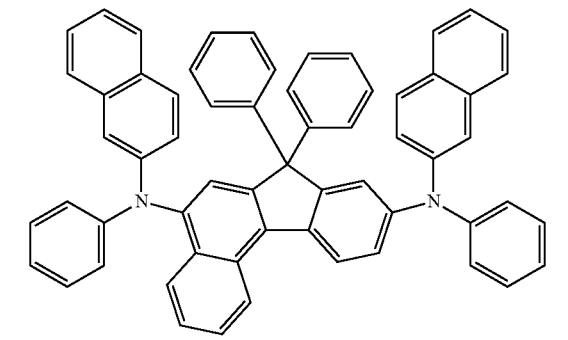
Compound 110
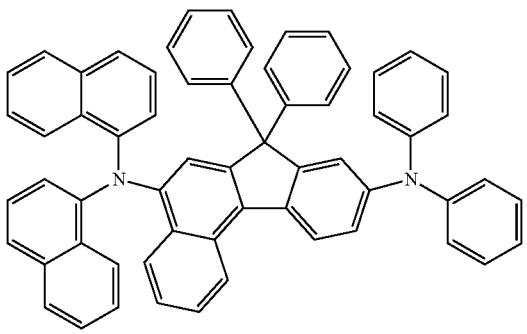
Compound 107
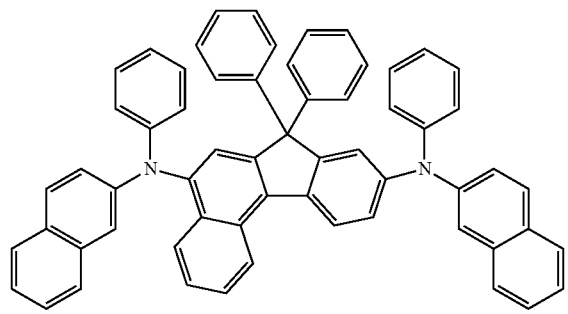
Compound 111
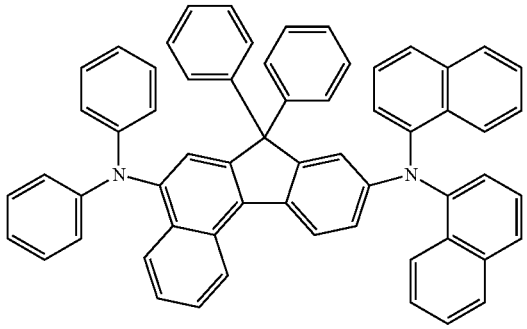

Compound 112

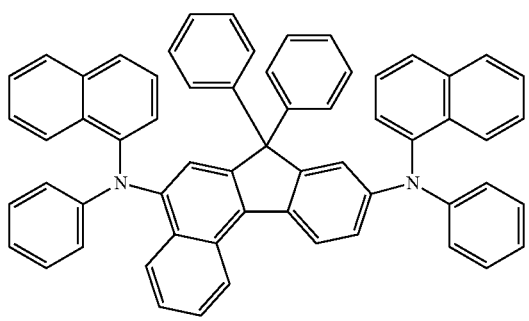

Compound 113

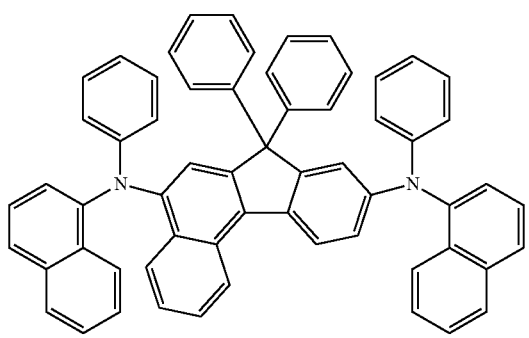

Compound 114

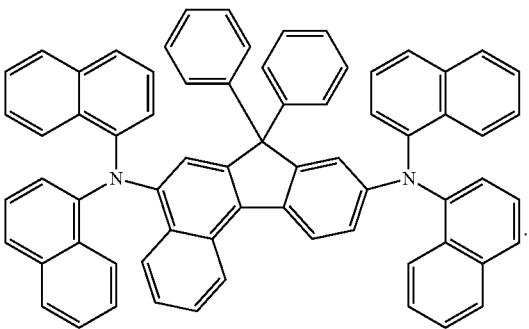

8. The organic light-emitting device of claim 1, wherein the organic layer is a blue emission layer.

9. The organic light-emitting device of claim 1, wherein the organic layer comprises an emission layer, a hole injection layer, a hole transport, layer, or a functional layer having both hole injection and hole transport capabilities, and the emission layer comprises red, green, blue, and white emission layers and one of which comprises a phosphorescent compound.

10. The organic light-emitting device of claim 9, wherein at least one of the hole injection layer, the hole transport layer, and the functional layer having both hole injection and hole transport capabilities comprises a charge-generating material.

11. The organic light-emitting device of claim 10, wherein the charge-generating material is a p-type dopant.

12. The organic light-emitting device of claim 11, wherein the p-type dopant is a quinine derivative.

13. The organic light-emitting device of claim 11, wherein the p-type dopant is a metal oxide.

14. The organic light-emitting device of 13, wherein the metal oxide is tungsten oxide or molybdenum oxide.

15. The organic light-emitting device of claim 11, wherein the p-type dopant is a cyano group-containing compound.

16. The organic light-emitting device of claim 1, wherein the organic layer further comprises an electron transport, layer, and the electron transport layer comprises an electron transporting organic compound and a metal complex.

17. The organic light-emitting device of claim 16, wherein the metal complex is lithium quinolate (LiQ).

18. The organic light-emitting device of claim 16, wherein the metal complex is Compound 203 below:

Compound 203

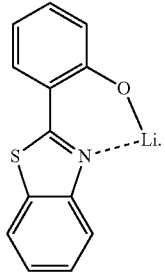

19. The organic light-emitting device of claim 1, wherein the organic layer is formed from the compound of Formula 1 and the compound of Formula 2 using a wet process.

20. A flat panel display device comprising the organic light-emitting device of claim 1, wherein the first electrode of the organic light-emitting device is electrically connected to a source electrode or a drain electrode of a thin-film transistor.

* * * * *